(12) United States Patent
Kaiho et al.

(10) Patent No.: US 11,977,330 B2
(45) Date of Patent: May 7, 2024

(54) RESIST COMPOSITION AND METHOD OF FORMING RESIST PATTERN

(71) Applicant: TOKYO OHKA KOGYO CO., LTD., Kawasaki (JP)

(72) Inventors: Takaaki Kaiho, Kawasaki (JP); Yasuo Someya, Kawasaki (JP); Minoru Adegawa, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 466 days.

(21) Appl. No.: 17/109,697

(22) Filed: Dec. 2, 2020

(65) Prior Publication Data

US 2021/0181632 A1 Jun. 17, 2021

(30) Foreign Application Priority Data

Dec. 11, 2019 (JP) .................. 2019-224094

(51) Int. Cl.
G03F 7/038 (2006.01)
C08L 33/14 (2006.01)
G03F 7/20 (2006.01)

(52) U.S. Cl.
CPC ............ G03F 7/0382 (2013.01); C08L 33/14 (2013.01); G03F 7/2041 (2013.01)

(58) Field of Classification Search
CPC .... G03F 7/0382; G03F 7/0397; G03F 7/0045; G03F 7/039
See application file for complete search history.

(56) References Cited

U.S. PATENT DOCUMENTS

2017/0097564 A1* 4/2017 Nagamine ............. G03F 7/0046
2018/0224742 A1 8/2018 Nakamura et al.

FOREIGN PATENT DOCUMENTS

| JP | 2015-189840 A | 11/2015 |
| JP | 2018-124548 A | 8/2018 |
| TW | 201731808 A | 9/2017 |

\* cited by examiner

*Primary Examiner* — Daborah Chacko-Davis
(74) *Attorney, Agent, or Firm* — Knobbe, Martens, Olson & Bear, LLP

(57) ABSTRACT

A resist composition which generates an acid by exposure and whose solubility in a developing solution changes by the action of an acid. The resist composition contains a high-molecular-weight compound having a constitutional unit represented by General Formula (a0-1), and a high-molecular-weight compound having a constitutional unit represented by General Formula (f01-1) and a constitutional unit including an acid-dissociable group represented by General Formula (f02-r-1). In the formulas, R represents a hydrogen atom or the like; $Va^{01}$ represents a divalent linking group; $n_{a01}$ represents an integer of 0 to 2; $Ra^{01}$ is a lactone-containing cyclic group having a cyano group or the like; $Vf^{01}$ represents a divalent linking group; $Rf^{011}$ and $Rf^{012}$ each represents a trifluoromethyl group or the like; $Rf^{021}$ and $Rf^{022}$ each represents an alkyl group having 1 to 3 carbon atoms; and $Rf^{023}$ represents a polycyclic aliphatic hydrocarbon group

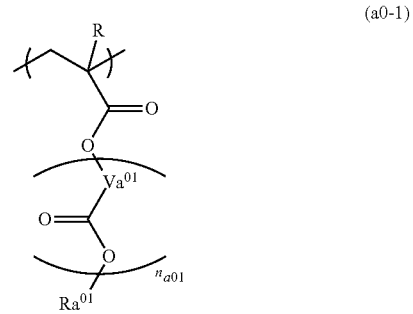

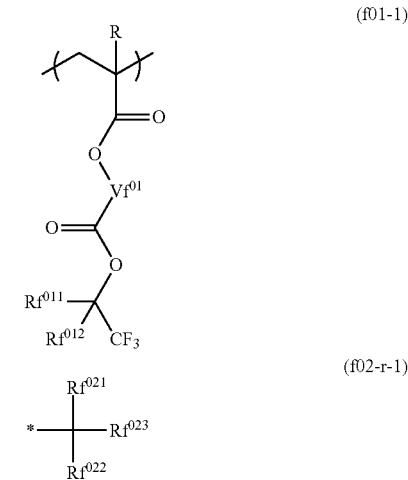

7 Claims, No Drawings

RESIST COMPOSITION AND METHOD OF FORMING RESIST PATTERN

BACKGROUND OF THE INVENTION

Field of the Invention

The present invention relates to a resist composition and a method of forming a resist pattern.

Priority is claimed on Japanese Patent Application No. 2019-224094, filed on Dec. 11, 2019, the content of which is incorporated herein by reference.

Description of Related Art

In recent years, in the production of semiconductor elements and liquid crystal display elements, advances in lithography techniques have led to rapid progress in the field of pattern miniaturization. In general, these miniaturization techniques involve shortening a wavelength (increasing energy) of a light source for exposure.

Resist materials are required to have lithography characteristics such as a sensitivity with respect to such a light source for exposure and a resolution with which patterns of minute dimensions can be reproduced.

As a resist material that satisfies such requirements, a chemically amplified resist composition containing a base material component whose solubility in a developing solution changes by the action of an acid and an acid generator component that generates an acid by exposure has been used in the related art.

In the chemically amplified resist composition, a resin having a plurality of constitutional units is generally used in order to improve lithography characteristics and the like.

For example, a resist composition which employs a high-molecular-weight compound having two specific constitutional units to improve lithography characteristics, and the like are described in Japanese Unexamined Patent Application, First Publication No. 2018-124548.

SUMMARY OF THE INVENTION

In recent years, as further advances in lithography technology have progressed, expansion of application fields, pattern miniaturization and the like have progressed rapidly. Further, along with such progress, in a case of producing a semiconductor element and the like, there is a demand for a technique in which a fine pattern having a pattern width dimension of less than 100 nm can be formed in a good shape.

However, in a resist composition in the related art such as that described in Japanese Unexamined Patent Publication No. 2018-124548 described above, it has been difficult to maintain all of defect number, pattern shape and roughness favorably.

The present invention has been made in view of the above circumstances, and has an object to provide a resist composition having excellent lithography characteristics such as defect number, pattern shape, and roughness, and a method of forming a resist pattern, using the resist composition.

In order to achieve the object, the present invention employs the following configurations.

That is, a first aspect of the present invention is a resist composition which generates an acid by exposure and whose solubility in a developing solution changes by the action of an acid, in which the resist composition contains a base material component (A) whose solubility in a developing solution changes by the action of an acid; and a fluorine additive component (F), the base material component (A) includes a high-molecular-weight compound (A1) having a constitutional unit (a0) represented by General Formula (a0-1), and the fluorine additive component (F) includes a high-molecular-weight compound (F1) having a constitutional unit (f01) represented by General Formula (f01-1) and a constitutional unit (f02) including an acid-dissociable group represented by General Formula (f02-r-1).

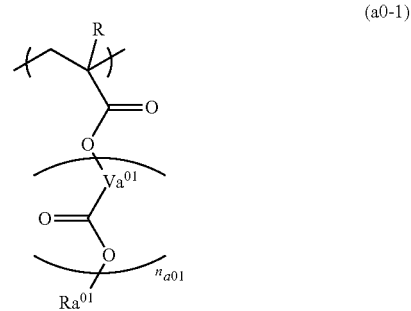

(a0-1)

[In the formula, R represents a hydrogen atom, an alkyl group having 1 to 5 carbon atoms, or a halogenated alkyl group having 1 to 5 carbon atoms. $Va^{01}$ represents a divalent linking group. $n_{a01}$ is an integer of 0 to 2. $Ra^{01}$ represents a lactone-containing cyclic group having at least one substituent selected from the group consisting of a halogen atom, a carboxyl group, an acyl group, a nitro group, and a cyano group.]

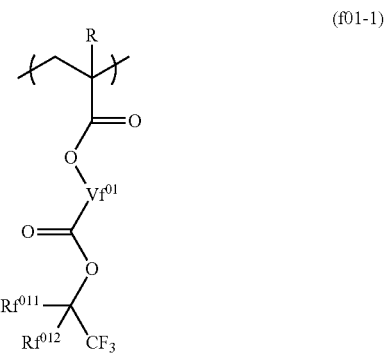

(f01-1)

[In the formula, R represents a hydrogen atom, an alkyl group having 1 to 5 carbon atoms, or a halogenated alkyl group having 1 to 5 carbon atoms. $Vf^{01}$ represents a divalent linking group. $Rf^{011}$ and $Rf^{012}$ each independently represents a hydrogen atom, a fluorine atom, a hydroxyl group, a methyl group, or a trifluoromethyl group.]

(f02-r-1)

[In the formula, $Rf^{021}$ and $Rf^{022}$ each independently represents an alkyl group having 1 to 3 carbon atoms, which may have a substituent. $Rf^{023}$ represents a polycyclic aliphatic hydrocarbon group which may have a substituent. * represents a bond.]

A second aspect of the present invention is a method of forming a resist pattern, including a step of forming a resist film on a support, using the resist composition according to the first aspect, a step of exposing the resist film, and a step of developing the exposed resist film to form a resist pattern.

According to the present invention, it is possible to provide a resist composition having excellent lithography characteristics such as defect number, pattern shape, and roughness, and a method of forming a resist pattern, using the resist composition

DETAILED DESCRIPTION OF THE INVENTION

In the present specification and the scope of the present patent claims, the term "aliphatic" is a relative concept used with respect to the term "aromatic" and defines a group, a compound, or the like, which has no aromaticity.

The term "alkyl group" encompasses a linear, branched, or cyclic, monovalent saturated hydrocarbon group unless otherwise specified. The same applies to the alkyl group in an alkoxy group.

The term "alkylene group" encompasses a linear, branched, or cyclic, divalent saturated hydrocarbon group unless otherwise specified.

Examples of the "halogen atom" include a fluorine atom, a chlorine atom, a bromine atom, and an iodine atom.

The term "constitutional unit" means a monomer unit that contributes to the formation of a high-molecular-weight compound (a resin, a polymer, or a copolymer).

The expression "which may have a substituent" encompasses both a case where a hydrogen atom (—H) is substituted with a monovalent group and a case where a methylene (—CH$_2$—) group is substituted with a divalent group.

The term "exposure" is a concept that includes general irradiation with radiation.

The term "acid-decomposable group" is a group having acid decomposability, in which at least a part of bonds in the structure of the acid-decomposable group can be cleaved by the action of an acid.

Examples of the acid-decomposable group whose polarity increases by the action of an acid include a group that decomposes by the action of an acid to generate a polar group.

Examples of the polar group include a carboxyl group, a hydroxyl group, an amino group, and a sulfo group (—SO$_3$H).

More specific examples of the acid-decomposable group include a group in which the polar group is protected with an acid-dissociable group (such as a group in which a hydrogen atom of an OH-containing polar group is protected with an acid-dissociable group).

The term "acid-dissociable group" refers to both (i) a group in which a bond between the acid-dissociable group and an atom adjacent to the acid-dissociable group can be cleaved by the action of an acid; and (ii) a group in which some bonds are cleaved by the action of an acid, and then a decarboxylation reaction occurs, whereby a bond between the acid-dissociable group and an atom adjacent to the acid-dissociable group is cleaved".

It is necessary that the acid-dissociable group constituting the acid-decomposable group be a group exhibiting a lower polarity than a polar group generated by the dissociation of the acid-dissociable group, and accordingly, in a case where the acid-dissociable group is dissociated by the action of an acid, a polar group exhibiting a higher polarity than the acid-dissociable group is generated, leading to an increase in the polarity. As a result, the polarity of the entire component (A1) increases. With an increase in the polarity, the solubility in a developing solution changes relatively; and in a case where the developing solution is an alkali developing solution, the solubility in the alkali developing solution increases, whereas in a case where the developing solution is an organic developing solution, the solubility in the organic developing solution decreases.

The term "base material component" is an organic compound having a film-forming ability. The organic compounds to be used as the base material component are roughly classified into a non-polymer and a polymer. As the non-polymer, those having a molecular weight of 500 or more and less than 4,000 are usually used. The expression "low-molecular-weight compound" as mentioned hereinafter represents a non-polymer having a molecular weight of 500 or more and less than 4,000. As the polymer, those having a molecular weight of 1,000 or more are usually used. The term or expression "resin", a "high-molecular-weight compound", or a "polymer" as mentioned hereinafter represents a polymer having a molecular weight of 1,000 or more. As the molecular weight of the polymer, a polystyrene-equivalent mass-average molecular weight determined by gel permeation chromatography (GPC) is used.

The expression "constitutional unit derived" means a constitutional unit that is constituted by the cleavage of a multiple bond between carbon atoms, for example, an ethylenic double bond.

In an "acrylic acid ester", a hydrogen atom bonded to a carbon atom at the α-position may be substituted with a substituent. A substituent ($R^{\alpha x}$) which is substituted for a hydrogen atom bonded to the carbon atom at the α-position is an atom or group other than a hydrogen atom. Furthermore, the acrylic acid ester also encompasses an itaconic acid diester in which the substituent ($R^{\alpha x}$) is substituted with a substituent having an ester bond, or an α-hydroxyacrylic ester in which the substituent ($R^{\alpha x}$) is substituted with a hydroxyalkyl group or a group obtained by modifying a hydroxyl group thereof. In addition, a carbon atom at the α-position of the acrylic acid ester is a carbon atom bonded to the carbonyl group of an acrylic acid unless otherwise specified.

Hereinafter, the acrylic acid ester in which a hydrogen atom bonded to the carbon atom at the α-position is substituted with a substituent is referred to as an α-substituted acrylic acid ester" in some cases.

The term "derivative" is a concept including a compound in which a hydrogen atom at the α-position of a target compound is substituted with another substituent such as an alkyl group and a halogenated alkyl group; and a derivative thereof. Examples of such a derivative thereof include a derivative in which the hydrogen atom of a hydroxyl group of a target compound in which a hydrogen atom at the α-position may be substituted with a substituent is substituted with an organic group; and a derivative in which a substituent other than a hydroxyl group is bonded to a target compound in which a hydrogen atom at the α-position may be substituted with a substituent. In addition, the α-position refers to the first carbon atom adjacent to a functional group unless otherwise specified.

Examples of the substituent which is substituted for a hydrogen atom at the α-position of hydroxystyrene include the same as those for $R^{\alpha x}$.

In the present specification and the scope of the present patent claims, asymmetric carbons may be present, or enantiomers or diastereomers may be present, depending on the structures of chemical formulae. In that case, these isomers are represented by one representative chemical formula. These isomers may be used alone or as a mixture thereof.

(Resist Composition)

The resist composition of the present embodiment generates an acid by exposure and has a solubility in a developing solution that changes by the action of an acid.

Such a resist composition contains a base material component (A) (hereinafter also referred to as a "component (A)") whose solubility in a developing solution changes by the action of an acid and a fluorine additive component (F) (hereinafter also referred to as a "component (F)"). The base material component (A) includes a high-molecular-weight compound (A1) having a constitutional unit (a0) represented by General Formula (a0-1). The fluorine additive component (F) includes a high-molecular-weight compound (F1) having a constitutional unit (f01) represented by General Formula (f0-1) and a constitutional unit (f02) including an acid-dissociable group represented by General Formula (f02-r-1).

In a case where a resist film is formed using the resist composition of the present embodiment and the resist film to be formed is subjected to selective exposure, an acid is generated in the light-exposed portion of the resist film and the solubility of the component (A) in a developing solution changes by the action of an acid, whereas the solubility of the component (A) in a developing solution does not change in the unexposed area of the resist film, which leads to a difference in the solubility in the developing solution between the light-exposed portion and the unexposed area. Therefore, by subjecting the resist film to development, the light-exposed portion of the resist film is dissolved and removed to form a positive-tone resist pattern in a case where the resist composition is of a positive tone, whereas the unexposed area of the resist film is dissolved and removed to form a negative-tone resist pattern in a case where the resist composition is of a negative tone.

In the present specification, a resist composition which forms a positive-tone resist pattern by dissolving and removing the light-exposed portion of a resist film is referred to as a positive-tone resist composition, and a resist composition which forms a negative-tone resist pattern by dissolving and removing the unexposed area of a resist film is referred to as a negative-tone resist composition. The resist composition of the present embodiment may be a positive-tone resist composition or a negative-tone resist composition. Further, the resist composition of the present embodiment may be used for an alkali developing process using an alkali developing solution in a developing treatment in the formation of a resist pattern, and may also be used for a solvent developing process using a developing solution including an organic solvent (organic developing solution) in the developing treatment.

The resist composition of the present embodiment has a function of generating an acid by exposure, the component (A) may generate an acid by exposure, and an additive component which is blended, apart from the component (A), may generate an acid by exposure.

Specifically, the resist composition of the present embodiment may be (1) a resist composition which further contains an acid generator component (B) (hereinafter referred to as a "component (B)") that generates an acid by exposure; (2) a resist composition in which the component (A) may be a component that generates an acid by exposure; and (3) a resist composition in which the component (A) is a component that generates an acid by exposure and the resist composition further contains the component (B).

That is, in the cases of (2) and (3) above, the component (A) serves as a "base material component which generates an acid by exposure and whose solubility in a developing solution changes by the action of an acid". In a case where the component (A) is a base material component which generates an acid by exposure and whose solubility in a developing solution changes by the action of an acid, it is preferable that the component (A1) which will be described later be a high-molecular-weight compound which generates an acid by exposure and whose solubility in a developing solution changes by the action of an acid. As such a high-molecular-weight compound, a resin having a constitutional unit that generates an acid by exposure can be used. As the constitutional unit that generates an acid by exposure, a known constitutional unit can be used. Among those, the resist composition of the present embodiment is particularly preferably the case of (1) above.

<Component (A)>

In the resist composition of the present embodiment, the component (A) includes a high-molecular-weight compound (A1) (hereinafter also referred to as a "component (A1)") whose solubility in a developing solution changes by the action of an acid. In the alkali developing process and the solvent developing process, since the polarity of the base material component changes between before and after the exposure by using the component (A1), an excellent development contrast between an exposed portion and an unexposed portion can be obtained.

At least the component (A1) is used as the component (A), and another high-molecular-weight compound and/or a low-molecular-weight compound may be used in combination with the component (A1).

In a case of applying the alkali developing process, a base material component including the component (A1) is poorly-soluble in an alkali developing solution prior to exposure, and for example, in a case where an acid is generated by exposure, the polarity increases and the solubility in an alkali developing solution increases by the action of the acid. Therefore, in a case where a resist film formed by applying the resist composition onto a support is subjected to selective exposure in the formation of a resist pattern, the light-exposed portion of the resist film changes from an insoluble state to a soluble state in an alkali developing solution, whereas the unexposed area of the resist film remains insoluble in the alkali developing solution, and thus, a positive-tone resist pattern is formed by performing the alkali development.

On the other hand, in a case of applying the solvent developing process, the base material component including the component (A1) exhibits high solubility in an organic developing solution prior to exposure, and in a case where an acid is generated from the component (B) by exposure, the polarity of the component (A1) increases and the solubility of the component (A1) in the organic developing solution decreases by the action of the generated acid. Therefore, in a case where a resist film formed by applying the resist composition onto a support is subjected to selective exposure in the formation of a resist pattern, the light-exposed portion of the resist film changes from a soluble state to an insoluble state in an organic developing solution, whereas the unexposed area of the resist film remains soluble and does not change, whereby a contrast between the light-exposed portion and the unexposed area can be obtained, and thus a negative-tone resist pattern is formed by performing the development with the organic developing solution.

In the resist composition of the present embodiment, the component (A) may be used alone or in combination of two or more kinds thereof.

With Regard to Component (A1)

The component (A1) is a resin component whose solubility in a developing solution changes by the action of an acid.

The component (A1) has a constitutional unit (a0) represented by General Formula (a0-1).

The component (A1) may have another constitutional unit as necessary, in addition to the constitutional unit (a0).

<<Constitutional Unit (a0)>>

The constitutional unit (a0) is a constitutional unit represented by General Formula (a0-1).

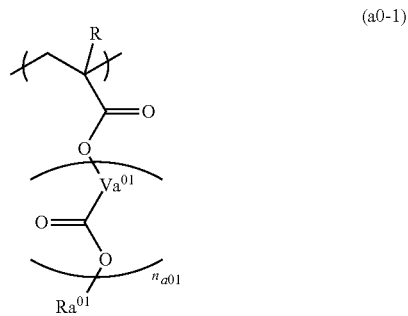

(a0-1)

[In the formula, R represents a hydrogen atom, an alkyl group having 1 to 5 carbon atoms, or a halogenated alkyl group having 1 to 5 carbon atoms. $Va^{01}$ represents a divalent linking group. $n_{a01}$ is an integer of 0 to 2. $Ra^{01}$ represents a lactone-containing cyclic group having at least one substituent selected from the group consisting of a halogen atom, a carboxyl group, an acyl group, a nitro group, and a cyano group.]

In Formula (a0-1), R is a hydrogen atom, an alkyl group having 1 to 5 carbon atoms, or a halogenated alkyl group having 1 to 5 carbon atoms. The alkyl group having 1 to 5 carbon atoms of R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group obtained by substituting some or all of the hydrogen atoms in the alkyl group having 1 to 5 carbon atoms with halogen atoms. As the halogen atom, a fluorine atom is particularly preferable.

As R, the hydrogen atom, the alkyl group having 1 to 5 carbon atoms, or a fluorinated alkyl group having 1 to 5 carbon atoms is preferable, and the hydrogen atom or the methyl group is the most preferable in terms of industrial availability.

In Formula (a0-1), $Va^{01}$ is a divalent linking group. The divalent linking group is not particularly limited, but examples thereof include a divalent hydrocarbon group which may have a substituent and a divalent linking group including a heteroatom.

Divalent Hydrocarbon Group which May have Substituent:

In a case where $Va^{01}$ is a divalent hydrocarbon group which may have a substituent, the hydrocarbon group may be an aliphatic hydrocarbon group or an aromatic hydrocarbon group.

Aliphatic Hydrocarbon Group in $Va^{01}$

The aliphatic hydrocarbon group means a hydrocarbon group that has no aromaticity. The aliphatic hydrocarbon group may be saturated or unsaturated, and usually, the aliphatic hydrocarbon group is preferably saturated.

Examples of the aliphatic hydrocarbon group include a linear or branched aliphatic hydrocarbon group, and an aliphatic hydrocarbon group including a ring in a structure thereof.

Linear or Branched Aliphatic Hydrocarbon Group

The linear aliphatic hydrocarbon group preferably has 1 to 10 carbon atoms, more preferably has 1 to 6 carbon atoms, still more preferably has 1 to 4 carbon atoms, and most preferably has 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group preferably has 2 to 10 carbon atoms, more preferably has 3 to 6 carbon atoms, still more preferably has 3 or 4 carbon atoms, and most preferably has 3 carbon atoms.

As the branched aliphatic hydrocarbon group, a branched alkylene group is preferable, and specific examples thereof include an alkylalkylene group, for example, an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; an alkyltrimethylene group such as —$CH(CH_3)CH_2CH_2$—, and —$CH_2CH(CH_3)CH_2$—; and an alkyltetramethylene group such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms, which is substituted with a fluorine atom, and a carbonyl group.

Aliphatic Hydrocarbon Group Including Ring in Structure Thereof

Examples of the aliphatic hydrocarbon group including a ring in a structure thereof include a cyclic aliphatic hydrocarbon group which may have a substituent including a heteroatom in a ring structure thereof (a group obtained by removing two hydrogen atoms from an aliphatic hydrocarbon ring), a group obtained by bonding a cyclic aliphatic hydrocarbon group to a terminal of a linear or branched aliphatic hydrocarbon group, and a group obtained by interposing a cyclic aliphatic hydrocarbon group in a linear or branched aliphatic hydrocarbon group. Examples of the linear or branched aliphatic hydrocarbon group include the same as those described above.

The cyclic aliphatic hydrocarbon group preferably has 3 to 20 carbon atoms, and more preferably has 3 to 12 carbon atoms.

The cyclic aliphatic hydrocarbon group may be a polycyclic group or a monocyclic group. As the monocyclic alicyclic hydrocarbon group, a group obtained by removing two hydrogen atoms from a monocycloalkane is preferable. The monocycloalkane preferably has 3 to 6 carbon atoms, and specific examples thereof include cyclopentane and cyclohexane. As the polycyclic alicyclic hydrocarbon group, a group obtained by removing two hydrogen atoms from a polycycloalkane is preferable; as the polycycloalkane, a group having 7 to 12 carbon atoms is preferable, and examples of the polycycloalkane include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and more preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably the methoxy group or the ethoxy group.

The halogen atom as the substituent is preferably a fluorine atom.

Examples of the halogenated alkyl group as the substituent include a group obtained by substituting some or all of the hydrogen atoms in the alkyl group with the halogen atoms.

In the cyclic aliphatic hydrocarbon group, some of the carbon atoms constituting a ring structure thereof may be substituted with substituents including a heteroatom. As the substituent including a heteroatom, —O—, —C(=O)—O—, —S—, —S(=O)$_2$—, or —S(=O)$_2$—O— is preferable.

Aromatic Hydrocarbon Group in $Va^{01}$

The aromatic hydrocarbon group is a hydrocarbon group having at least one aromatic ring.

This aromatic ring is not particularly limited as long as it is a cyclic conjugated system having (4n+2) π electrons, and may be monocyclic or polycyclic. The aromatic ring preferably has 5 to 30 carbon atoms, more preferably has 5 to 20 carbon atoms, still more preferably has 6 to 15 carbon atoms, and particularly preferably has 6 to 12 carbon atoms. It should be noted that the number of carbon atoms in a substituent is not included in the number of carbon atoms.

Specific examples of the aromatic ring include an aromatic hydrocarbon ring such as benzene, naphthalene, anthracene, and phenanthrene; and an aromatic hetero ring obtained by substituting some of the carbon atoms constituting the aromatic hydrocarbon ring with heteroatoms. Examples of the heteroatom in the aromatic hetero ring include an oxygen atom, a sulfur atom, and a nitrogen atom. Specific examples of the aromatic hetero ring include a pyridine ring and a thiophene ring.

Specific examples of the aromatic hydrocarbon group include a group obtained by removing two hydrogen atoms from the aromatic hydrocarbon ring or aromatic hetero ring (an arylene group or a heteroarylene group); a group obtained by removing two hydrogen atoms from an aromatic compound including two or more aromatic rings (biphenyl, fluorene, and the like); and a group by substituting one hydrogen atom of a group (an aryl group or a heteroaryl group) obtained by removing one hydrogen atom from the aromatic hydrocarbon ring or aromatic hetero ring with an alkylene group (for example, a group obtained by further removing one hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aryl group or the heteroaryl group preferably has 1 to 4 carbon atoms, more preferably has 1 or 2 carbon atoms, and particularly preferably has one carbon atom.

With respect to the aromatic hydrocarbon group, the hydrogen atom which the aromatic hydrocarbon group has may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and more preferably a methyl group, an ethyl group, a propyl group, an n-butyl group, or a tert-butyl group.

Examples of the alkoxy group, the halogen atom, and the halogenated alkyl group as the substituent include the same as those exemplified as the substituent which is substituted for a hydrogen atom contained in the cyclic aliphatic hydrocarbon group.

Divalent Linking Group Including Heteroatom

In a case where $Va^{01}$ is a divalent linking group including a heteroatom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group and an acyl group), —S—, —S(=O)$_2$—, —S(=O)$_2$—O—, and a group represented by General Formula: —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$— [in the formulae, $Y^{21}$ and $Y^{22}$ are each independently a divalent hydrocarbon group which may have a substituent, O is an oxygen atom, and m" is an integer of 0 to 3].

In a case where the divalent linking group including a heteroatom is —C(=O)—NH—, —C(=O)—NH—C(=O)—, —NH—, or —NH—C(=NH)—, H may be substituted with a substituent such as an alkyl group and an acyl group. The substituent (an alkyl group, an acyl group, or the like) preferably has 1 to 10 carbon atoms, more preferably has 1 to 8 carbon atoms, and particularly preferably has 1 to 5 carbon atoms.

In General Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$—, $Y^{21}$, and $Y^{22}$ are each independently a divalent hydrocarbon group which may have a substituent. Examples of the divalent hydrocarbon group include the same as those of the divalent hydrocarbon group which may have a substituent.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[$Y^{21}$—C(=O)—O]$_{m''}$—$Y^{22}$—, m" is an integer of 0 to 3, preferably an integer of 0 to 2, more preferably 0 or 1, and particularly preferably 1. In other words, as the group represented by Formula —[$Y^{21}$—C(=O)—O]$_{m''}$—$Y^{22}$—, a group represented by Formula —$Y^{21}$—C(=O)—O—$Y^{22}$— is particularly preferable. Among these, a group represented by Formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

Among those, as $Va^{01}$, a divalent hydrocarbon group which may have a substituent is preferable, an aliphatic hydrocarbon group which may have a substituent is more preferable, and a linear or branched alkylene group having 1 to 10 carbon atoms, which may have a substituent, is still more preferable. The alkylene group has more preferably 1 to 6 carbon atoms, still more preferably 1 to 4 carbon atoms, and particularly preferably 1 to 3 carbon atoms. As $Va^{01}$, a methylene group or an ethylene group is particularly preferable.

In Formula (a0-1), $n_{a01}$ is an integer of 0 to 2. $n_{a01}$ is preferably 0 or 1.

In Formula (a0-1), $Ra^{01}$ is a lactone-containing cyclic group having at least one substituent selected from the group consisting of a halogen atom, a carboxyl group, an acyl group, a nitro group, and a cyano group. The "lactone-containing cyclic group" represents a cyclic group that contains a ring (lactone ring) including a —O—C(=O)— in the ring skeleton. In a case where the lactone ring is counted as the first ring and the group has only the lactone ring, the group is referred to as a monocyclic group, and in a case where the group has other ring structures, the group is referred to as a polycyclic group regardless of the structures. The lactone-containing cyclic group may be a monocyclic group or a polycyclic group.

The lactone-containing cyclic group in $Ra^{01}$ is not particularly limited, and any constitutional unit can be used. More specific examples of the lactone-containing cyclic group include groups each represented by General Formulae (a2-r-1) to (a2-r-7) which will be described later. Examples of the lactone-containing cyclic group in $Ra^{01}$ include those in which $Ra'^{21}$ in the groups represented by General Formulae (a2-r-1) to (a2-r-7) which will be described later is a halogen atom, a carboxyl group, an acyl group, a nitro group, or a cyano group.

Preferred examples of the lactone-containing cyclic group in $Ra^{01}$ include a lactone-containing cyclic group represented by General Formula (Ra0-1).

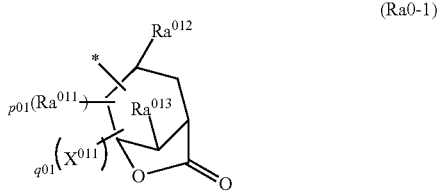

(Ra0-1)

[In the formula, $Ra^{012}$ and $Ra^{013}$ each independently represents a hydrogen atom, an alkyl group having 1 to 5 carbon atoms, an alkoxy group having 1 to 5 carbon atoms, or an alkylthio group having 1 to 5 carbon atoms, or $Ra^{012}$ and $Ra^{013}$ are bonded to each other to represent an alkylene group having 1 to 6 carbon atoms, which may include an oxygen atom or a sulfur atom, an ether bond (—O—), or a thioether bond (—S—). $X^{011}$ represents a halogen atom, a carboxyl group, an acyl group, a nitro group, or a cyano group. $Ra^{011}$ represents an alkyl group having 1 to 6 carbon atoms, which may include a halogen atom, a hydroxyalkyl group having 1 to 6 carbon atoms, in which the hydroxyl group moiety may be protected with a protective group and which may include a halogen atom, a carboxyl group which may form a salt, or a substituted oxycarbonyl group. $p_{01}$ represents an integer of 0 to 8, and $q_{01}$ represents an integer of 1 to 9. It should be noted that $p_{01}+q_{01} \leq 9$. In a case where two or more $X^{011}$'s are present, the plurality of $X^{011}$'s may be the same as or different from each other. In a case where two or more $Ra^{011}$'s are present, the plurality of $Ra^{011}$'s may be the same as or different from each other. In a case where $Ra^{012}$ and $Ra^{013}$ are bonded to each other to form an alkylene group having 1 to 6 carbon atoms, which may include an oxygen atom or a sulfur atom, $X^{011}$ and $Ra^{011}$ may be each independently present as a substituent which is substituted for a hydrogen atom of the alkylene group having 1 to 6 carbon atoms. * represents a bond that is bonded to an oxygen atom in Formula (a0-1).]

In General Formula (Ra0-1), $Ra^{012}$ and $Ra^{013}$ each independently represents a hydrogen atom, an alkyl group having 1 to 5 carbon atoms, an alkoxy group having 1 to 5 carbon atoms, or an alkylthio group having 1 to 5 carbon atoms, or $Ra^{012}$ and $Ra^{013}$ are bonded to each other to represent an alkylene group having 1 to 6 carbon atoms, which may include an oxygen atom or a sulfur atom, an ether bond, or a thioether bond (—S—).

The alkyl group having 1 to 5 carbon atoms is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group, and a neopentyl group.

The alkoxy group having 1 to 5 carbon atoms is preferably a linear or branched alkoxy group, and specific examples thereof include a group formed by the linking of an alkyl group mentioned as the alkyl group in $Ra^{012}$ and $Ra^{013}$ and an oxygen atom (—O).

The alkylthio group having 1 to 5 carbon atoms is preferably one having 1 to 4 carbon atoms, and specific examples thereof include a methylthio group, an ethylthio group, an n-propylthio group, an iso-propylthio group, an n-butylthio group, and a tert-butylthio group.

As the alkylene group having 1 to 6 carbon atoms formed by the mutual bonding of $Ra^{012}$ and $Ra^{013}$, a linear or branched alkylene group is preferable, and examples thereof include a methylene group, an ethylene group, an n-propylene group, and an isopropylene group. In a case where the alkylene group includes an oxygen atom or a sulfur atom, specific examples thereof include a group obtained by interposing —O— or —S— in a terminal of the alkylene group or between the carbon atoms of the alkylene group, such as —O—CH$_2$—, —CH$_2$—O—CH$_2$—, —S—CH$_2$—, and —CH$_2$—S—CH$_2$—. As the group formed by the mutual bonding of $Ra^{012}$ and $Ra^{013}$, an alkylene group having 1 to 6 carbon atoms or —O— is preferable, the alkylene group having 1 to 6 carbon atoms is more preferable, an alkylene group having 1 to 5 carbon atoms is still more preferable, and a methylene group is particularly preferable.

Among those, with regard to $Ra^{012}$ and $Ra^{013}$, it is preferable that $Ra^{012}$ and $Ra^{013}$ be bonded to each other to form an alkylene group having 1 to 6 carbon atoms. As the alkylene group having 1 to 6 carbon atoms, an alkylene group having 1 to 3 carbon atoms is more preferable, and a methylene group is still more preferable.

With regard to $Ra^{011}$ in General Formula (Ra0-1), $Ra^{011}$ represents an alkyl group having 1 to 6 carbon atoms, which may have a halogen atom, a hydroxy alkyl group having 1 to 6 carbon atoms, in which a hydroxyl group moiety may be protected with a protective group and which may have a halogen atom, a carboxyl group that forms a salt, or a substituted oxycarbonyl group.

Examples of the alkyl group having 1 to 6 carbon atoms include a methyl group, an ethyl group, an n-propyl group, an isopropyl group, an n-butyl group, an isobutyl group, an s-butyl group, a t-butyl group, a pentyl group, and a hexyl group. Among these, an alkyl group having 1 to 5 carbon atoms is preferable, an alkyl group having 1 to 4 carbon atoms is more preferable, an alkyl group having 1 to 3 carbon atoms is still more preferable, a methyl group or an ethyl group is particularly preferable, and the methyl group is the most preferable.

The alkyl group having 1 to 6 carbon atoms may or may not have a halogen atom. As the halogen atom, a fluorine atom or a chlorine atom is preferable, and the fluorine atom is more preferable. Examples of the alkyl group having a halogen atom and having 1 to 6 carbon atoms include a chloroalkyl group such as a chloromethyl group; and a fluoroalkyl group (preferably a fluoroalkyl group having 1 to 3 carbon atoms) such as a trifluoromethyl group, a 2,2,2-trifluoroethyl group, and a pentafluoroethyl group.

Examples of the hydroxyalkyl group having 1 to 6 carbon atoms include a hydroxymethyl group, a 2-hydroxy ethyl group, a 1-hydroxy ethyl group, a 3-hydroxypropyl group, a 2-hydroxypropyl group, a 4-hydroxybutyl group, and a 6-hydroxyhexyl group.

The hydroxyalkyl group having 1 to 6 carbon atoms may or may not have a halogen atom. As the halogen atom, a fluorine atom is preferable. Examples of the hydroxyalkyl group having 1 to 6 carbon atoms, which has a halogen atom, include a difluorohydroxymethyl group, a 1,1-difluoro-2-hydroxyethyl group, a 2,2-difluoro-2-hydroxy ethyl group, and a 1,1,2,2-tetrafluoro-2-hydroxyethyl group.

The hydroxyalkyl group having 1 to 6 carbon atoms, which may have a halogen atom, preferably has 1 to 3 carbon atoms, more preferably has 1 or 2 carbon atoms, and still more preferably has one carbon atom.

In the hydroxyalkyl group having 1 to 6 carbon atoms, the hydroxyl group moiety may or may not be protected with a protective group. Examples of the protective group that protects the hydroxyl group moiety include a group capable of forming an ether bond or an acetal bond together with an oxygen atom constituting a hydroxyl group, such as a methyl group and a methoxymethyl group; and a group capable of forming an ester bond together with an oxygen atom constituting a hydroxyl group, such as an acetyl group and a benzoyl group.

The carboxyl group that may form a salt is selected from the group consisting of a carboxyl group and a carboxyl group that forms a salt (a salt of the carboxyl group). Examples of the carboxyl group that forms a salt (a salt of the carboxyl group) include an alkali metal salt of a carboxyl group, an alkaline earth metal salt of a carboxyl group, and a transition metal salt of a carboxyl group.

Examples of the substituted oxycarbonyl group include an alkoxycarbonyl group in which an alkoxy group having 1 to 4 carbon atoms and a carbonyl group are bonded to each other (specifically an alkyloxycarbonyl group such as a methoxycarbonyl group, an ethoxycarbonyl group, an iso-propyloxycarbonyl group, and an n-propoxycarbonyl group; an alkenyloxycarbonyl group such as a vinyloxycarbonyl group and an allyloxycarbonyl group); a cycloalkyloxycarbonyl group such as a cyclohexyloxycarbonyl group, and an aryloxycarbonyl group such as phenyloxycarbonyl group.

In General Formula (Ra0-1), $X^{011}$ represents a halogen atom, a carboxyl group, an acyl group, a nitro group, or a cyano group. As the halogen atom, a fluorine atom is preferable. As the acyl group, an acyl group having 1 to 3 carbon atoms is preferable, and specific examples thereof include a formyl group, an acetyl group, and a propionyl group. Among these, $X^{011}$ is preferably a cyano group.

In General Formula (Ra0-1), $p_{01}$ is an integer of 0 to 8. In General Formula (Ra0-1), $q_{01}$ is an integer of 1 to 9. It should be noted that $p_{01}+q_{01}\leq 9$.

$p_{01}$ is preferably an integer of 0 to 6, more preferably an integer of 0 to 3, still more preferably 0 or 1, and particularly preferably 0.

$q_{01}$ is preferably an integer of 1 to 5, more preferably 1 or 2, and still more preferably 1.

$p_{01}$ is an integer from 2 to 8, and in a case where two or more $Ra^{011}$'s are present, the plurality of $Ra^{011}$'s may be the same as or different from each other.

$q_{01}$ is an integer from 2 to 9, and in a case where two or more $X^{011}$'s are present, the plurality of $X^{011}$'s may be the same as or different from each other.

In a case where $Ra^{012}$ and $Ra^{013}$ are bonded to each other to form an alkylene group having 1 to 6 carbon atoms, which may include an oxygen atom or a sulfur atom, $X^{011}$ and $Ra^{011}$ may be each independently present as a substituent which is substituted for a hydrogen atom of the alkylene group having 1 to 6 carbon atoms.

The constitutional unit (a0) is preferably a constitutional unit represented by General Formula (a0-1-1).

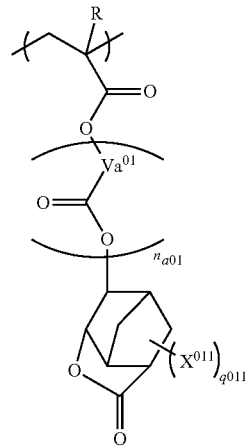

(a0-1-1)

[In the formula, R is a hydrogen atom, an alkyl group having 1 to 5 carbon atoms, or a halogenated alkyl group having 1 to 5 carbon atoms. $Va^{01}$ represents a divalent hydrocarbon group which may have a substituent. $n_{a01}$ is an integer of 0 to 2. $X^{011}$ represents a halogen atom, a carboxyl group, an acyl group, a nitro group, or a cyano group. $q_{011}$ is an integer of 1 to 7.]

R, $Va^{01}$, and $n_{a01}$ in Formula (a0-1-1) are the same as R, $Va^{01}$, and $n_{a01}$ in Formula (a0-1), respectively. $X^{011}$ in Formula (a0-1-1) is the same as $X^{011}$ in Formula (Ra0-1).

$q_{011}$ in Formula (a0-1-1) is an integer of 1 to 7, preferably 1 or 2, and more preferably 1.

Specific examples of the constitutional unit (a0) are shown below.

In each of the formulae shown below, R" represents a hydrogen atom, a methyl group, or a trifluoromethyl group. $n_{a01}$ represents an integer of 0 to 2, and is preferably 0 or 1. Ac represents an acetyl group. X represents a halogen atom, a carboxyl group, an acyl group, a nitro group, or a cyano group, and is preferably the cyano group (—CN).
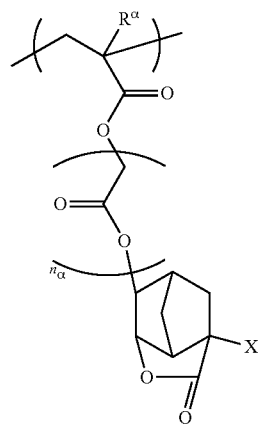
(a0-1-1-1)
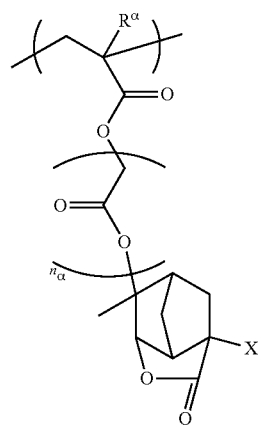
(a0-1-1-2)
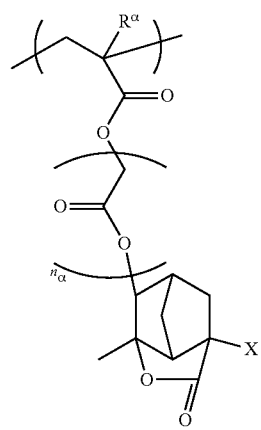
(a0-1-1-3)
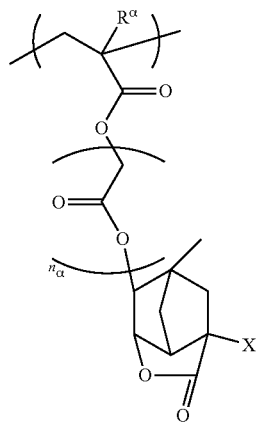
(a0-1-1-4)
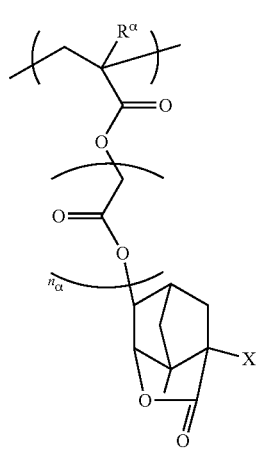
(a0-1-1-5)
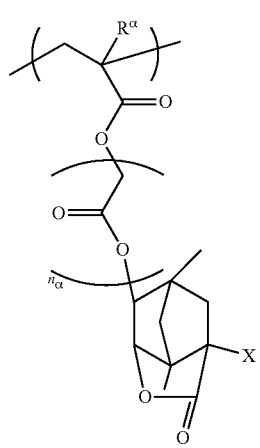
(a0-1-1-6)

-continued
(a0-1-1-7)
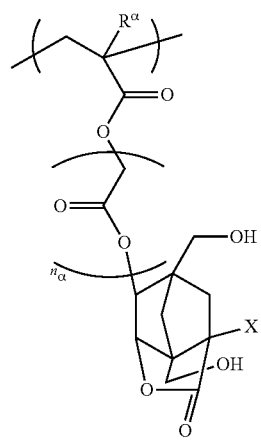
(a0-1-1-8)
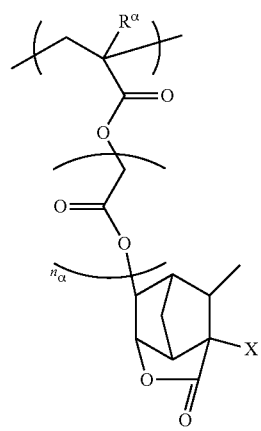
(a0-1-1-9)
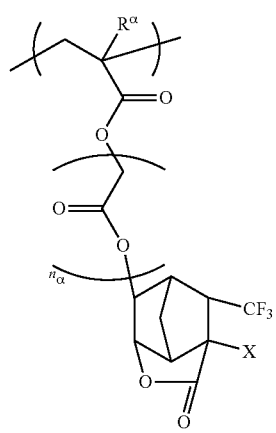
(a0-1-1-10)
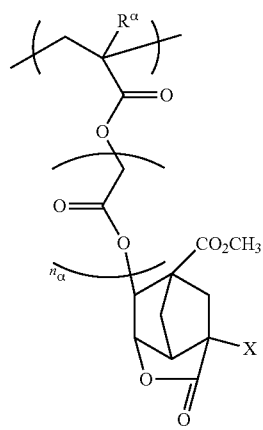
(a0-1-1-11)
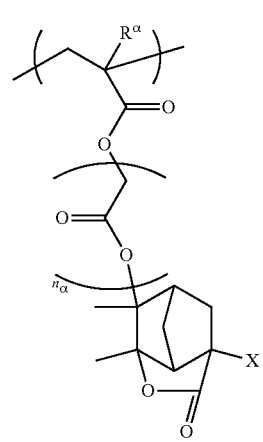
(a0-1-1-12)
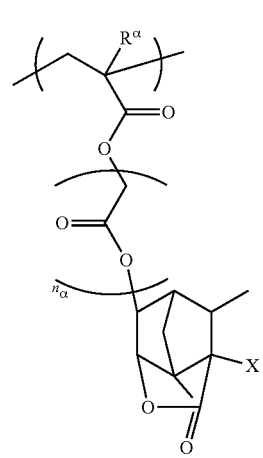

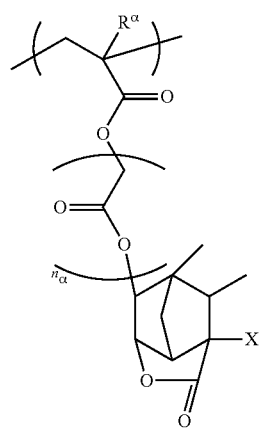
(a0-1-1-13)
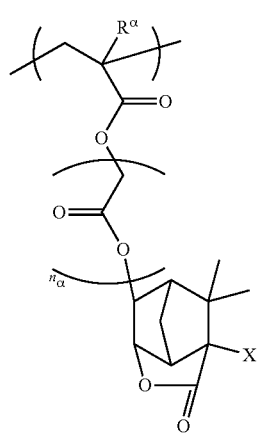
(a0-1-1-16)
(a0-1-1-14)
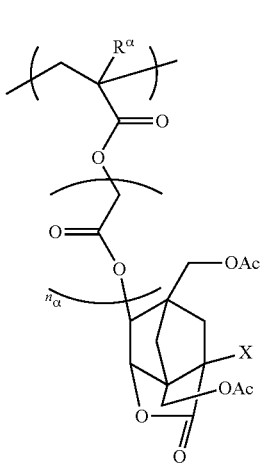
(a0-1-1-17)
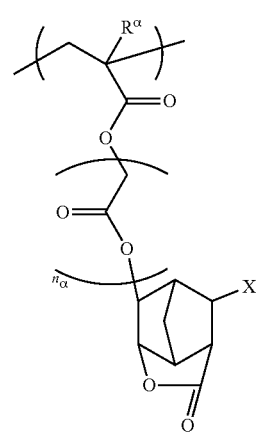
(a0-1-1-15)
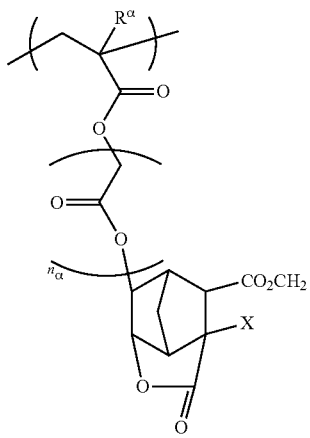
(a0-1-1-18)

(a0-1-1-19)
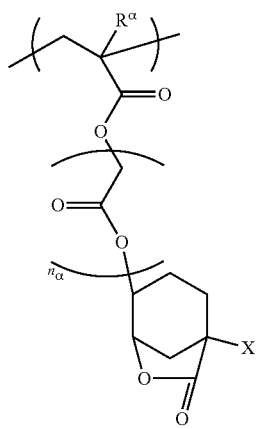

(a0-1-1-20)
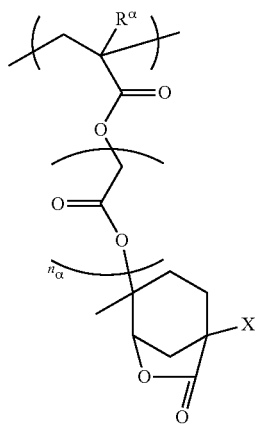

(a0-1-1-21)
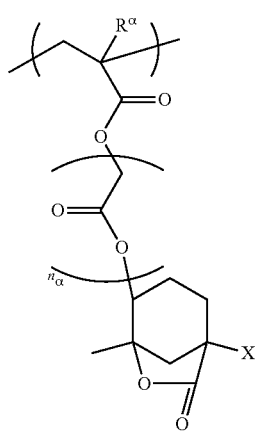

(a0-1-1-22)
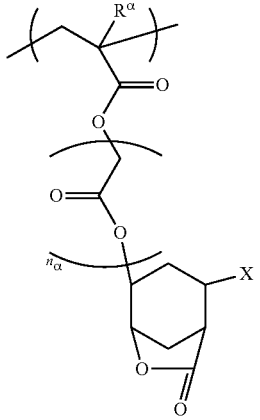

(a0-1-1-23)
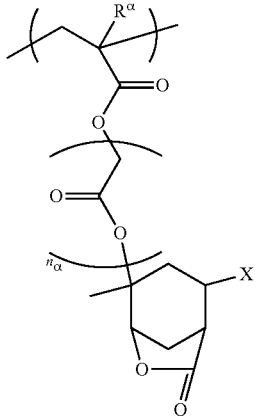

(a0-1-1-24)
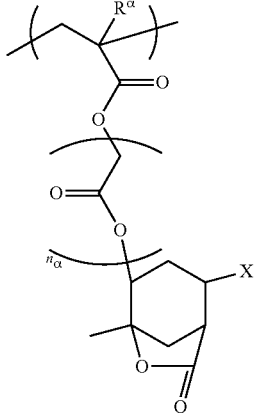

Among those, the constitutional unit (a0) is preferably a constitutional unit represented by any of Formulae (a0-1-1-1) to (a0-1-1-18), and more preferably the constitutional unit represented by Formula (a0-1-1-1).

The constitutional unit (a0) contained in the component (A1) may be one kind or two or more kinds.

The proportion of the constitutional unit (a0) in the component (A1) is preferably 10% by mole or more and 80% by mole or less, more preferably 20% by mole or more and 70% by mole or less, still more preferably 30% by mole or more and 60% by mole or less, even still more preferably 35% by mole or more and 55% by mole or less, and further more preferably 40% by mole or more and 55% by mole or less, with respect to the total amount (100% by mole) of all the constitutional units constituting the component (A1).

By setting the proportion of the constitutional unit (a0) to be equal to or higher than the lower limit of the preferred range, lithography characteristics such as a defect, pattern shape, and roughness can be further improved. Further, in a case where the proportion of the constitutional unit (a0) is equal to or lower than the upper limit of the preferred range, it is possible to get a balance with other constitutional units.

<<Other Constitutional Units>>

The component (A1) may have another constitutional unit, as necessary, in addition to the constitutional unit (a0).

Examples of such another constitutional unit include: a constitutional unit (a1) including an acid-decomposable group whose polarity increases by the action of an acid; a constitutional unit (a2) including a lactone-containing cyclic group, an —$SO_2$-containing cyclic group, or a carbonate-containing cyclic group (excluding those corresponding to the constitutional unit (a0)); and a constitutional unit (a3) including a polar group-containing aliphatic hydrocarbon group; a constitutional unit (a4) including a non-acid-dissociable aliphatic cyclic group; a constitutional unit (a10) represented by General Formula (a10-1) which will be described later; and a constitutional unit (st) derived from styrene or a styrene derivative.

With Regard to Constitutional Unit (a1):

The constitutional unit (a1) is a constitutional unit that includes an acid-decomposable group whose polarity increases by the action of an acid.

Examples of the acid-dissociable group are the same as those which have been proposed as an acid-dissociable group of a base resin for a chemically amplified resist composition.

Specific examples of the acid-dissociable group which has been proposed as the acid-dissociable group of a base resin for a chemically amplified resist composition include an "acetal-type acid-dissociable group", a "tertiary alkyl ester-type acid-dissociable group", and a "tertiary alkyloxycarbonyl acid-dissociable group", each of which will be described below.

Acetal-Type Acid-Dissociable Group:

Examples of the acid-dissociable group that protects a carboxyl group or a hydroxyl group as a polar group include the acid-dissociable group represented by General Formula (a1-r-1) (hereinafter also referred to as an "acetal-type acid-dissociable group").

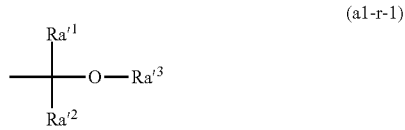

(a1-r-1)

[In the formula, $Ra'^1$ to $Ra'^2$ are each a hydrogen atom or an alkyl group. $Ra'^3$ is a hydrocarbon group, and $Ra'^3$ may be bonded to any of $Ra'^1$ and $Ra'^2$ to form a ring.]

In Formula (a1-r-1), it is preferable that at least one of $Ra'^1$ and $Ra'^2$ be a hydrogen atom, and it is more preferable that both of $Ra'^1$ and $Ra'^2$ be hydrogen atoms.

In a case where $Ra'^1$ or $Ra'^2$ is an alkyl group, examples of the alkyl group include the same ones of the alkyl groups mentioned as the substituent which may be bonded to the carbon atom at the α-position in the description on the α-substituted acrylic acid ester, and an alkyl group having 1 to 5 carbon atoms is preferable. Specific preferred examples thereof include a linear or branched alkyl group. More specific examples thereof include a methyl group, an ethyl group, a propyl group, an isopropyl group, an n-butyl group, an isobutyl group, a tert-butyl group, a pentyl group, an isopentyl group, and a neopentyl group, the methyl group or the ethyl group is preferable, and the methyl group is particularly preferable.

In Formula (a1-r-1), examples of the hydrocarbon group of $Ra'^3$ include a linear or branched alkyl group and a cyclic hydrocarbon group.

The linear alkyl group preferably has 1 to 5 carbon atoms, more preferably has 1 to 4 carbon atoms, and still more preferably has 1 or 2 carbon atoms. Specific examples thereof include a methyl group, an ethyl group, an n-propyl group, an n-butyl group, and an n-pentyl group. Among these, the methyl group, the ethyl group, or the n-butyl group is preferable, and the methyl group or the ethyl group is more preferable.

The branched alkyl group preferably has 3 to 10 carbon atoms, and more preferably has 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group, and the isopropyl group is preferable.

In a case where $Ra'^3$ is a cyclic hydrocarbon group, the cyclic hydrocarbon group may be an aliphatic hydrocarbon group or an aromatic hydrocarbon group, and may be a polycyclic group or a monocyclic group.

As the aliphatic hydrocarbon group which is a monocyclic group, a group obtained by removing one hydrogen atom from a monocycloalkane is preferable. The monocycloalkane preferably has 3 to 6 carbon atoms, and specific examples thereof include cyclopentane and cyclohexane.

As the aliphatic hydrocarbon group which is a polycyclic group, a group obtained by removing one hydrogen atom from a poly cycloalkane is preferable; and as the polycycloalkane, a group having 7 to 12 carbon atoms is preferable, and specific examples of the polycycloalkane include adamantane, norbornane, isobornane, tricyclodecane, and tetracyclododecane.

In a case where the cyclic hydrocarbon group of $Ra'^3$ is an aromatic hydrocarbon group, the aromatic hydrocarbon group is a hydrocarbon group having at least one aromatic ring.

The aromatic ring is not particularly limited as long as it is a cyclic conjugated system having (4n+2) π electrons, and may be monocyclic or polycyclic. The aromatic ring preferably has 5 to 30 carbon atoms, more preferably has 5 to 20 carbon atoms, still more preferably has 6 to 15 carbon atoms, and particularly preferably has 6 to 12 carbon atoms.

Specific examples of the aromatic ring include an aromatic hydrocarbon ring such as benzene, naphthalene, anthracene, and phenanthrene; and an aromatic hetero ring obtained by substituting some of the carbon atoms constituting the aromatic hydrocarbon ring with heteroatoms. Examples of the heteroatom in the aromatic hetero ring include an oxygen atom, a sulfur atom, and a nitrogen atom. Specific examples of the aromatic hetero ring include a pyridine ring and a thiophene ring.

Specific examples of the aromatic hydrocarbon group in $Ra'^3$ include a group obtained by removing one hydrogen atom from the aromatic hydrocarbon ring or the aromatic hetero ring (an aryl group or a heteroaryl group); a group obtained by removing one hydrogen atom from an aromatic compound having two or more aromatic rings (for example, biphenyl and fluorene); and a group obtained by substituting one hydrogen atom of the aromatic hydrocarbon ring or aromatic hetero ring with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aromatic hydrocarbon ring or the aromatic hetero ring preferably has 1 to 4 carbon atoms, more preferably has 1 or 2 carbon atoms, and particularly preferably has one carbon atom.

The cyclic hydrocarbon group in $Ra^{t3}$ may have a substituent. Examples of the substituent include, $-R^{P1}$, $-R^{P2}-O-R^{P1}$, $-R^{P2}-CO-R^{P1}$, $-R^{P2}-CO-OR^{P1}$, $-R^{P2}-O-CO-R^{P1}$, $-R^{P2}-OH$, $-R^{P2}-CN$, and $-R^{P2}-COOH$ (hereinafter, these substituents are also collectively referred to as "$Ra^{x5}$").

Here, $R^{P1}$ is a monovalent chain-like saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. In addition, $R^{P2}$ is a single bond, a divalent chain-like saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms. It should be noted that some or all of the hydrogen atoms included in the chain-like saturated hydrocarbon group, the aliphatic cyclic saturated hydrocarbon group, and the aromatic hydrocarbon group of $R^{P1}$ and $R^{P2}$ may be substituted with fluorine atoms. The aliphatic cyclic hydrocarbon group may have one or more of the substituents in one kind or may have one or more of the substituents in a plurality of kinds.

Examples of the monovalent chain-like saturated hydrocarbon group having 1 to carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, and cyclododecyl group; and a polycyclic aliphatic saturated hydrocarbon group such as a bicyclo[2.2.2]octanyl group, a tricyclo[5.2.1.02,6]decanyl group, a tricyclo[3.3.1.13,7]decanyl group, a tetracyclo[6.2.1.13, 6.02,7]dodecanyl group, and an adamantyl group.

Examples of the monovalent aromatic hydrocarbon group having 6 to 30 carbon atoms include a group obtained by removing one hydrogen atom from an aromatic hydrocarbon ring such as benzene, biphenyl, fluorene, naphthalene, anthracene, and phenanthrene.

In a case where $Ra^{t3}$ is bonded to any of $Ra^{t1}$ and $Ra^{t2}$ to form a ring, the cyclic group is preferably a 4- to 7-membered ring, and more preferably a 4- to 6-membered ring. Specific examples of the cyclic group include a tetrahydropyranyl group and a tetrahydrofuranyl group.

Tertiary Alkyl Ester-Type Acid-Dissociable Group:

Examples of the acid-dissociable group that protects the carboxyl group among the polar groups include an acid-dissociable group represented by General Formula (a1-r-2).

Furthermore, among the acid-dissociable groups represented by Formula (a1-r-2), those that are constituted with alkyl groups may be hereinafter referred to as "tertiary alkyl ester-type acid-dissociable groups" for convenience.

(a1-r-2)

[In the formula, $Ra'^4$ to $Ra'^6$ are each a hydrocarbon group, and $Ra'^5$ and $Ra'^6$ may be bonded to each other to form a ring.]

Examples of the hydrocarbon group of $Ra'^4$ include a linear or branched alkyl group, a chain-like or cyclic alkenyl group, and a cyclic hydrocarbon group.

Examples of the linear or branched alkyl group and the cyclic hydrocarbon group (an aliphatic hydrocarbon group which is a monocyclic group, an aliphatic hydrocarbon group which is a polycyclic group, or an aromatic hydrocarbon group) in $Ra'^4$ include the same as those of $Ra^{t3}$.

The chain-like or cyclic alkenyl group in $Ra'^4$ is preferably an alkenyl group having 2 to 10 carbon atoms.

Examples of the hydrocarbon group of $Ra'^5$ or $Ra'^6$ include the same as those of $Ra^{t3}$.

In a case where $Ra'^5$ to $Ra'^6$ are bonded to each other to form a ring, suitable examples thereof include a group represented by General Formula (a1-r2-1), a group represented by General Formula (a1-r2-2), and a group represented by General Formula (a1-r2-3).

On the other hand, in a case where $Ra'^4$ to $Ra'^6$ are not bonded to each other and are each an independent hydrocarbon group, suitable examples thereof include a group represented by General Formula (a1-r2-4).

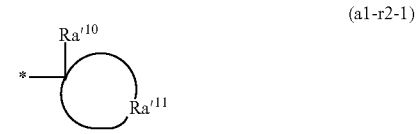

(a1-r2-1)

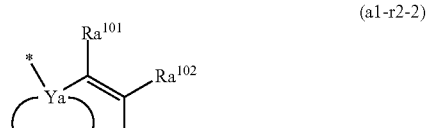

(a1-r2-2)

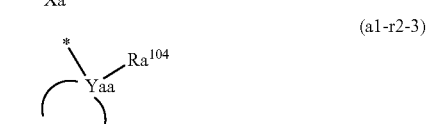

(a1-r2-3)

(a1-r2-4)

[In Formula (a1-r2-1), $Ra'^{10}$ represents a linear or branched alkyl group having 1 to 12 carbon atoms, which may be partially substituted with a halogen atom or a heteroatom-containing group. $Ra'^{11}$ represents a group that forms an aliphatic cyclic group together with a carbon atom to which $Ra'^{10}$ is bonded. In Formula (a1-r2-2), Ya is a carbon atom. Xa is a group that forms a cyclic hydrocarbon group together with Ya. Some or all of the hydrogen atoms contained in the cyclic hydrocarbon group may be substituted. $Ra^{101}$ to $Ra^{103}$ are each independently a hydrogen atom, a monovalent chain-like saturated hydrocarbon group having 1 to 10 carbon atoms, or a monovalent aliphatic cyclic saturated hydrocarbon group having 3 to 20 carbon atoms. Some or all of the hydrogen atoms contained in the chain-like saturated hydrocarbon group and the aliphatic cyclic saturated hydrocarbon group may be substituted. Two or more of $Ra^{101}$ to $Ra^{103}$ may be bonded to each other to form a cyclic structure. In Formula (a1-r2-3), Yaa is a carbon atom. Xaa is a group that forms an aliphatic cyclic group together with Yaa. $Ra^{104}$ is an aromatic hydrocarbon group which may have a substituent. In Formula (a1-r2-4), $Ra'^{12}$ and $Ra'^{13}$ are each independently a monovalent chain-like saturated hydrocarbon group having 1 to 10 carbon atoms or a hydrogen atom. Some or all of the hydrogen atoms contained in the chain-like saturated hydrocarbon group may be substituted. $Ra'^{14}$ is a hydrocarbon group which may have a substituent. * represents a bond.]

In Formulae (a1-r2-1), $Ra'^{10}$ is a linear or branched alkyl group having 1 to 12 carbon atoms, which may be partially substituted with a halogen atom or a heteroatom-containing group.

In $Ra'^{10}$, the linear alkyl group has 1 to 12 carbon atoms, preferably has 1 to 10 carbon atoms, and particularly preferably has 1 to 5 carbon atoms.

Examples of the branched alkyl group in $Ra'^{10}$ include the same as those for $Ra'^3$.

The alkyl group in $Ra'^{10}$ may be partially substituted with a halogen atom or a heteroatom-containing group. For example, some of the hydrogen atoms constituting the alkyl group may be substituted with a halogen atom or a heteroatom-containing group. Further, some of carbon atoms (a methylene group and the like) constituting the alkyl group may be substituted with a heteroatom-containing group.

Examples of the heteroatom as mentioned herein include an oxygen atom, a sulfur atom, and a nitrogen atom. Examples of the heteroatom-containing group include (—O—), —C(=O)—O—, —O—C(=O)—, —C(=O)—, —O—C(=O)—O—, —C(=O)—NH—, —NH—, —S—, —S(=O)$_2$—, and —S(=O)$_2$—O—.

In Formula (a1-r2-1), $Ra'^{11}$ (an aliphatic cyclic group that is formed together with the carbon atom to which $Ra'^{10}$ is bonded) is preferably the group mentioned as the aliphatic hydrocarbon group (alicyclic hydrocarbon group) which is a monocyclic group or a polycyclic group of $Ra'^3$ in Formula (a1-r-1). Among these, the monocyclic alicyclic hydrocarbon group is preferable, specifically, a cyclopentyl group and a cyclohexyl group are more preferable, and the cyclopentyl group is still more preferable.

In Formula (a1-r2-2), examples of the cyclic hydrocarbon group formed by Xa together with Ya include a group obtained by further removing one or more hydrogen atoms from a cyclic monovalent hydrocarbon group (aliphatic hydrocarbon group) in $Ra'^3$ in Formula (a1-r-1).

The cyclic hydrocarbon group which is formed by Xa together with Ya may have a substituent. Examples of these substituents include the same as those of the substituent which may be contained in the cyclic hydrocarbon group in $Ra'^3$.

In Formula (a1-r2-2), examples of the monovalent chain-like saturated hydrocarbon group having 1 to 10 carbon atoms in $Ra^{101}$ to $Ra^{103}$ include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms in $Ra^{101}$ to $Ra^{103}$ include: monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group, and cyclododecyl group; and polycyclic aliphatic saturated hydrocarbon groups such as a bicyclo[2.2.2]octanyl group, a tricyclo [5.2.1.02,6]decanyl group, a tricyclo[3.3.1.13,7]decanyl group, a tetracyclo[6.2.1.13,6.02,7]dodecanyl group, and an adamantyl group.

Among those, $Ra^{101}$ to $Ra^{103}$ are preferably a hydrogen atom or a monovalent chain-like saturated hydrocarbon group having 1 to 10 carbon atoms, and among these, from the viewpoint of ease of synthesis, the hydrogen atom, the methyl group, or the ethyl group is more preferable, and the hydrogen atom is particularly preferable.

Examples of the substituent which the chain-like saturated hydrocarbon group represented by $Ra^{101}$ to $Ra^{103}$ or the aliphatic cyclic saturated hydrocarbon group has include the same groups as those of $Ra^{x5}$.

Examples of the group including a carbon-carbon double bond generated by forming a cyclic structure, in which two or more of $Ra^{101}$ to $Ra^{103}$ are bonded to each other, include a cyclopentenyl group, a cyclohexenyl group, a methylcyclopentenyl group, a methylcyclohexenyl group, a cyclopentylideneethenyl group, and a cyclohexylideneethenyl group. Among these, from the viewpoint of ease of synthesis, the cyclopentenyl group, the cyclohexenyl group, or the cyclopentylideneethenyl group is preferable.

In Formula (a1-r2-3), an aliphatic cyclic group that is formed by Xaa together with Yaa is preferably the group mentioned as the aliphatic hydrocarbon group which is a monocyclic group or a polycyclic group of $Ra'^3$ in Formula (a1-r-1).

In Formula (a1-r2-3), examples of the aromatic hydrocarbon group in $Ra^{104}$ include a group obtained by removing one or more hydrogen atoms from an aromatic hydrocarbon ring having 5 to 30 carbon atoms. Among these, $Ra^{104}$ is preferably a group obtained by removing one or more hydrogen atoms from an aromatic hydrocarbon ring having 6 to 15 carbon atoms, more preferably a group obtained by removing one or more hydrogen atoms from benzene, naphthalene, anthracene, or phenanthrene, still more preferably a group obtained by removing one or more hydrogen atoms from benzene, naphthalene, or anthracene, particularly preferably a group obtained by removing one or more hydrogen atoms from benzene or naphthalene, and most preferably a group obtained by removing one or more hydrogen atoms from benzene.

Examples of the substituent which may be contained in $Ra^{104}$ in Formula (a1-r2-3) include a methyl group, an ethyl group, propyl group, a hydroxyl group, a carboxyl group, a halogen atom, an alkoxy group (a methoxy group, an ethoxy group, a propoxy group, a butoxy group, and the like), and an alkyloxycarbonyl group.

In Formula (a1-r2-4), $Ra'^{12}$ and $Ra'^{13}$ are each independently a monovalent chain-like saturated hydrocarbon group having 1 to 10 carbon atoms or a hydrogen atom. Examples of the monovalent chain-like saturated hydrocarbon group having 1 to 10 carbon atoms in $Ra'^{12}$ and $Ra'^{13}$ include the same as those of the monovalent chain-like saturated hydrocarbon group having 1 to 10 carbon atoms in $Ra^{101}$ to $Ra^{103}$. Some or all of the hydrogen atoms contained in the chain-like saturated hydrocarbon group may be substituted.

Among those, $Ra'^{12}$ and $Ra'^{13}$ are each preferably a hydrogen atom or an alkyl group having 1 to 5 carbon atoms, more preferably the alkyl group having 1 to 5 carbon atoms, still more preferably a methyl group or an ethyl group, and particularly preferably the methyl group.

In a case where the chain-like saturated hydrocarbon group represented by Ra'$^{12}$ and Ra'$^{13}$ is substituted, examples of the substituent include the same groups as those of Ra$^{x5}$.

In Formula (a1-r2-4), Ra'$^{14}$ is a hydrocarbon group which may have a substituent. Examples of the hydrocarbon group in Ra'$^{14}$ include a linear or branched alkyl group and a cyclic hydrocarbon group.

The linear alkyl group in Ra'$^{14}$ preferably has 1 to 5 carbon atoms, more preferably has 1 to 4 carbon atoms, and still more preferably has 1 or 2 carbon atoms. Specific examples thereof include a methyl group, an ethyl group, an n-propyl group, an n-butyl group, and an n-pentyl group. Among these, the methyl group, the ethyl group, or the n-butyl group is preferable, and the methyl group or the ethyl group is more preferable.

The branched alkyl group in Ra'$^{14}$ preferably has 3 to 10 carbon atoms, and more preferably has 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group, and the isopropyl group is preferable.

In a case where Ra'$^{14}$ is a cyclic hydrocarbon group, the cyclic hydrocarbon group may be an aliphatic hydrocarbon group or an aromatic hydrocarbon group, and may be a polycyclic group or a monocyclic group.

As the aliphatic hydrocarbon group which is a monocyclic group, a group obtained by removing one hydrogen atom from a monocycloalkane is preferable. The monocycloalkane preferably has 3 to 6 carbon atoms, and specific examples thereof include cyclopentane and cyclohexane.

As the aliphatic hydrocarbon group which is a polycyclic group, a group obtained by removing one hydrogen atom from a polycycloalkane is preferable; and as the polycycloalkane, a group having 7 to 12 carbon atoms is preferable, and specific examples of the polycycloalkane include adamantane, norbornane, isobornane, tricyclodecane, and tetracyclododecane.

Examples of the aromatic hydrocarbon group in Ra'$^{14}$ include the same as those of the aromatic hydrocarbon group in Ra$^{104}$. Among those, Ra'$^{14}$ is preferably a group obtained by removing one or more hydrogen atoms from an aromatic hydrocarbon ring having 6 to 15 carbon atoms, more preferably a group obtained by removing one or more hydrogen atoms from benzene, naphthalene, anthracene, or phenanthrene, still more preferably a group obtained by removing one or more hydrogen atoms from benzene, naphthalene, or anthracene, particularly preferably a group obtained by removing one or more hydrogen atoms from naphthalene or anthracene, and most preferably a group obtained by removing one or more hydrogen atoms from naphthalene.

Examples of the substituent which may be contained in Ra'$^{14}$ include the same as those of the substituent which may be contained in Ra$^{104}$.

In a case where Ra'$^{14}$ in Formula (a1-r2-4) is a naphthyl group, the position at which the tertiary carbon atom in Formula (a1-r2-4) is bonded is any of the 1-position or the 2-position of the naphthyl group.

In a case where Ra'$^{14}$ in Formula (a1-r2-4) is an anthryl group, the position at which the tertiary carbon atom in Formula (a1-r2-4) is bonded is any of the 1-position, the 2-position, and 9-position of the anthryl group.

Specific examples of the group represented by Formula (a1-r2-1) are shown below.

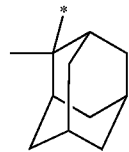 (r-pr-m1)

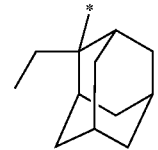 (r-pr-m2)

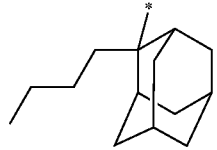 (r-pr-m3)

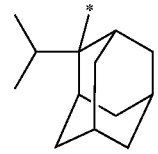 (r-pr-m4)

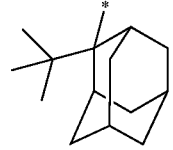 (r-pr-m5)

 (r-pr-m6)

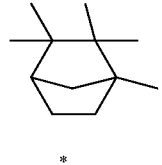 (r-pr-m7)

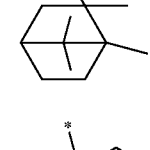 (r-pr-m8)

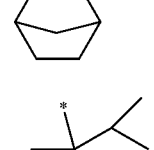 (r-pr-m9)

 (r-pr-m10)

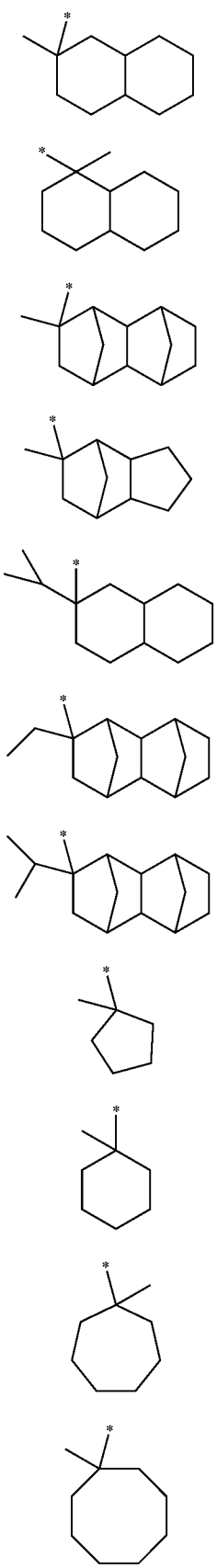
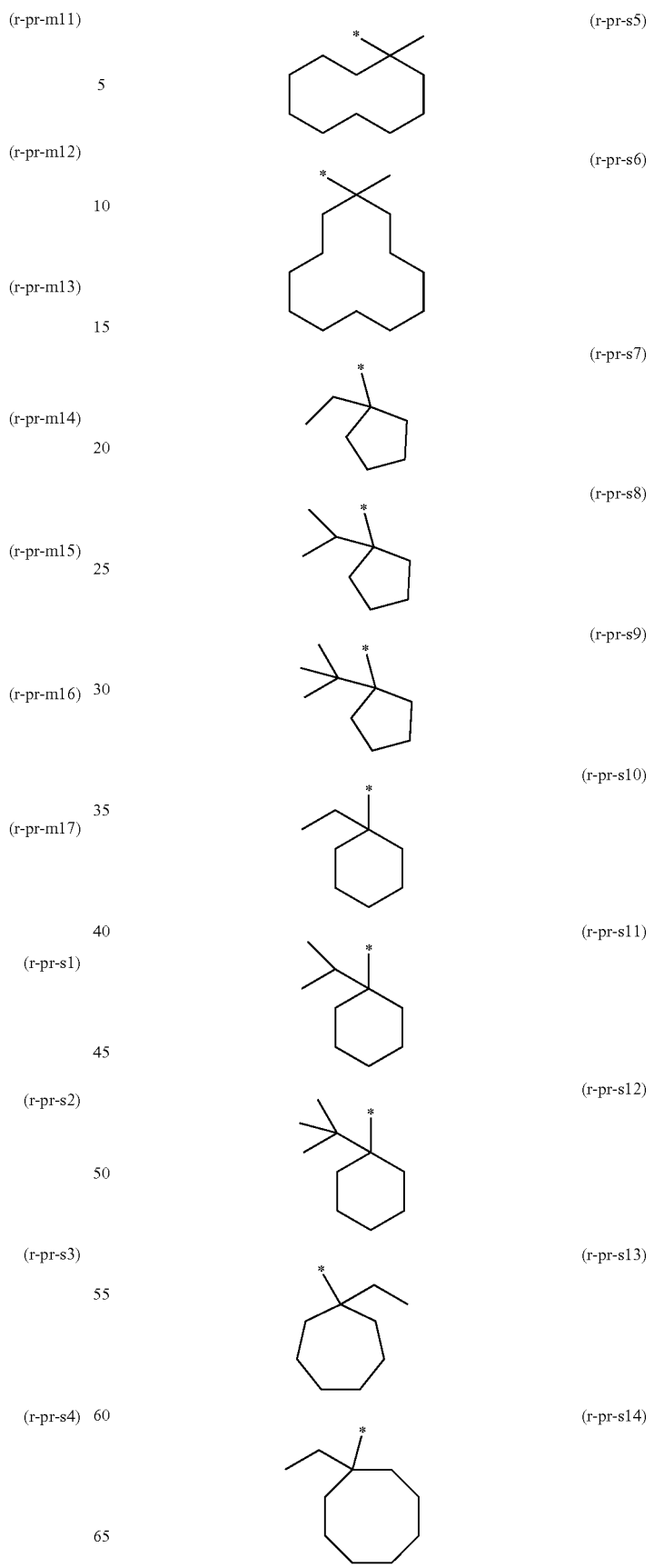

(r-pr-s15) 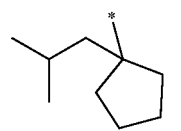
(r-pr-s16) 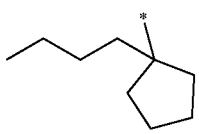
(r-pr-s17) 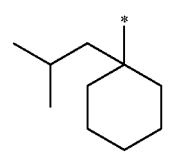
(r-pr-s18) 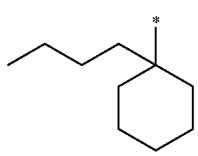
(r-pr-s19) 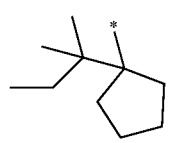
(r-pr-s20) 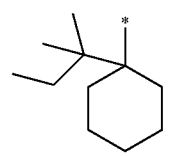
(r-pr-sp1) 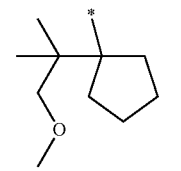
(r-pr-sp2) 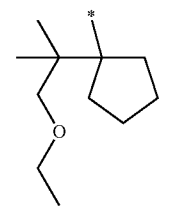
(r-pr-sp3) 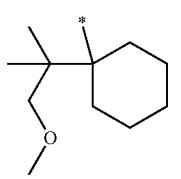
(r-pr-sp4) 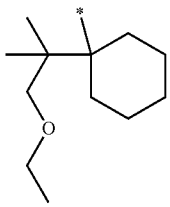
(r-pr-mp1) 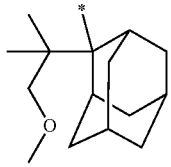
(r-pr-mp2) 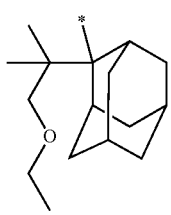
Specific examples of the group represented by Formula (a1-r2-2) are shown below.
(r-pr-sv1) 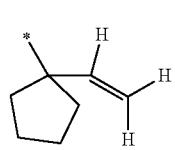
(r-pr-sv2) 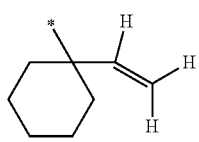
(r-pr-sv3) 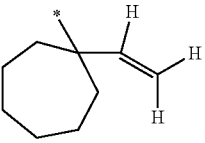
(r-pr-sv4) 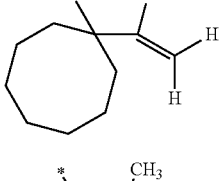
(r-pr-sv5) 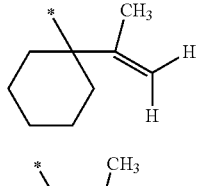
(r-pr-sv6) 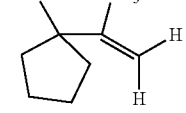

-continued
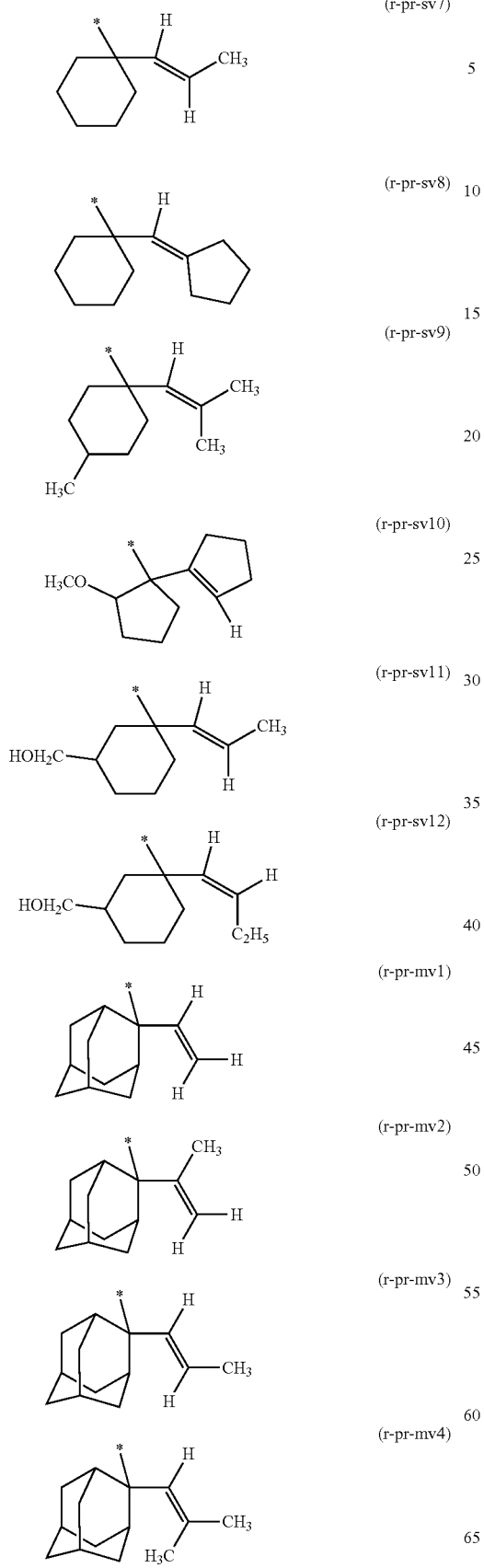
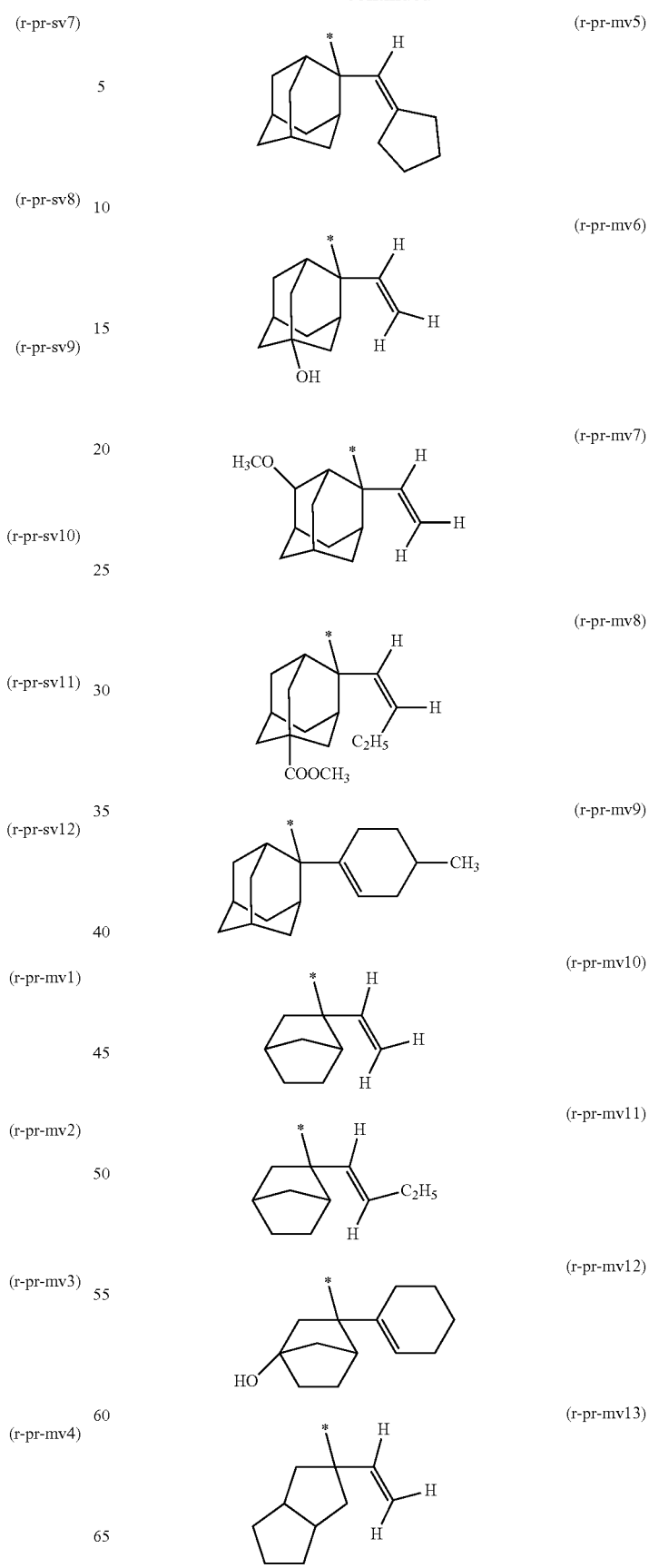

-continued
(r-pr-mv14)
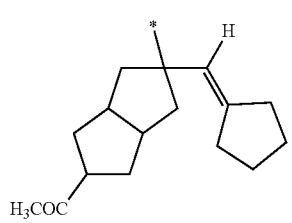
(r-pr-mv15)
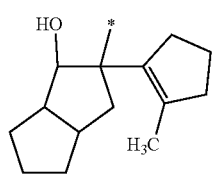
(r-pr-mv16)
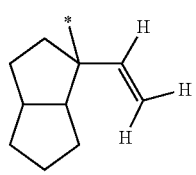
(r-pr-mv17)
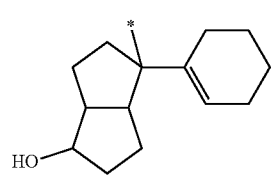
(r-pr-mv18)
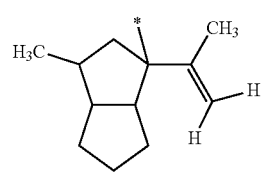
(r-pr-mv19)
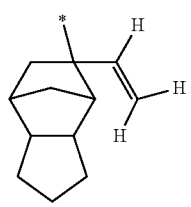
(r-pr-mv20)
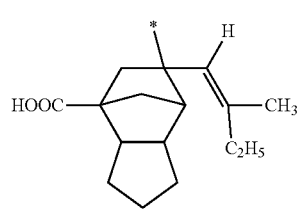
(r-pr-mv21)
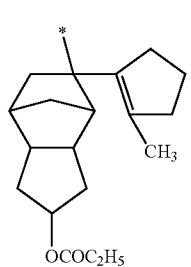
Specific examples of the group represented by Formula (a1-r2-3) are shown below.
(r-pr-sa1)
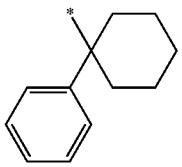
(r-pr-sa2)
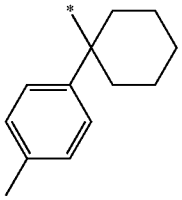
(r-pr-sa3)
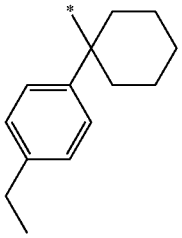
(r-pr-sa4)
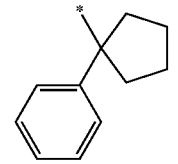
(r-pr-sa5)
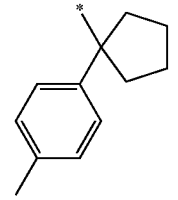
(r-pr-sa6)
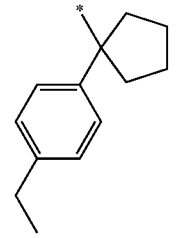
(r-pr-sa7)
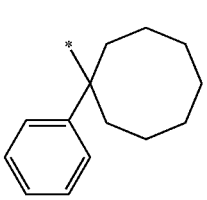

(r-pr-sa8)
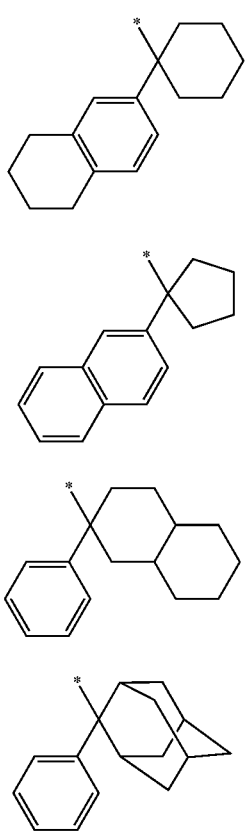
(r-pr-sa9)
(r-pr-ma1)
(r-pr-ma2)
Specific examples of the group represented by Formula (a1-r2-4) are shown below.
(r-pr-cm1)
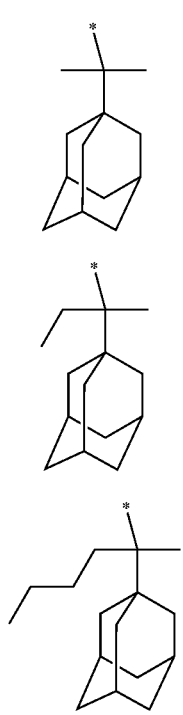
(r-pr-cm2)
(r-pr-cm3)
(r-pr-cm4)
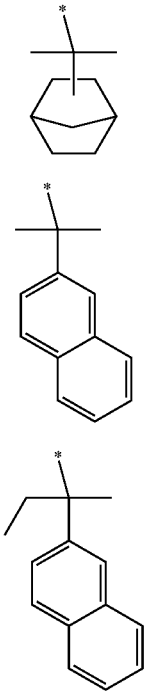
(r-pr-cm5)
(r-pr-cm6)
(r-pr-cm7)
(r-pr-cm8)
(r-pr-cs1)
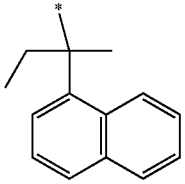
(r-pr-cs2)
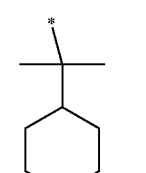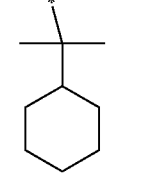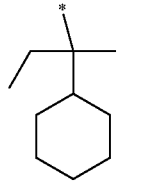
(r-pr-cs3)
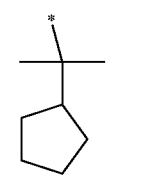

-continued

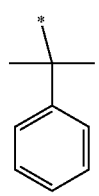
(r-pr-cs4)

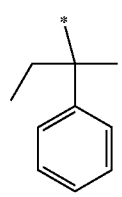
(r-pr-cs5)

(r-pr-c1)

(r-pr-c2)

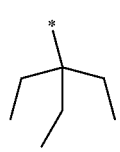
(r-pr-c3)

Tertiary Alkyloxycarbonyl Acid-Dissociable Group:

Examples of the acid-dissociable group that protects a hydroxyl group as a polar group include an acid-dissociable group (hereinafter also referred to as a "tertiary alkyloxycarbonyl-type acid-dissociable group" for convenience) represented by General Formula (a1-r-3).

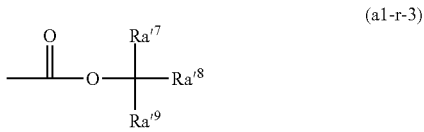
(a1-r-3)

[In the formula, $Ra'^7$ to $Ra'^9$ are each an alkyl group.]

In Formula (a1-r-3), $Ra'^7$ to $Ra'^9$ are each preferably an alkyl group having 1 to 5 carbon atoms, and more preferably an alkyl group having 1 to 3 carbon atoms.

Furthermore, the total number of carbon atoms in the respective alkyl groups is preferably 3 to 7, more preferably 3 to 5, and most preferably 3 or 4.

Examples of the constitutional unit (a1) include a constitutional unit derived from an acrylic acid ester in which the hydrogen atom bonded to the carbon atom at the α-position may be substituted with a substituent; a constitutional unit derived from an acrylamide; a constitutional unit in which at least some of the hydrogen atoms in a hydroxyl group of a constitutional unit derived from hydroxystyrene or a hydroxystyrene derivative are protected with a substituent including an acid-decomposable group; and a constitutional unit in which at least some of the hydrogen atoms in —C(=O)—OH of a constitutional unit derived from vinylbenzoic acid or a vinylbenzoic acid derivative are protected with a substituent including an acid-decomposable group.

Among those, the constitutional unit derived from an acrylic acid ester in which the hydrogen atom bonded to the carbon atom at the α-position may be substituted with a substituent is preferable as the constitutional unit (a1).

Specific preferred examples of such a constitutional unit (a1) include a constitutional unit represented by General Formula (a1-1) or (a1-2).

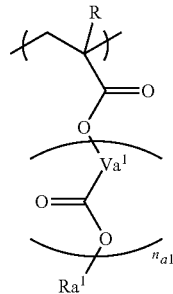
(a1-1)

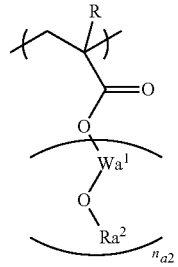
(a1-2)

[In the formula, R is a hydrogen atom, an alkyl group having 1 to 5 carbon atoms, or a halogenated alkyl group having 1 to 5 carbon atoms. $Va^1$ is a divalent hydrocarbon group which may have an ether bond. $n_{a1}$ is an integer of 0 to 2. $Ra^1$ is an acid-dissociable group represented by General Formula (a1-r-1) or (a1-r-2). $Wa^1$ is an ($n_{a2}$+1)-valent hydrocarbon group, $n_{a2}$ is an integer of 1 to 3, and $Ra^2$ is an acid-dissociable group represented by General Formula (a1-r-1) or (a1-r-3).]

R in Formula (a1-1) is the same as R in General Formula (a0-1). Examples of R in Formula (a1-1) include the same as those mentioned in R in General Formula (a0-1), and preferred examples thereof are also the same.

In Formula (a1-1), the divalent hydrocarbon group as $Va^1$ may be an aliphatic hydrocarbon group or an aromatic hydrocarbon group. Examples of the divalent hydrocarbon group in $Va^1$ include the same as those mentioned as the divalent hydrocarbon group which may have a substituent in $Va^{01}$ in General Formula (a0-1), and preferred examples thereof are also the same.

In Formula (a1-1), $Ra^1$ is an acid-dissociable group represented by Formula (a1-r-1) or (a1-r-2).

In Formula (a1-2), the ($n_{a2}$+1)-valent hydrocarbon group in $Wa^1$ may be an aliphatic hydrocarbon group or an aromatic hydrocarbon group. The aliphatic hydrocarbon group means a hydrocarbon group that has no aromaticity, and may be saturated or unsaturated.

In general, it is preferable that the aliphatic hydrocarbon group be saturated. Examples of the aliphatic hydrocarbon group include a linear or branched aliphatic hydrocarbon group, an aliphatic hydrocarbon group including a ring in a structure thereof, and a combination of the linear or branched aliphatic hydrocarbon group and the aliphatic hydrocarbon group including a ring in a structure thereof.

The valency of $n_{a2}+1$ is preferably divalency, trivalency or tetravalency, and the divalency or the trivalency is more preferable.

In Formula (a1-2), $Ra^2$ is an acid-dissociable group represented by General Formula (a1-r-1) or (a1-r-3).

Specific examples of the constitutional unit represented by Formula (a1-1) are shown below. In the formulae shown below, R" represents a hydrogen atom, a methyl group, or a trifluoromethyl group.

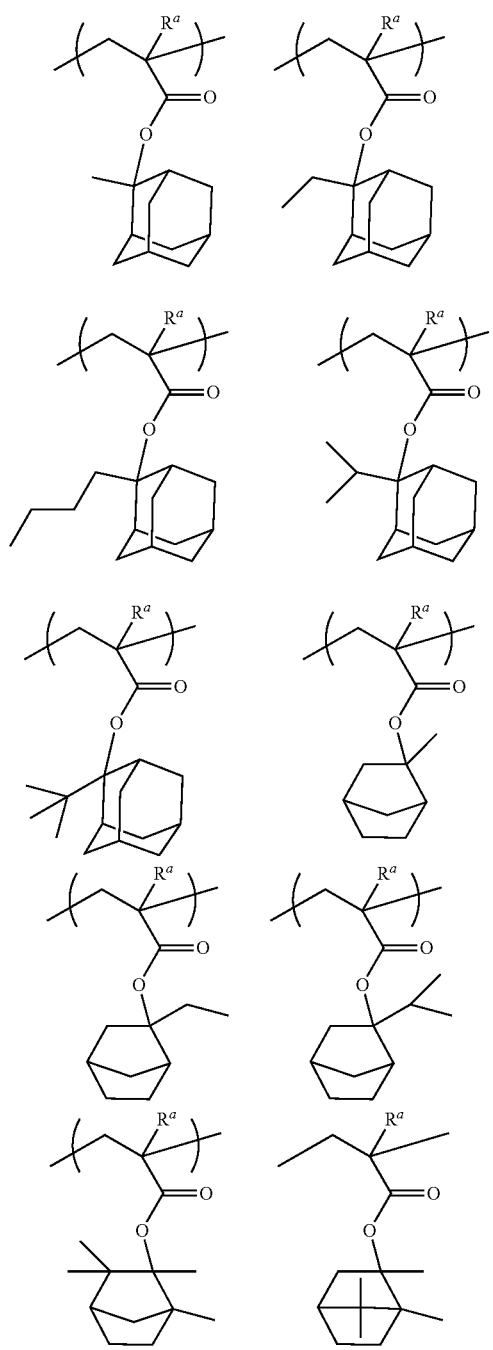

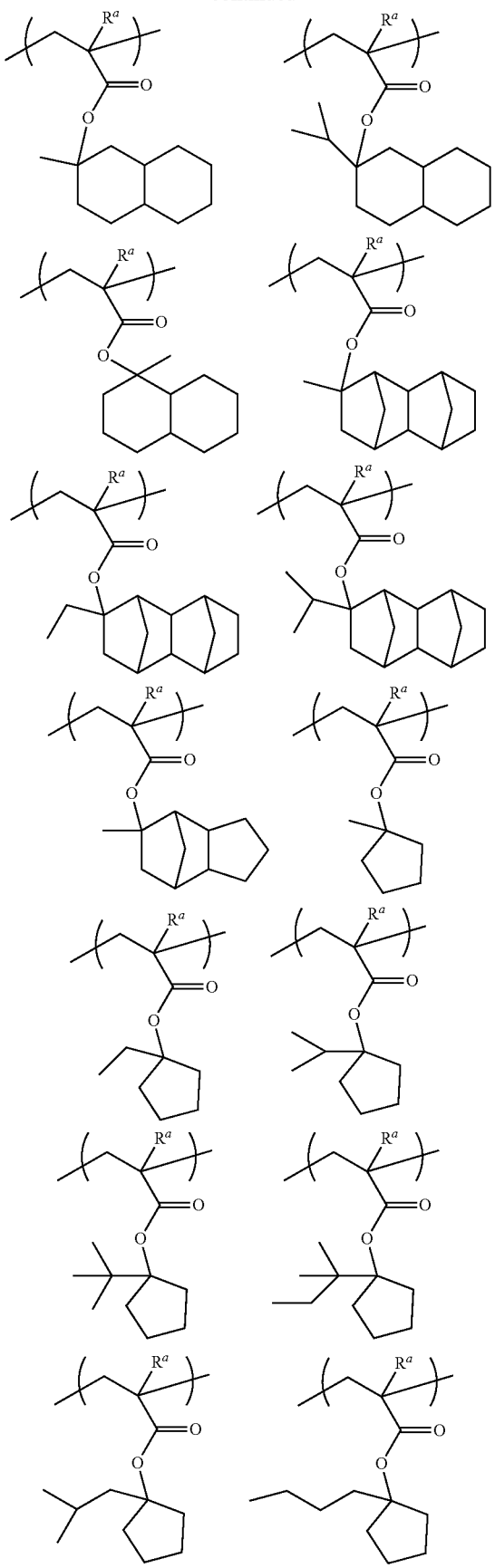

-continued
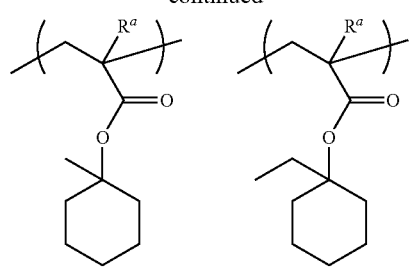
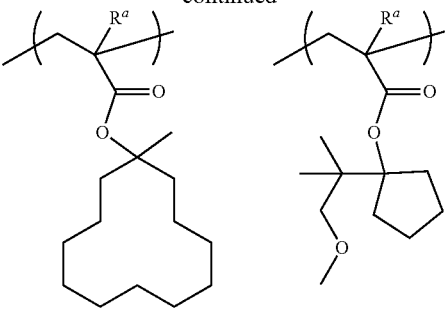
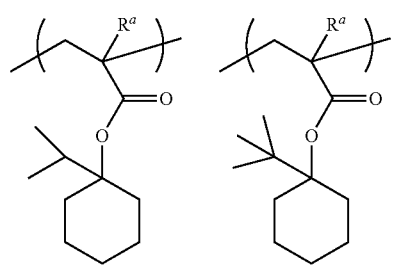
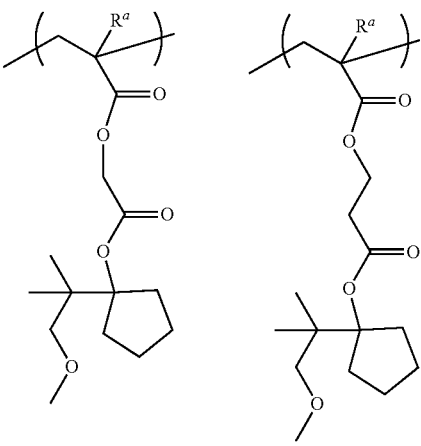
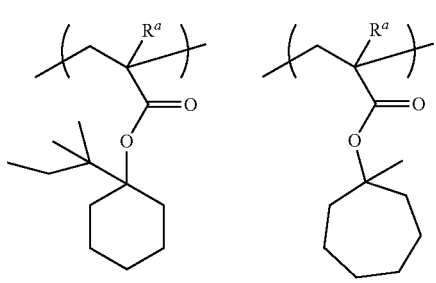
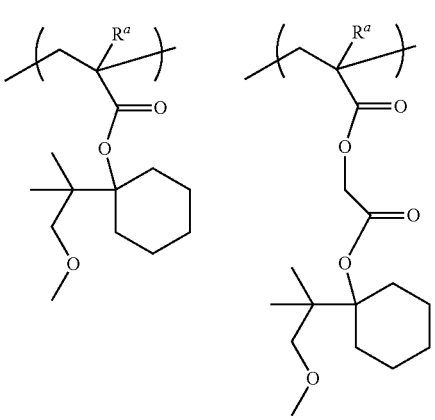
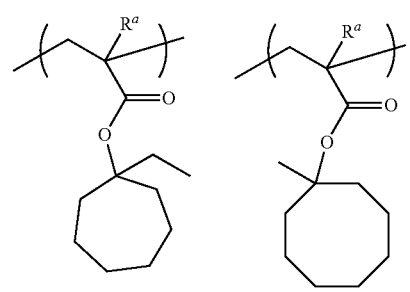
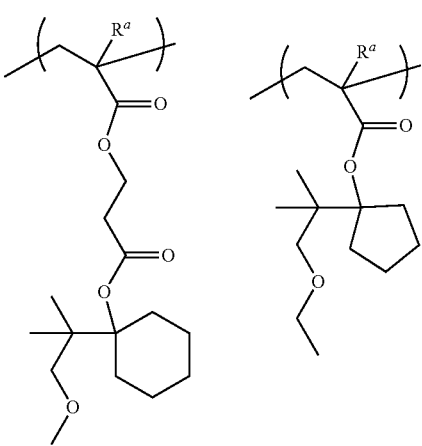
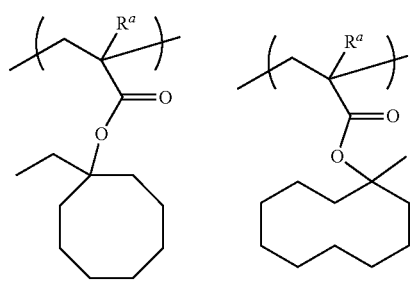

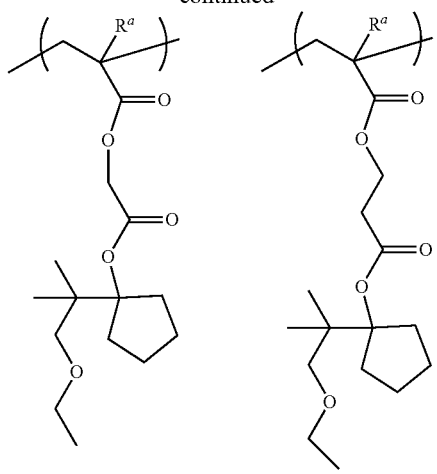
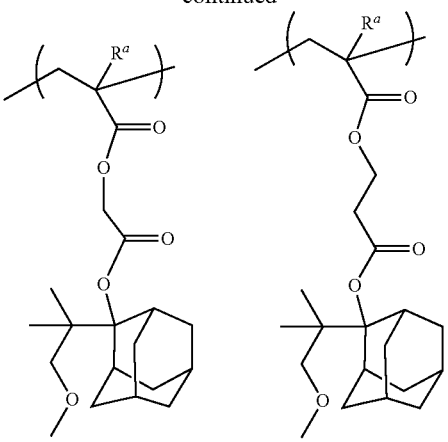
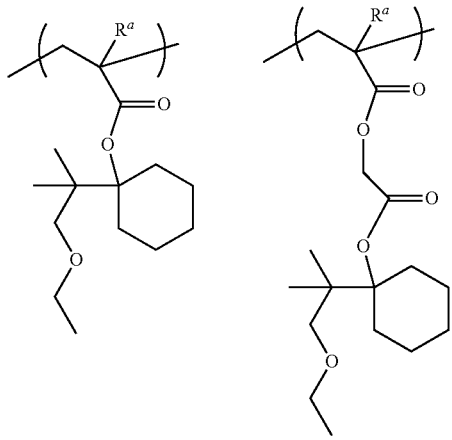
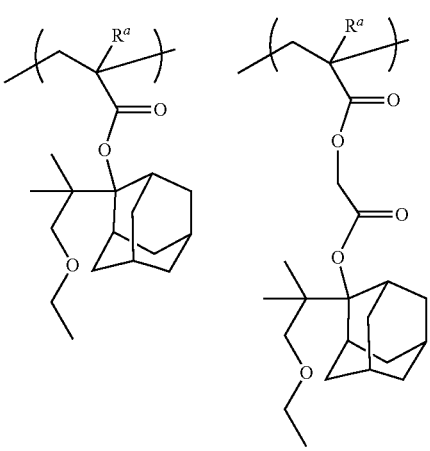
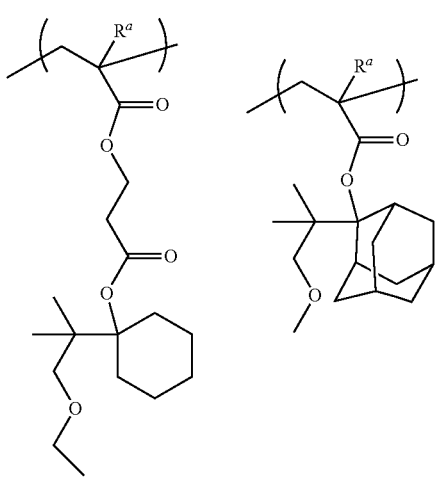
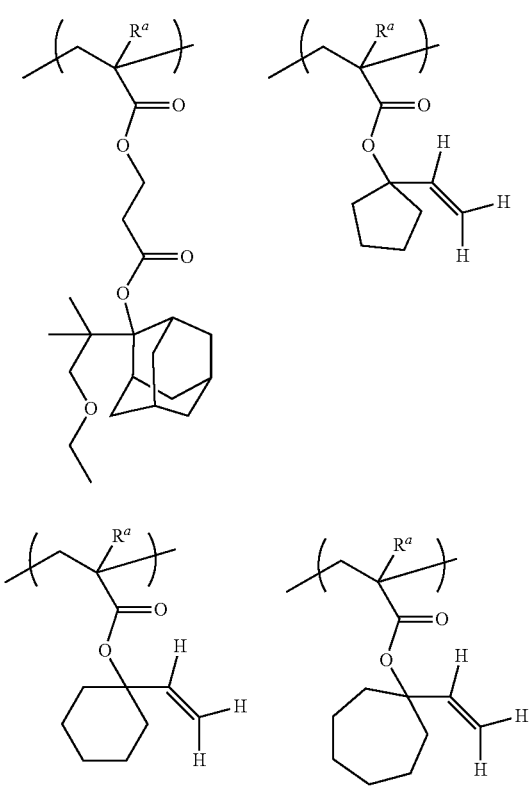

-continued
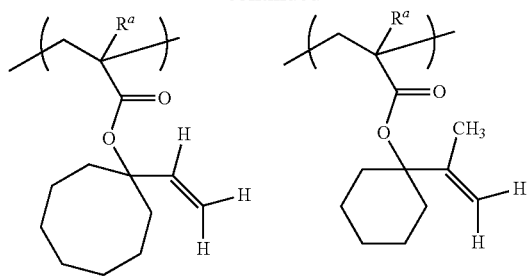
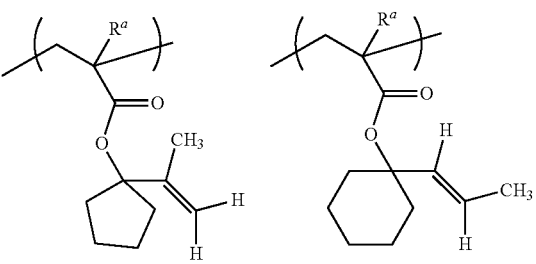
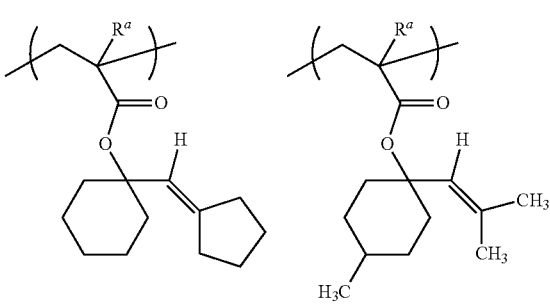
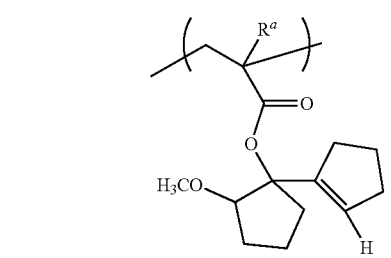
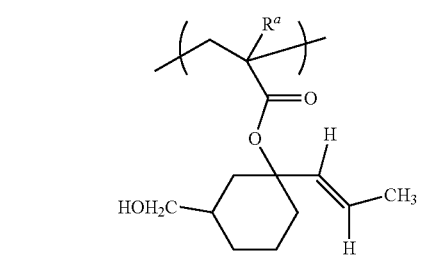
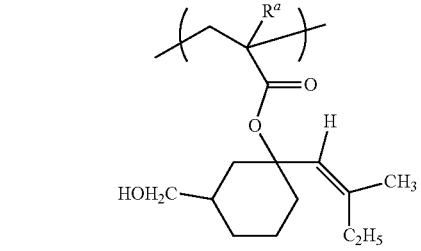
-continued
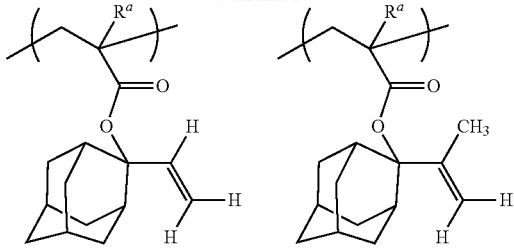
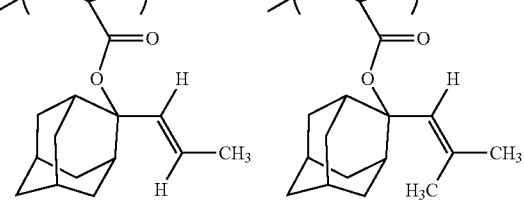
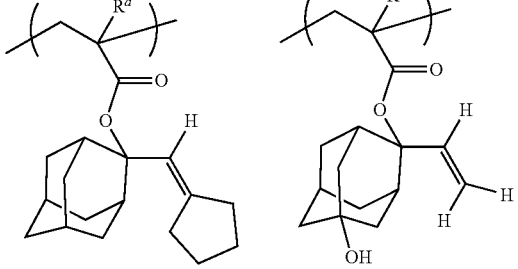
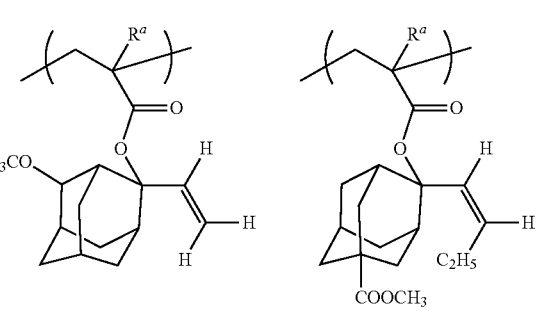
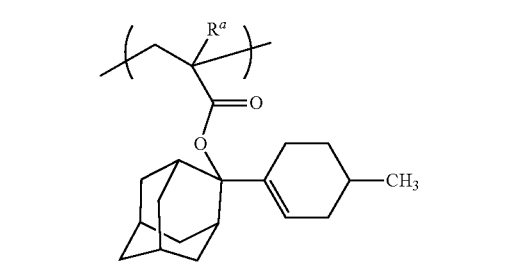
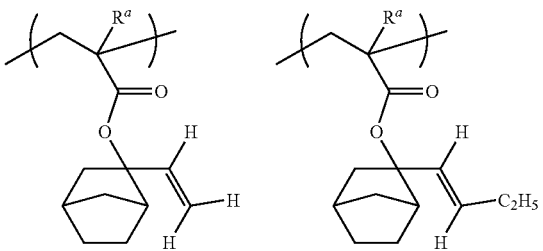

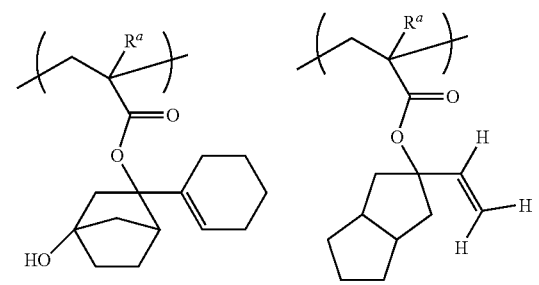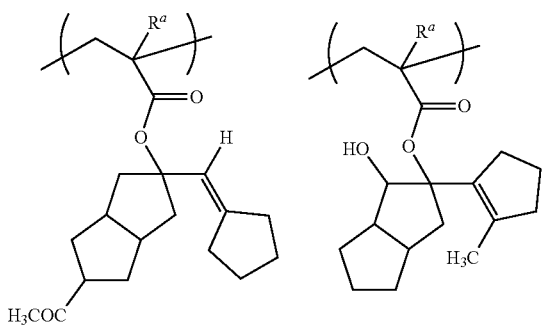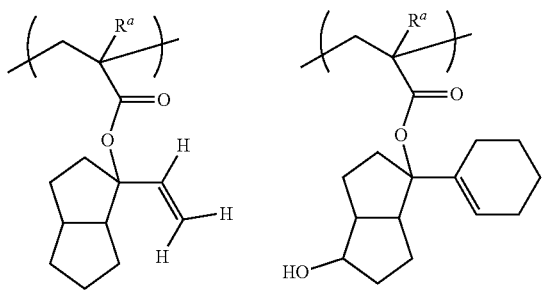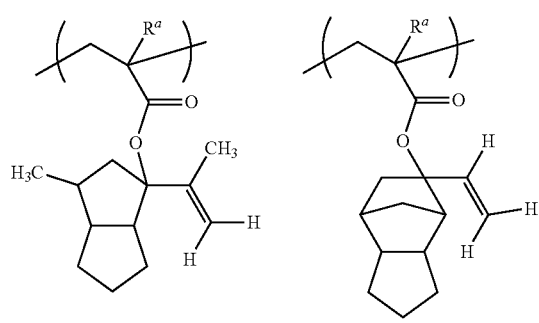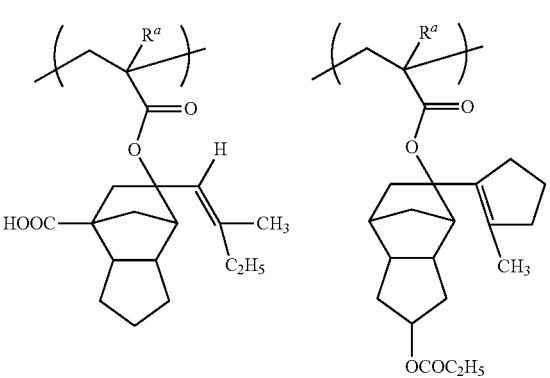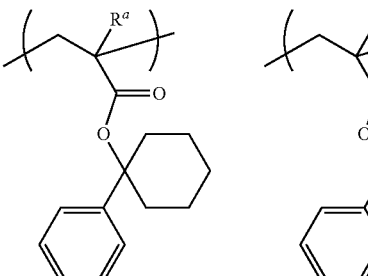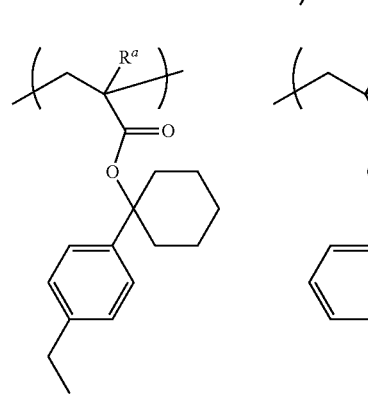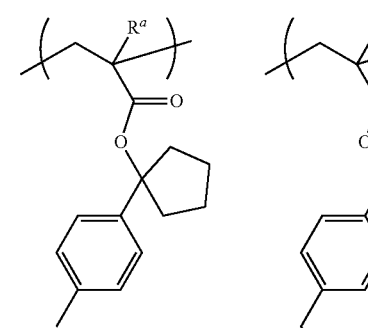

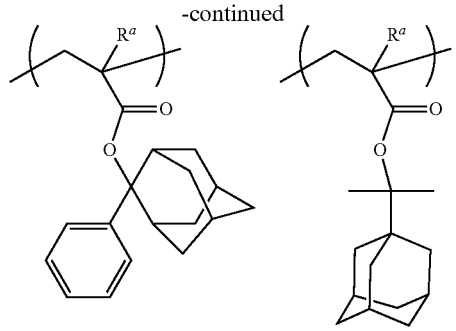
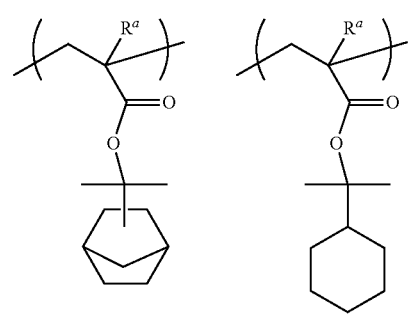
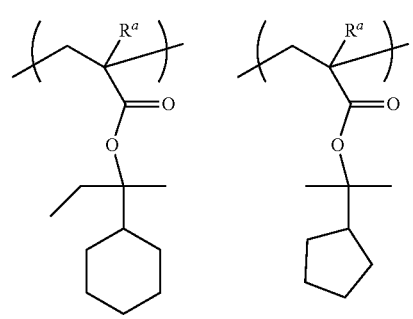
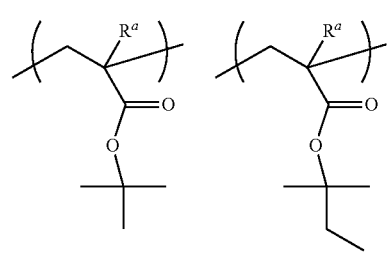
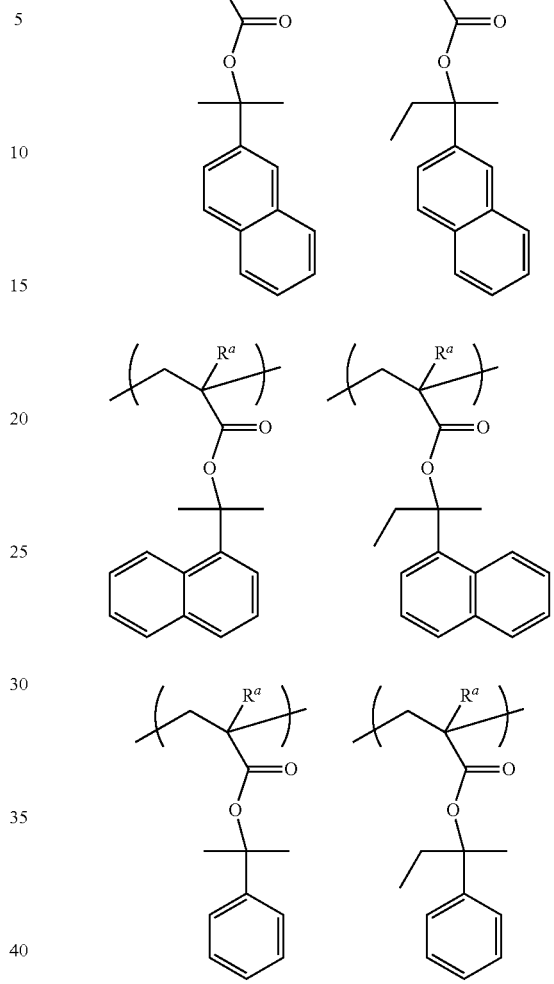
The constitutional unit (a1) contained in the component (A1) may be one kind or two or more kinds.
Among those, a constitutional unit represented by General Formula (a1-1-1) is preferable as the constitutional unit (a1).
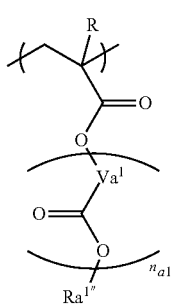
(a1-1-1)
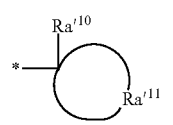
(a1-r2-1)

-continued

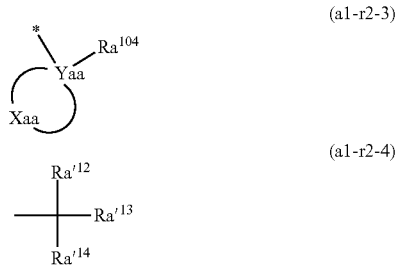
(a1-r2-3)

(a1-r2-4)

[In the formula, $Ra^{1\prime\prime\prime}$ is an acid-dissociable group represented by General Formula (a1-r2-1), (a1-r2-3), or (a1-r2-4).]

[In Formula (a1-1-1), R, $Va^1$, and $n_{a1}$ are the same as R, $Va^1$, and $n_{a1}$ in Formula (a1-1), respectively.

The description for the acid-dissociable group represented by General Formula (a1-r2-1), (a1-r2-3), or (a1-r2-4) is as mentioned above.

In Formula (a1-1-1), $Ra^{1\prime\prime\prime}$ is preferably an acid-dissociable group represented by General Formula (a1-r2-1).

The proportion of the constitutional unit (a1) in the component (A1) is preferably 5% to 80% by mole, more preferably 10% to 75% by mole, still more preferably 30% to 70% by mole, and particularly preferably 40% to 60% by mole, with respect to the total amount (100% by mole) of all the constitutional units constituting the component (A1).

By setting the proportion of the constitutional unit (a1) to be in the preferred range, the efficiency of the deprotection reaction and the solubility in the developing solution can be appropriately ensured, and thus, the effect of the present invention can be more easily obtained.

With Regard to Constitutional Unit (a10):

The constitutional unit (a10) is a constitutional unit represented by General Formula (a10-1).

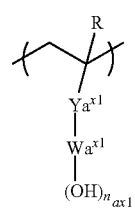
(a10-1)

[In the formula, R is a hydrogen atom, an alkyl group having 1 to 5 carbon atoms, or a halogenated alkyl group having 1 to 5 carbon atoms. $Ya^{x1}$ is a single bond or a divalent linking group. $Wa^{x1}$ is an aromatic hydrocarbon group which may have a substituent. $n_{ax1}$ is an integer of 1 or more.]

R in Formula (a10-1) is the same as R in General Formula (a0-1). Examples of R in Formula (a10-1) include the same as those mentioned as R in General Formula (a0-1), and preferred examples thereof are also the same.

In Formula (a10-1), $Ya^{x1}$ is a single bond or a divalent linking group. In the chemical formulae described above, the divalent linking group in $Ya^{x1}$ is not particularly limited, and suitable examples thereof include a divalent hydrocarbon group which may have a substituent and a divalent linking group including a heteroatom. Examples of the divalent linking group in $Ya^{x1}$ include the same as those mentioned as $Va^{01}$ in General Formula (a0-1).

Among those, as $Ya^{x1}$, the single bond, an ester bond [—C(=O)—O—, —O—C(=O)—], an ether bond (—O—), a linear or branched alkylene group, or a combination thereof is preferable, and the single bond or the ester bond [—C(=O)—O—, —O—C(=O)—] is more preferable.

In Formula (a10-1), $Wa^{x1}$ is an aromatic hydrocarbon group which may have a substituent.

Examples of the aromatic hydrocarbon group as $Wa^{x1}$ include a group obtained by removing ($n_{ax1}$+1) hydrogen atoms from an aromatic ring which may have a substituent. The aromatic ring is not particularly limited as long as it is a cyclic conjugated system having (4n+2) π electrons, and may be monocyclic or polycyclic. The aromatic ring preferably has 5 to 30 carbon atoms, more preferably has 5 to 20 carbon atoms, still more preferably has 6 to 15 carbon atoms, and particularly preferably has 6 to 12 carbon atoms. Specific examples of the aromatic ring include an aromatic hydrocarbon ring such as benzene, naphthalene, anthracene, and phenanthrene; and an aromatic hetero ring obtained by substituting some of the carbon atoms constituting the aromatic hydrocarbon ring with heteroatoms. Examples of the heteroatom in the aromatic hetero ring include an oxygen atom, a sulfur atom, and a nitrogen atom. Specific examples of the aromatic hetero ring include a pyridine ring and a thiophene ring.

Furthermore, examples of the aromatic hydrocarbon group as $Wa^{x1}$ also include a group obtained by removing ($n_{ax1}$+1) hydrogen atoms from an aromatic compound (for example, biphenyl and fluorene) including two or more aromatic rings which may have a substituent.

Among those, $Wa^{x1}$ is preferably a group obtained by removing ($n_{ax1}$+1) hydrogen atoms from benzene, naphthalene, anthracene, or biphenyl, more preferably a group obtained by removing ($n_{ax1}$+1) hydrogen atoms from benzene or naphthalene, and still more preferably a group obtained by removing ($n_{ax1}$+1) hydrogen atoms from benzene.

The aromatic hydrocarbon group in $Wa^{x1}$ may or may not have a substituent. Examples of the substituent include an alkyl group, an alkoxy group, a halogen atom, and a halogenated alkyl group. Examples of the alkyl group, the alkoxy group, the halogen atom, and the halogenated alkyl group as the substituent include the same as those mentioned as the substituent of the cyclic aliphatic hydrocarbon group as $Ya^{x1}$. The substituent is preferably a linear or branched alkyl group having 1 to 5 carbon atoms, more preferably a linear or branched alkyl group having 1 to 3 carbon atoms, still more preferably an ethyl group or a methyl group, and particularly preferably the methyl group. It is preferable that the aromatic hydrocarbon group in $Wa^{x1}$ not have a substituent.

In Formula (a10-1), $n_{ax1}$ is an integer of 1 or more, preferably an integer of 1 to 10, more preferably an integer of 1 to 5, still more preferably 1, 2, or 3, and particularly preferably 1 or 2.

Specific examples of the constitutional unit (a10) represented by Formula (a10-1) are shown below.

In each of the formulae shown below, R″ represents a hydrogen atom, a methyl group, or a trifluoromethyl group.

(a10-1-11) 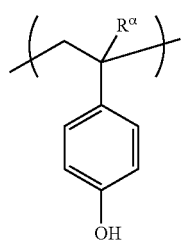
(a10-1-12) 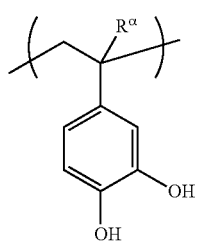
(a10-1-13) 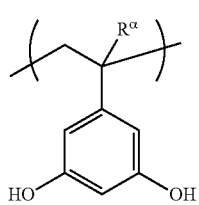
(a10-1-14) 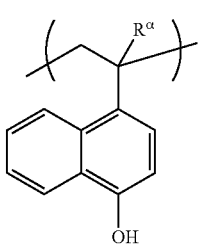
(a10-1-15) 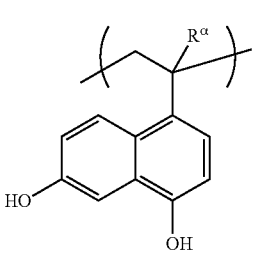
(a10-1-16) 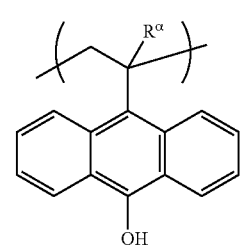
-continued
(a10-1-17) 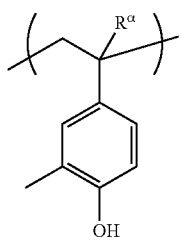
(a10-1-18) 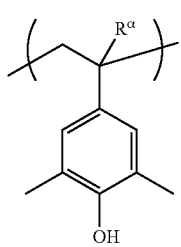
(a10-1-21) 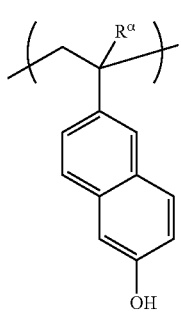
(a10-1-22) 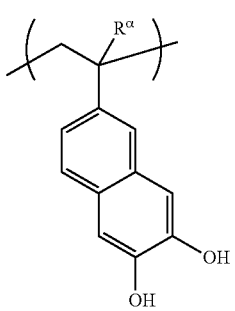
(a10-1-23) 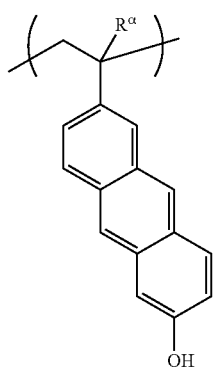

(a10-1-24)
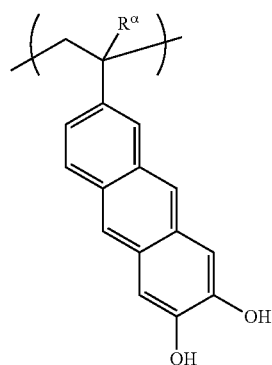
(a10-1-31)
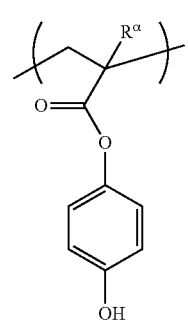
(a10-1-32)
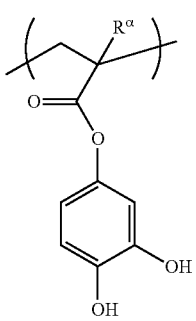
(a10-1-33)
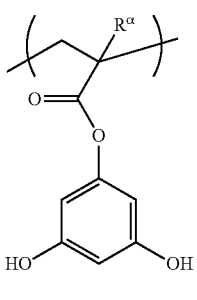
(a10-1-34)
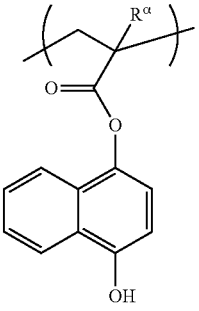
(a10-1-35)
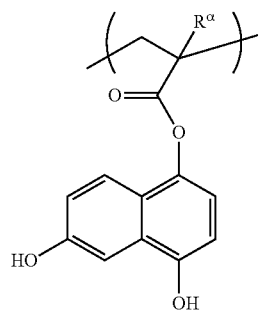
(a10-1-36)
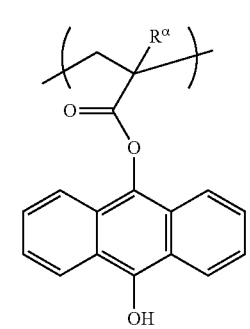
(a10-1-41)
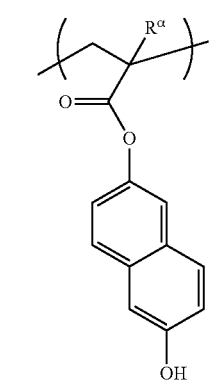
(a10-1-42)
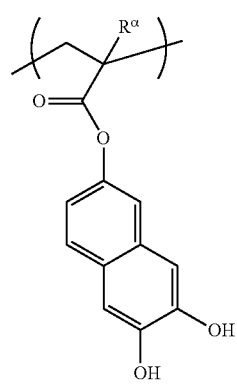

-continued

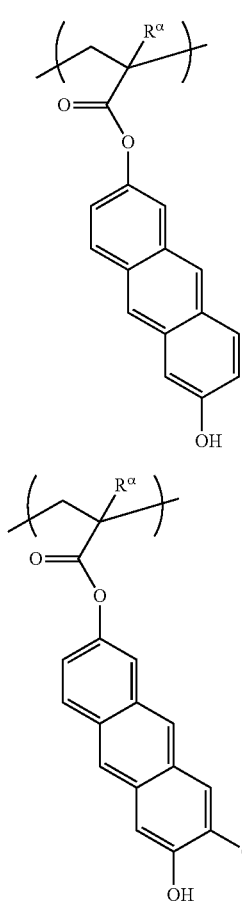

(a10-1-43)

(a10-1-44)

The constitutional unit (a10) contained in the component (A1) may be one kind or two or more kinds.

In a case where the component (A1) has the constitutional unit (a10), the proportion of the constitutional unit (a10) in the component (A1) is preferably 5% to 80% by mole, more preferably 10% to 75% by mole, still more preferably 30% to 70% by mole, and particularly preferably 40% to 60% by mole, with respect to the total amount (100% by mole) of all the constitutional units constituting the component (A1).

By setting the proportion of the constitutional unit (a10) to be in the preferred range, the efficiency in the supply of protons into a resist film increases and the solubility in a developing solution can be easily ensured.

With Regard to Constitutional Unit (a2):

The component (A1) may further have, as necessary, a constitutional unit (a2) (provided that a group having the constitutional unit (a0) is excluded) including a lactone-containing cyclic group, an —$SO_2$-containing cyclic group, or a carbonate-containing cyclic group.

In a case where the component (A1) is used for forming a resist film, the lactone-containing cyclic group, the —$SO_2$-containing cyclic group, or the carbonate-containing cyclic group in the constitutional unit (a2) is effective for improving the adhesiveness of the resist film to a substrate. In addition, by incorporation of the constitutional unit (a2), the lithography characteristics can be improved, for example, by the effects obtained by appropriately adjusting the acid diffusion length, increasing the adhesiveness of the resist film to the substrate, and appropriately adjusting the solubility during development.

The lactone-containing cyclic group for the constitutional unit (a2) is not particularly limited, and any constitutional unit can be used. Specific examples thereof include groups each represented by General Formulae (a2-r-1) to (a2-r-7).

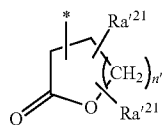
(a2-r-1)

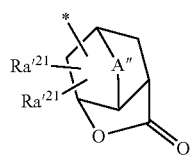
(a2-r-2)

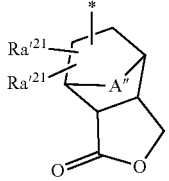
(a2-r-3)

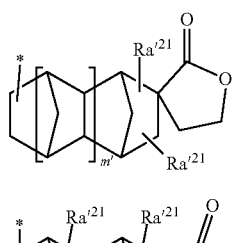
(a2-r-4)

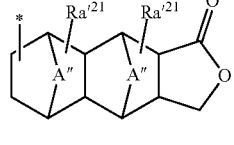
(a2-r-5)

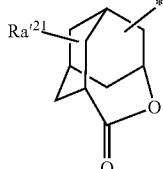
(a2-r-6)

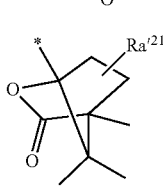
(a2-r-7)

[In the formulae, $Ra'^{21}$'s are each independently a hydrogen atom, an alkyl group, an alkoxy group, a halogen atom, a halogenated alkyl group, a hydroxyl group, —COOR", —OC(=O)R", a hydroxyalkyl group, or a cyano group; R" is a hydrogen atom, an alkyl group, a lactone-containing cyclic group, a carbonate-containing cyclic group, or an —$SO_2$-containing cyclic group; A" is an oxygen atom, a sulfur atom, or an alkylene group having 1 to 5 carbon atoms, which may contain an oxygen atom (—O—) or a sulfur atom (—S—); and n' is an integer of 0 to 2, and m' is 0 or 1.]

In General Formulae (a2-r-1) to (a2-r-7), the alkyl group in $Ra'^{21}$ is preferably an alkyl group having 1 to 6 carbon atoms. The alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or ethyl group is preferable, and a methyl group is particularly preferable.

The alkoxy group in Ra'$^{21}$ is preferably an alkoxy group having 1 to 6 carbon atoms. The alkoxy group is preferably a linear or branched alkoxy group. Specific examples thereof include a group formed by linking the alkyl group mentioned as the alkyl group represented by Ra'$^{21}$ to an oxygen atom (—O—).

As the halogen atom in Ra'$^{21}$, a fluorine atom is preferable.

Examples of the halogenated alkyl group in Ra'$^{21}$ include a group obtained by substituting some or all of the hydrogen atoms in the alkyl group in Ra'$^{21}$ with the halogen atoms. As the halogenated alkyl group, a fluorinated alkyl group is preferable, and a perfluoroalkyl group is particularly preferable.

In —COOR" and —OC(=O)R" in Ra'$^{21}$, R" is a hydrogen atom, an alkyl group, a lactone-containing cyclic group, a carbonate-containing cyclic group, or an —SO$_2$— containing cyclic group.

The alkyl group in R" may be in any of linear, branched, and cyclic forms, and preferably has 1 to 15 carbon atoms.

In a case where R" is a linear or branched alkyl group, it is preferably an alkyl group having 1 to 10 carbon atoms, more preferably an alkyl group having 1 to 5 carbon atoms, and particularly preferably a methyl group or an ethyl group.

In a case where R" is a cyclic alkyl group, the group preferably has 3 to 15 carbon atoms, more preferably has 4 to 12 carbon atoms, and most preferably has 5 to 10 carbon atoms. Specific examples thereof include a group obtained by removing one or more hydrogen atoms from a monocycloalkane, which may or may not be substituted with a fluorine atom or a fluorinated alkyl group; and a group obtained by removing one or more hydrogen atoms from a polycycloalkane such as bicycloalkane, tricycloalkane, and tetracycloalkane. More specific examples thereof include a group obtained by removing one or more hydrogen atoms from a monocycloalkane such as cyclopentane or cyclohexane; and a group obtained by removing one or more hydrogen atoms from a polycycloalkane such as adamantane, norbornane, isobornane, tricyclodecane, and tetracyclododecane.

Examples of the lactone-containing cyclic group in R" include the same as those of the groups represented by each of General Formulae (a2-r-1) to (a2-r-7).

The carbonate-containing cyclic group in R" has the same definition as the carbonate-containing cyclic group which will be described later, and specific examples of the carbonate-containing cyclic group include groups each represented by General Formulae (ax3-r-1) to (ax3-r-3).

The —SO$_2$-containing cyclic group in R" has the same definition as the —SO$_2$-containing cyclic group which will be described later, and specific examples thereof include groups each represented by General Formulae (a5-r-1) to (a5-r-4).

The hydroxyalkyl group in Ra'$^{21}$ preferably has 1 to 6 carbon atoms, and specific examples thereof include a group obtained by substituting at least one hydrogen atom in the alkyl group in Ra'$^{21}$ with a hydroxyl group.

In General Formulae (a2-r-2), (a2-r-3), and (a2-r-5), as the alkylene group having 1 to 5 carbon atoms as A", a linear or branched alkylene group is preferable, and examples thereof include a methylene group, an ethylene group, an n-propylene group, and an isopropylene group. In a case where the alkylene group contains an oxygen atom or a sulfur atom, specific examples thereof include a group obtained by interposing —O— or —S— in a terminal of the alkylene group or between the carbon atoms of the alkylene group, and examples thereof include O—CH$_2$—, —CH$_2$—O—CH$_2$—, —S—CH$_2$—, and —CH$_2$—S—CH$_2$—. As A", an alkylene group having 1 to 5 carbon atoms or —O— is preferable, an alkylene group having 1 to 5 carbon atoms is more preferable, and a methylene group is the most preferable.

Specific examples of the groups represented by each of General Formulae (a2-r-1) to (a2-r-7) are shown below.

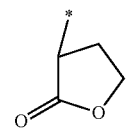

(r-ic-1-1)

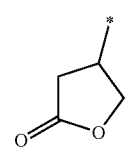

(r-ic-1-2)

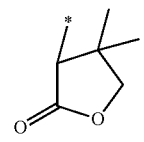

(r-ic-1-3)

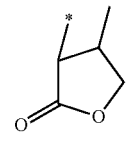

(r-ic-1-4)

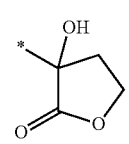

(r-ic-1-5)

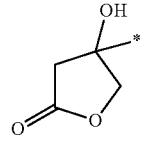

(r-ic-1-6)

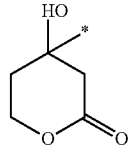

(r-ic-1-7)

-continued
(r-ic-2-1)
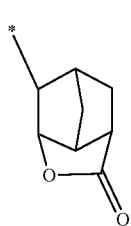
(r-ic-2-2)
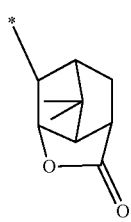
(r-ic-2-3)
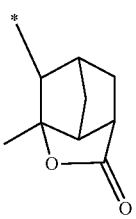
(r-ic-2-4)
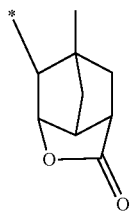
(r-ic-2-5)
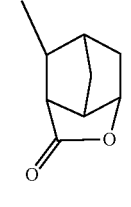
(r-ic-2-6)
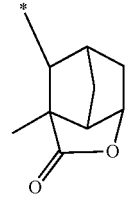
(r-ic-2-7)
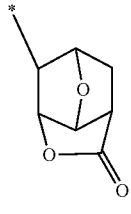
-continued
(r-ic-2-8)
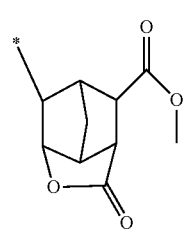
(r-ic-2-9)
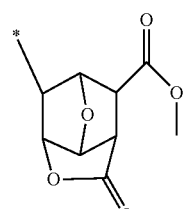
(r-ic-2-10)
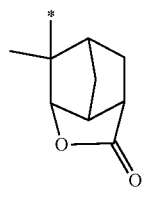
(r-ic-2-11)
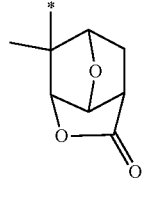
(r-ic-2-12)
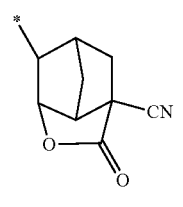
(r-ic-2-13)
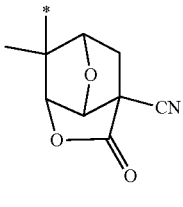
(r-ic-2-14)
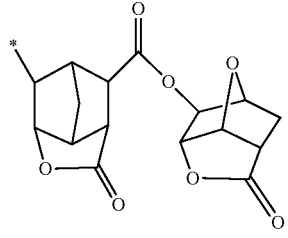

(r-ic-2-15)
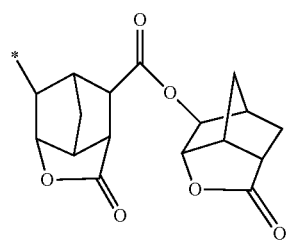
(r-ic-2-16)
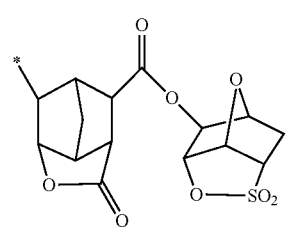
(r-ic-2-17)
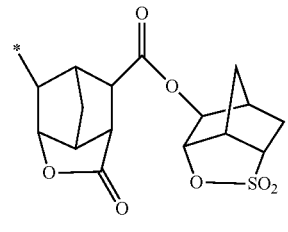
(r-ic-2-18)
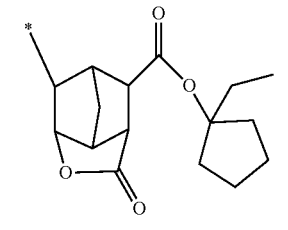
(r-ic-3-1)
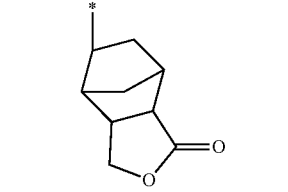
(r-ic-3-2)
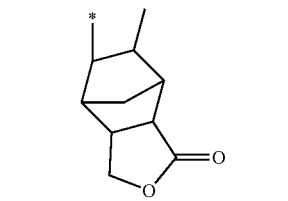
(r-ic-3-3)
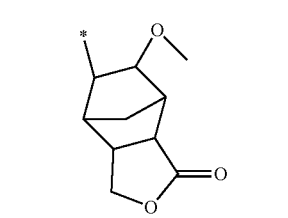
(r-ic-3-4)
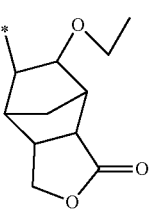
(r-ic-3-5)
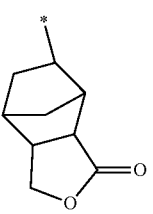
(r-ic-4-1)
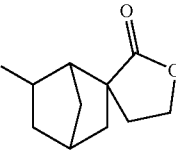
(r-ic-4-2)
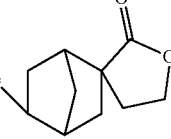
(r-ic-4-3)
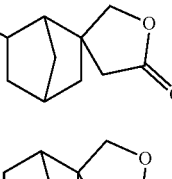
(r-ic-4-4)
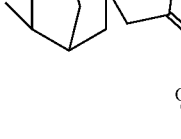
(r-ic-4-5)
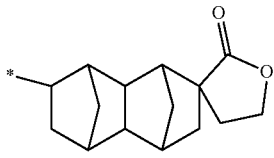
(r-ic-4-6)
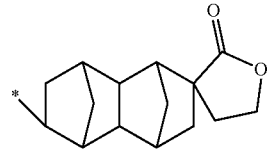
(r-ic-4-7)
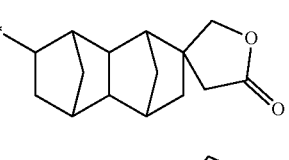
(r-ic-4-8)
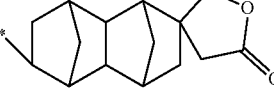

(r-ic-4-9)

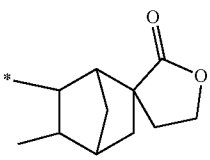

(r-ic-5-1)

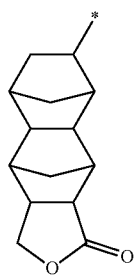

(r-ic-5-2)

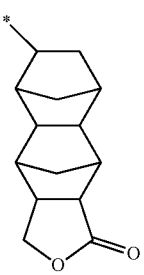

(r-ic-5-3)

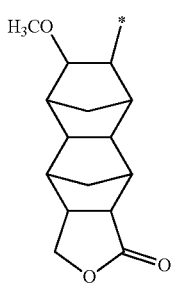

(r-ic-5-4)

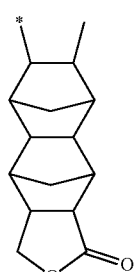

(r-ic-6-1)

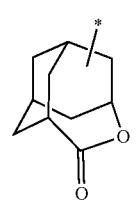

(r-ic-7-1)

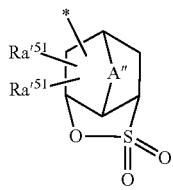

The "—$SO_2$-containing cyclic group" represents a cyclic group having a ring containing —$SO_2$— in the ring skeleton thereof, and is specifically a cyclic group in which the sulfur atom (S) in —$SO_2$— forms a part of the ring skeleton of the cyclic group. In a case where the ring including —$SO_2$— in the ring skeleton thereof is counted as the first ring and the group contains only the ring, the group is referred to as a monocyclic group, and in a case where the group has other ring structures, the group is referred to as a polycyclic group regardless of the structures. The —$SO_2$-containing cyclic group may be a monocyclic group or a polycyclic group.

As the —$SO_2$-containing cyclic group, a cyclic group including —O—$SO_2$— in the ring skeleton thereof, in other words, a cyclic group containing a sultone ring in which —O—S— in the —O—$SO_2$— group forms a part of the ring skeleton thereof is particularly preferable.

More specific examples of the —$SO_2$-containing cyclic group include groups each represented by General Formulae (a5-r-1) to (a5-r-4).

(a5-r-1)

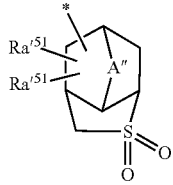

(a5-r-2)

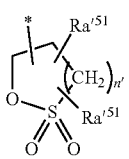

(a5-r-3)

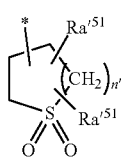

(a5-r-4)

[In the formulae, $Ra'^{51}$'s are each independently a hydrogen atom, an alkyl group, an alkoxy group, a halogen atom, a halogenated alkyl group, a hydroxyl group, —COOR", —OC(=O)R", a hydroxyalkyl group, or a cyano group; R" is a hydrogen atom, an alkyl group, a lactone-containing cyclic group, a carbonate-containing cyclic group, or an —$SO_2$-containing cyclic group; A" is an oxygen atom, a sulfur atom, or an alkylene group having 1 to 5 carbon atoms, which may include an oxygen atom or a sulfur atom; and n' is an integer of 0 to 2.]

In General Formulae (a5-r-1) and (a5-r-2), A" has the same definition as A" in General Formulae (a2-r-2), (a2-r-3), and (a2-r-5).

Examples of the alkyl group, the alkoxy group, the halogen atom, the halogenated alkyl group, —COOR", —OC(=O)R", and the hydroxyalkyl group in $Ra'^{51}$ each include the same as those mentioned in the description of $Ra'^{21}$ in General Formulae (a2-r-1) to (a2-r-7).

Specific examples of the groups represented by each of General Formulae (a5-r-1) to (a5-r-4) are shown below. In the formulae shown below, "Ac" represents an acetyl group.

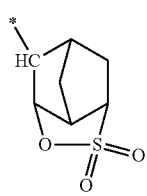
(r-sl-1-1)

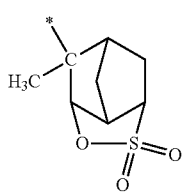
(r-sl-1-2)

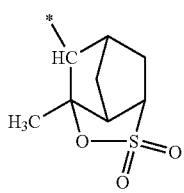
(r-sl-1-3)

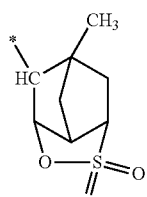
(r-sl-1-4)

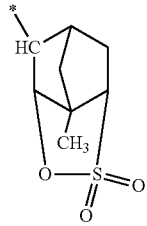
(r-sl-1-5)

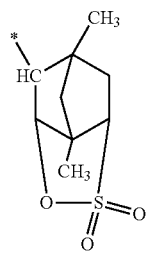
(r-sl-1-6)

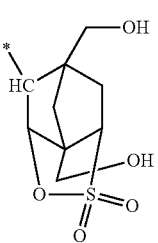
(r-sl-1-7)

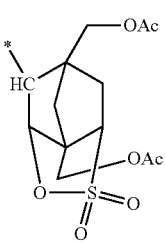
(r-sl-1-8)

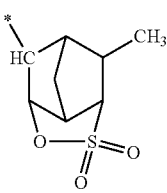
(r-sl-1-9)

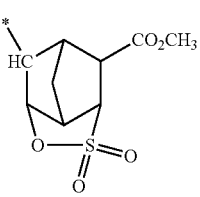
(r-sl-1-10)

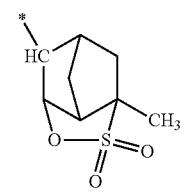
(r-sl-1-11)

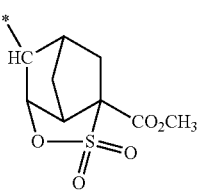
(r-sl-1-12)

73
-continued
(r-sl-1-13)
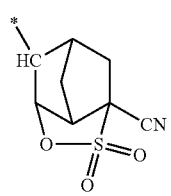
(r-sl-1-14)
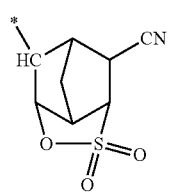
(r-sl-1-15)
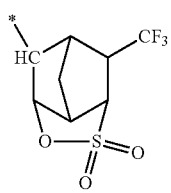
(r-sl-1-16)
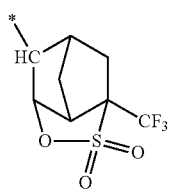
(r-sl-1-17)
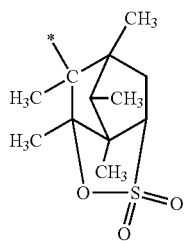
(r-sl-1-18)
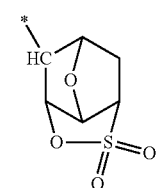
(r-sl-1-19)
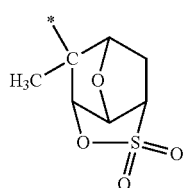
(r-sl-1-20)
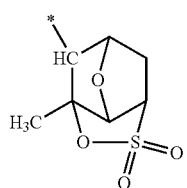
74
-continued
(r-sl-1-21)
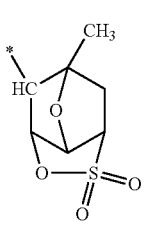
(r-sl-1-22)
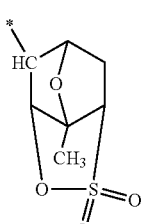
(r-sl-1-23)
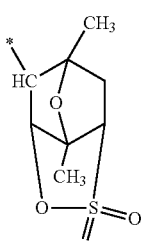
(r-sl-1-24)
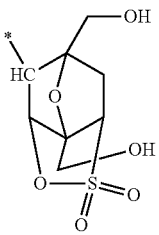
(r-sl-1-25)
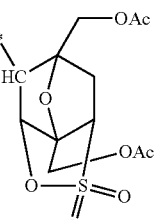
(r-sl-1-26)
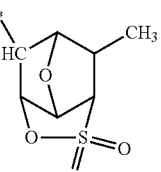
(r-sl-1-27)
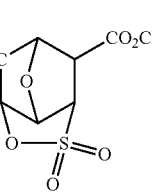

(r-sl-1-28) 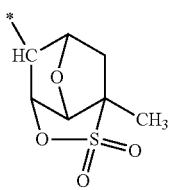

(r-sl-1-29) 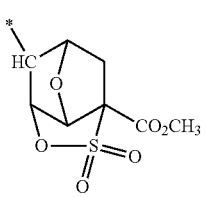

(r-sl-1-30) 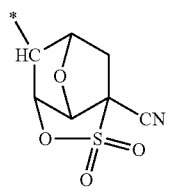

(r-sl-1-31) 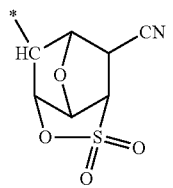

(r-sl-1-32) 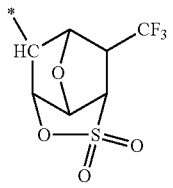

(r-sl-1-33) 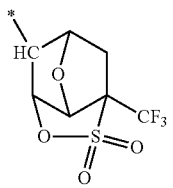

(r-sl-2-1) 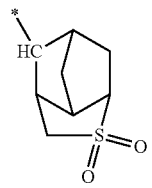

(r-sl-2-2) 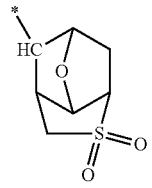

(r-sl-3-1) 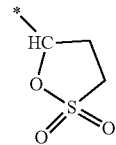

(r-sl-4-1) 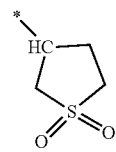

The "carbonate-containing cyclic group" represents a cyclic group having a ring (a carbonate ring) including —O—C(=O)—O— in the ring skeleton thereof. In a case where the carbonate ring is counted as the first ring and the group contains only the carbonate ring, the group is referred to as a monocyclic group, and in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and any of the groups may be used. Specific examples thereof include groups each represented by General Formulae (ax3-r-1) to (ax3-r-3).

(ax3-r-1) 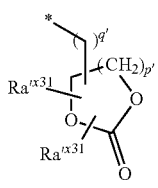

(ax3-r-2) 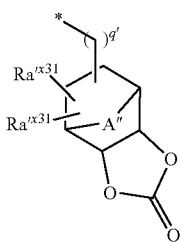

(ax3-r-3) 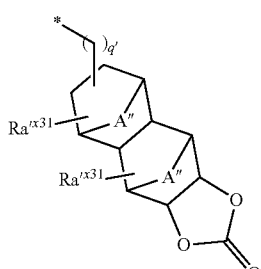

[In the formulae, $Ra'^{x31}$'s are each independently a hydrogen atom, an alkyl group, an alkoxy group, a halogen atom, a halogenated alkyl group, a hydroxyl group, —COOR", —OC(=O)R", a hydroxyalkyl group, or a cyano group; R" is a hydrogen atom, an alkyl group, a lactone-containing cyclic group, a carbonate-containing cyclic group, or an —SO$_2$-containing cyclic group; A" is an oxygen atom, a sulfur atom, or an alkylene group having 1 to 5 carbon atoms, which may include an oxygen atom or a sulfur atom; and p' is an integer of 0 to 3, and q' is 0 or 1.]

In General Formulae (ax3-r-2) and (ax3-r-3), A" has the same definition as A" in General Formulae (a2-r-2), (a2-r-3), and (a2-r-5).

Examples of the alkyl group, the alkoxy group, the halogen atom, the halogenated alkyl group, —COOR", —OC(=O)R", and the hydroxy alkyl group in Ra'$^{31}$ include the same as those mentioned in the description of Ra'$^{21}$ in each of General Formulae (a2-r-1) to (a2-r-7).

Specific examples of the groups represented by each of General Formulae (ax3-r-1) to (ax3-r-3) are shown below.

(r-cr-1-1)
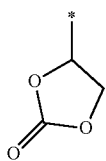

(r-cr-1-2)
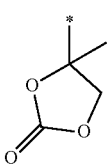

(r-cr-1-3)
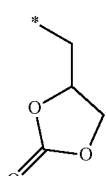

(r-cr-1-4)
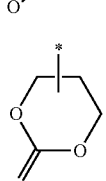

(r-cr-1-5)
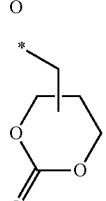

(r-cr-1-6)
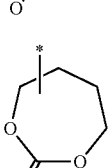

(r-cr-1-7)
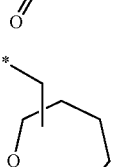

-continued (r-cr-2-1)
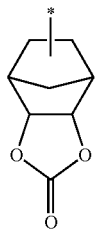

(r-cr-2-2)
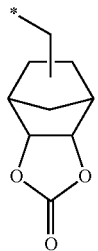

(r-cr-2-3)
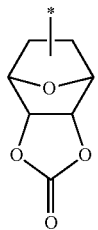

(r-cr-2-4)
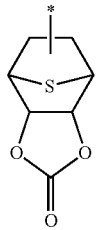

(r-cr-3-1)
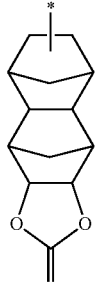

(r-cr-3-2)
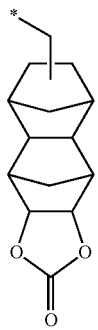

-continued

(r-cr-3-3)

(r-cr-3-4)

(r-cr-3-5)

As the constitutional unit (a2), a constitutional unit derived from an acrylic acid ester in which the hydrogen atom bonded to the carbon atom at the α-position may be substituted with a substituent is preferable.

The constitutional unit (a2) is preferably a constitutional unit represented by General Formula (a2-1).

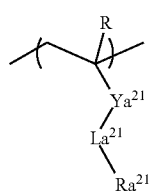
(a2-1)

[In the formula, R is a hydrogen atom, an alkyl group having 1 to 5 carbon atoms, or a halogenated alkyl group having 1 to 5 carbon atoms. $Ya^{21}$ is a single bond or a divalent linking group. $La^{21}$ is —O—, —COO—, —CON(R')—, —OCO—, —CONHCO— or —CONHCS—, and R' represents a hydrogen atom or a methyl group. It should be noted that in a case where $La^{21}$ is —O—, $Ya^{21}$ is not —CO—. $Ra^{21}$ is a lactone-containing cyclic group, a carbonate-containing cyclic group, or an —SO$_2$-containing cyclic group.]

R in Formula (a2-1) is the same as R in General Formula (a0-1). Examples of R in Formula (a2-1) include the same as those mentioned as R in General Formula (a0-1), and preferred examples thereof are also the same.

In Formula (a2-1), the divalent linking group as $Ya^{21}$ is not particularly limited, and suitable examples thereof include a divalent hydrocarbon group which may have a substituent and a divalent linking group having a heteroatom. Examples of the divalent linking group for $Ya^{21}$ include the same as those mentioned in $Va^{01}$ in General Formula (a0-1).

Among those, as $Ya^{21}$, a single bond, an ester bond [—C(=O)—O—], an ether bond (—O—), a linear or branched alkylene group, or a combination thereof is preferable.

In Formula (a2-1), $Ra^{21}$ is a lactone-containing cyclic group, an —SO$_2$-containing cyclic group, or a carbonate-containing cyclic group.

Preferred examples of the lactone-containing cyclic group, the —SO$_2$-containing cyclic group, and the carbonate-containing cyclic group in $Ra^{21}$ each include the groups represented by each of General Formulae (a2-r-1) to (a2-r-7), the groups represented by each of General Formulae (a5-r-1) to (a5-r-4), and the groups represented by each of General Formulae (ax3-r-1) to (ax3-r-3).

Among these, $Ra^{21}$ is preferably the lactone-containing cyclic group or the —SO$_2$-containing cyclic group, and more preferably the group each represented by General Formula (a2-r-1), (a2-r-2), (a2-r-6), or (a5-r-1). Specifically, any of the groups represented by each of Chemical Formulae (r-1c-1-1) to (r-1c-1-7), (r-1c-2-1) to (r-1c-2-18), (r-1c-6-1), (r-s1-1-1), and (r-s1-1-18) are more preferable.

The constitutional unit (a2) contained in the component (A1) may be one kind or two or more kinds.

In a case where the component (A1) has the constitutional unit (a2), the proportion of the constitutional unit (a2) is preferably 5% to 50% by mole, more preferably 10% to 40% by mole, still more preferably 15% to 35% by mole, and particularly preferably 20% to 30% by mole, with respect to the total amount (100% by mole) of all the constitutional units constituting the component (A1).

In a case where the proportion of the constitutional unit (a2) is equal to or higher than the preferred lower limit, the effect obtained by incorporation of the constitutional unit (a2) can be sufficiently achieved by the effect described above, and in a case where the proportion of the constitutional unit (a2) is equal to or lower than the upper limit, a balance with other constitutional units can be obtained, and various lithography characteristics are improved.

With Regard to Constitutional Unit (a3):

The component (A1) may further have a constitutional unit (a3) (provided that a constitutional unit corresponding to the constitutional unit (a1) or the constitutional unit (a2) is excluded) containing a polar group-containing aliphatic hydrocarbon group, as necessary. In a case where the component (A1) has the constitutional unit (a3), the hydrophilicity of the component (A) increases, which contributes to an improvement in resolution. In addition, the acid diffusion length can be appropriately adjusted.

Examples of the polar group include a hydroxyl group, a cyano group, a carboxyl group, and a hydroxyalkyl group obtained by substituting some of the hydrogen atoms of an alkyl group with fluorine atoms and among these, the hydroxyl group is particularly preferable.

Examples of the aliphatic hydrocarbon group include a linear or branched hydrocarbon group (preferably an alkylene group) having 1 to 10 carbon atoms, and a cyclic aliphatic hydrocarbon group (cyclic group). The cyclic group may be a monocyclic group or a polycyclic group, and for example, these cyclic groups can be selected appropriately from the multitude of groups that have been proposed for the resins of resist compositions for ArF excimer lasers.

In a case where the cyclic group is a monocyclic group, the monocyclic group preferably has 3 to 10 carbon atoms. Among these, the constitutional unit derived from an acrylic acid ester that includes an aliphatic monocyclic group containing a hydroxyl group, cyano group, carboxyl group, or a hydroxyalkyl group obtained by substituting some of the hydrogen atoms of an alkyl group with fluorine atoms are more preferable. Examples of the monocyclic group include a group obtained by removing two or more hydrogen atoms from a monocycloalkane. Specific examples of the monocyclic group include a group obtained by removing two or more hydrogen atoms from a monocycloalkane such as cyclopentane, cyclohexane, and cyclooctane. Among these monocyclic groups, the group obtained by removing two or more hydrogen atoms from cyclopentane or the group obtained by removing two or more hydrogen atoms from cyclohexane is industrially preferable.

In a case where the cyclic group is a polycyclic group, the polycyclic group preferably has 7 to 30 carbon atoms. Among these, the constitutional unit derived from an acrylic acid ester that includes an aliphatic polycyclic group containing a hydroxyl group, a cyano group, a carboxyl group, or a hydroxyalkyl group obtained by substituting some of the hydrogen atoms of an alkyl group with fluorine atoms is more preferable. Examples of the polycyclic group include a group obtained by removing two or more hydrogen atoms from a bicycloalkane, tricycloalkane, tetracycloalkane, or the like. Specific examples thereof include a group obtained by removing two or more hydrogen atoms from a polycycloalkane such as adamantane, norbornane, isobornane, tricyclodecane, or tetracyclododecane. Among these polycyclic groups, the group obtained by removing two or more hydrogen atoms from adamantane, the group obtained by removing two or more hydrogen atoms from norbornane, or the group obtained by removing two or more hydrogen atoms from tetracyclododecane is industrially preferable.

As the constitutional unit (a3), any constitutional unit can be used without particular limitation as long as it includes a polar group-containing aliphatic hydrocarbon group.

As the constitutional unit (a3), a constitutional unit derived from an acrylic acid ester in which the hydrogen atom bonded to the carbon atom at the α-position may be substituted with a substituent, and the constitutional unit includes a polar group-containing aliphatic hydrocarbon group is preferable.

In a case where the hydrocarbon group in the polar group-containing aliphatic hydrocarbon group is a linear or branched hydrocarbon group having 1 to 10 carbon atoms, the constitutional unit (a3) is preferably a constitutional unit derived from a hydroxy ethyl ester of an acrylic acid.

Furthermore, in a case where the hydrocarbon group in the polar group-containing aliphatic hydrocarbon group is a polycyclic group, preferred examples of the constitutional unit (a3) include a constitutional unit represented by Formula (a3-1), a constitutional unit represented by Formula (a3-2), and a constitutional unit represented by Formula (a3-3), and in a case where the hydrocarbon group is a monocyclic group, preferred examples of the constitutional unit (a3) include a constitutional unit represented by Formula (a3-4).

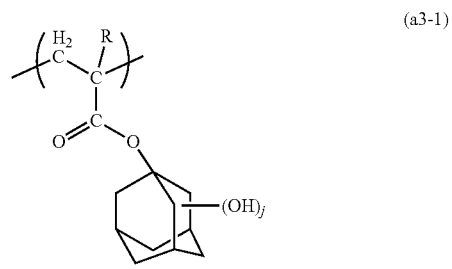

(a3-1)

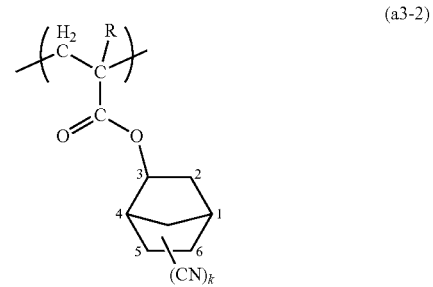

(a3-2)

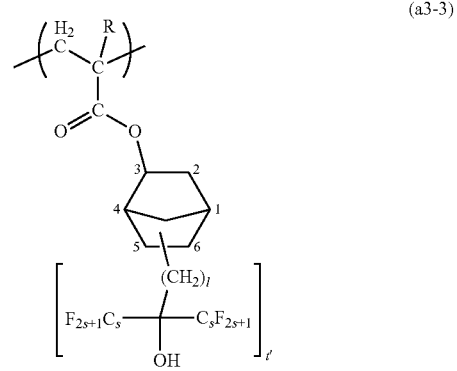

(a3-3)

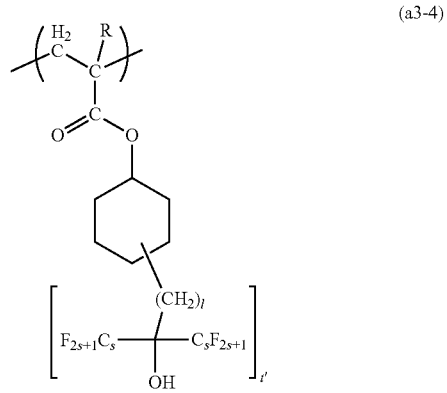

(a3-4)

[In the formulae, R has the same definition as described above, j is an integer of 1 to 3, k is an integer of 1 to 3, t' is an integer of 1 to 3, l is an integer of 0 to 5, and s is an integer of 1 to 3.]

In Formula (a3-1), j is preferably 1 or 2 and more preferably 1. In a case where j is 2, it is preferable that the hydroxyl groups be bonded to the 3rd and 5th positions of the adamantyl group. In a case where j is 1, it is preferable that the hydroxyl group be bonded to the 3-position of the adamantyl group.

It is preferable that j be 1, and it is particularly preferable that the hydroxyl group be bonded to the 3-position of the adamantyl group.

In Formula (a3-2), k is preferably 1. The cyano group is preferably bonded to the 5th or 6th position of the norbornyl group.

In Formula (a3-3), t' is preferably 1. l is preferably 1. s is preferably 1. Further, it is preferable that a 2-norbornyl group or a 3-norbornyl group be bonded to a terminal of the carboxyl group of the acrylic acid. It is preferable that the fluorinated alkyl alcohol be bonded to the 5- or 6-position of the norbornyl group.

In Formula (a3-4), t' is preferably 1 or 2. l is preferably 0 or 1. s is preferably 1. It is preferable that the fluorinated alkyl alcohol be bonded to the 3- or 5-position of the cyclohexyl group.

The constitutional unit (a3) contained in the component (A1) may be one kind or two or more kinds.

In a case where the component (A1) has the constitutional unit (a3), the proportion of the constitutional unit (a3) is preferably 1% to 30% by mole, more preferably 2% to 25% by mole, and still more preferably 5% to 20% by mole, with respect to the total amount (100% by mole) of all the constitutional units constituting the component (A1).

In a case where the proportion of the constitutional unit (a3) is equal to or higher than the preferred lower limit, the effect obtained by incorporation of the constitutional unit (a3) can be sufficiently achieved by the effect described above, and in a case where the proportion of the constitutional unit (a3) is equal to or lower than the preferred upper limit, balance with other constitutional units can be obtained, and various lithography characteristics are improved.

With Regard to Constitutional Unit (a4):

The component (A1) may have a constitutional unit (a4) including a non-acid-dissociable aliphatic cyclic group.

By incorporating the constitutional unit (a4) into the component (A1), the dry etching resistance of a resist pattern to be formed is improved. Further, the hydrophobicity of the component (A) increases. The improvement in the hydrophobicity contributes to an improvement in resolution, a resist pattern shape, and the like, particularly in a case of a solvent developing process.

The "non-acid-dissociable cyclic group" in the constitutional unit (a4) is a cyclic group that remains in the constitutional unit without being dissociated even in a case where an acid acts in a case where the acid is generated in the resist composition by exposure (for example, in a case where an acid is generated from the constitutional unit generating an acid by exposure or the component (B)).

Examples of the constitutional unit (a4) preferably include a constitutional unit derived from an acrylic acid ester including a non-acid-dissociable aliphatic cyclic group. As the cyclic group, a large number of cyclic groups known in the related art as cyclic groups used as a resin component of a resist composition for an ArF excimer laser, a KrF excimer laser (preferably the ArF excimer laser), or the like can be used.

The cyclic group is particularly preferably at least one selected from a tricyclodecyl group, an adamantyl group, a tetracyclododecyl group, an isobornyl group, and a norbornyl group, from the viewpoint of industrial availability. These polycyclic groups may have, as a substituent, a linear or branched alkyl group having 1 to 5 carbon atoms.

Specific examples of the constitutional unit (a4) include a constitutional unit represented by each of General Formulae (a4-1) to (a4-7).

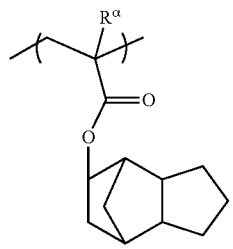
(a4-1)

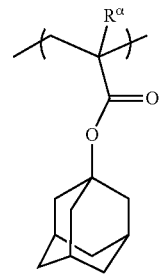
(a4-2)

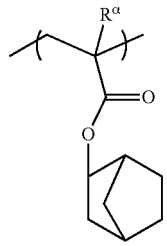
(a4-3)

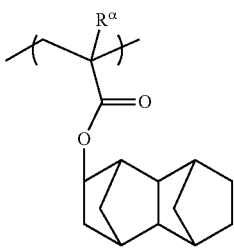
(a4-4)

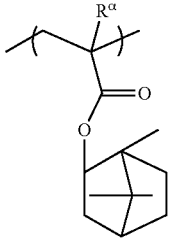
(a4-5)

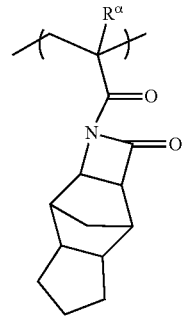
(a4-6)

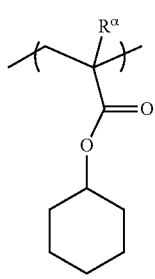

(a4-7)

[In the formulae, R" is the same as above.]

The constitutional unit (a4) contained in the component (A1) may be one kind or two or more kinds.

In a case where the component (A1) has the constitutional unit (a4), the proportion of the constitutional unit (a4) is preferably 1% to 40% by mole, and more preferably 5% to 20% by mole, with respect to the total amount (100% by mole) of all the constitutional units constituting the component (A1).

In a case where the proportion of the constitutional unit (a4) is equal to or higher than the preferred lower limit, the effect obtained by incorporation of the constitutional unit (a4) can be sufficiently achieved, whereas in a case where the proportion of the constitutional unit (a4) is equal to or lower than the preferred upper limit, the balance with other constitutional units is obtained easily.

With Regard to Constitutional Unit (st):

The constitutional unit (st) is a constitutional unit derived from styrene or a styrene derivative. A "constitutional unit derived from styrene" means a constitutional unit that is formed by the cleavage of an ethylenic double bond of styrene. A "constitutional unit derived from a styrene derivative" means a constitutional unit formed by the cleavage of an ethylenic double bond of a styrene derivative (provided that those corresponding to the constitutional unit (a10) are excluded).

The "styrene derivative" means a compound in which at least some of hydrogen atoms of styrene are substituted with a substituent. Examples of the styrene derivative include a derivative in which a hydrogen atom at the α-position of styrene is substituted with a substituent, a derivative in which one or more hydrogen atoms of the benzene ring of styrene are substituted with a substituent, and a derivative in which the hydrogen atom at the α-position of styrene and one or more hydrogen atoms of the benzene ring are substituted with a substituent.

Examples of the substituent which is substituted for a hydrogen atom at the α-position of styrene include an alkyl group having 1 to 5 carbon atoms or a halogenated alkyl group having 1 to 5 carbon atoms.

As the alkyl group having 1 to 5 carbon atoms, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms is a group obtained by substituting some or all of the hydrogen atoms in the alkyl group having 1 to 5 carbon atoms with halogen atoms. As the halogen atom, a fluorine atom is particularly preferable.

The substituent which is substituted for a hydrogen atom at the α-position of styrene is preferably an alkyl group having 1 to 5 carbon atoms or a fluorinated alkyl group having 1 to 5 carbon atoms, more preferably an alkyl group having 1 to 3 carbon atoms or a fluorinated alkyl group having 1 to 3 carbon atoms, and still more preferably a methyl group, from the viewpoint of industrial availability.

Examples of the substituent which is substituted for a hydrogen atom of the benzene ring of styrene include an alkyl group, an alkoxy group, a halogen atom, and a halogenated alkyl group.

The alkyl group as the substituent is preferably an alkyl group having 1 to 5 carbon atoms, and more preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably the methoxy group or the ethoxy group.

The halogen atom as the substituent is preferably a fluorine atom.

Examples of the halogenated alkyl group as the substituent include a group obtained by substituting some or all of the hydrogen atoms in the alkyl group with the halogen atoms.

The substituent which is substituted for a hydrogen atom of the benzene ring of styrene, an alkyl group having 1 to 5 carbon atoms is preferable, a methyl group or an ethyl group is more preferable, and the methyl group is still more preferable.

The constitutional unit (st) is preferably a constitutional unit derived from styrene or a styrene derivative in which a hydrogen atom at the α-position of styrene is substituted with an alkyl group having 1 to 5 carbon atoms or a halogenated alkyl group having 1 to 5 carbon atoms, more preferably the constitutional unit derived from styrene, or a constitutional unit derived from a styrene derivative in which a hydrogen atom at the α-position of styrene is substituted with a methyl group, and still more preferably the constitutional unit derived from styrene.

The constitutional unit (st) contained in the component (A1) may be one kind or two or more kinds.

In a case where the component (A1) has the constitutional unit (st), the proportion of the constitutional unit (st) is preferably 1% to 30% by mole, and more preferably 3% to 20% by mole, with respect to the total amount (100% by mole) of all the constitutional units constituting the component (A1).

The component (A1) contained in the resist composition may be used alone or in combination of two or more kinds thereof.

In the resist composition of the present embodiment, examples of the component (A1) include a high-molecular-weight compound having a repeated structure of the constitutional unit (a0).

Examples of the preferred component (A1) include a high-molecular-weight compound having a repeated structure of the constitutional unit (a0) and another constitutional unit. Examples of the component (A1) include a high-molecular-weight compound having a repeated structure of the constitutional unit (a0) and the constitutional unit (a1).

In addition to the combination of the two constitutional units, the above-described constitutional units may be combined as a third constitutional unit or three or more constitutional units as appropriate in accordance with a desired effect.

Among those, as the component (A1), the high-molecular-weight compound having a repeated structure of the constitutional unit (a0) and the constitutional unit (a1) is preferable.

In this case, the molar ratio of the constitutional unit (a0) to the constitutional unit (a1) in the high-molecular-weight compound (the constitutional unit (a0):the constitutional unit (a1)) is preferably 2:8 to 8:2, more preferably 3:7 to 7:3, and still more preferably 4:6 to 6:4.

The component (A1) can be produced by dissolving each of monomers from which the constitutional units are derived in a polymerization solvent, and adding a radical polymerization initiator such as azobisisobutyronitrile (AIBN) and dimethyl azobisisobutyrate (for example, V-601) thereto to perform polymerization.

Alternatively, the component (A1) can be produced by dissolving, in a polymerization solvent, a monomer from which the constitutional unit (a0) is derived, and as necessary, a monomer from which a constitutional unit other than the constitutional unit (a0) is derived, adding the radical polymerization initiator as described above thereto to perform polymerization, and then performing a deprotection reaction.

Furthermore, a —C(CF$_3$)$_2$—OH group may be introduced into a terminal, using a chain transfer agent such as HS—CH$_2$—CH$_2$—CH$_2$—C(CF$_3$)$_2$—OH in combination, during the polymerization. As described above, a copolymer into which a hydroxyalkyl group obtained by substituting some of the hydrogen atoms in an alkyl group with fluorine atoms has been introduced is effective for reducing development defects and reducing a line edge roughness (LER: uneven irregularities of a line side wall).

The weight-average molecular weight (Mw) (based on the polystyrene-equivalent value determined by gel permeation chromatography (GPC)) of the component (A1) is not particularly limited, and is preferably 1,000 to 50,000, more preferably 2,000 to 30,000, and still more preferably 3,000 to 20,000.

In a case where Mw of the component (A1) is equal or lower than the preferred upper limit of the range, the resist composition exhibits a sufficient solubility in a solvent for a resist so that the resist composition can be used as a resist; and in a case where Mw of the component (A1) is equal to or higher than the preferred lower limit of the range, the dry etching resistance and the cross-sectional shape of a resist pattern are improved.

The dispersity (Mw/Mn) of the component (A1) is not particularly limited, but is preferably 1.0 to 4.0, more preferably 1.0 to 3.0, and particularly preferably 1.0 to 2.0. Further, Mn represents a number-average molecular weight.

With Regard to Component (A2)

In the resist composition of the present embodiment, a base material component (hereinafter referred to as a "component (A2)") whose solubility in a developing solution changes by the action of an acid, in which the base material component does not correspond to the component (A1), may be used in combination as the component (A).

The component (A2) is not particularly limited, and may be optionally selected and used from a large number of base material components for a chemically amplified resist composition, known in the related art.

As the component (A2), the high-molecular-weight compound or the low-molecular-weight compound may be used alone, or in combination of two or more kinds thereof.

The proportion of the component (A1) in the component (A) is preferably 25% by mass or more, more preferably 50% by mass or more, and still more preferably 75% by mass or more, and may also be 100% by mass, with respect to the total mass of the component (A). In a case where the proportion is 25% by mass or more, it is easy to form a resist pattern excellent in various lithography characteristics such as higher sensitivity and improvements in terms of defects, resolution, and roughness.

The content of the component (A) in the resist composition of the present embodiment may be adjusted according to the thickness of a resist film to be formed, and the like.

<<Fluorine additive Component (F)>>

The resist composition of the present embodiment further contains a fluorine additive component (F) (hereinafter referred to as a "component (F)") in addition to the component (A). The component (F) imparts water repellency to the resist film.

With Regard to Component (F1)

The component (F) includes a high-molecular-weight compound (F1) having a constitutional unit (f01) represented by General Formula (f01-1) and a constitutional unit (f02) including an acid-dissociable group represented by General Formula (f02-r-1).

<<Constitutional Unit (f01)>>

The constitutional unit (f01) is a constitutional unit represented by General Formula (f01-1).

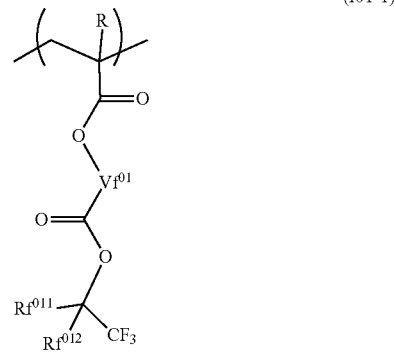

(f01-1)

[In the formula, R represents a hydrogen atom, an alkyl group having 1 to 5 carbon atoms, or a halogenated alkyl group having 1 to 5 carbon atoms. Vf$^{01}$ represents a divalent linking group. Rf$^{011}$ and Rf$^{012}$ each independently represents a hydrogen atom, a fluorine atom, a hydroxyl group, a methyl group, or a trifluoromethyl group.]

In Formula (f01-1), R is the same as R in General Formula (a0-1). Examples of R in Formula (f01-1) include the same as those mentioned as R in General Formula (a0-1), and preferred examples thereof are also the same.

In Formula (f01-1), Vf$^{01}$ represents a divalent linking group. Examples of the divalent linking group in Vf$^{01}$ include the same as those listed as the divalent linking group in Va$^{01}$ in Formula (a0-1).

As Vf$^{01}$, a divalent hydrocarbon group which may have a substituent is preferable, an aliphatic hydrocarbon group which may have a substituent is more preferable, and a linear or branched aliphatic hydrocarbon group chain which may have a substituent, is still more preferable. The aliphatic hydrocarbon group preferably has 1 to 10 carbon atoms, more preferably has 1 to 6 carbon atoms, still more preferably has 1 to 4 carbon atoms, and most preferably has 1 to 3 carbon atoms. Among these, a linear or branched alkylene group which may have a substituent is preferable, and examples thereof include the same as those mentioned in Va$^{01}$ in Formula (a0-1).

The divalent hydrocarbon group may or may not have a substituent. Examples of the substituent include a fluorine atom, a fluorinated alkyl group having 1 to 5 carbon atoms, which is substituted with a fluorine atom, and a carbonyl group. It is preferable that the divalent hydrocarbon group have no substituent.

As $Vf^{o1}$, an alkylene group having 1 to 3 carbon atoms is preferable, and a methylene group or an ethylene group is more preferable.

In Formula (f01-1), $Rf^{o11}$ and $Rf^{o12}$ each independently represents a hydrogen atom, a fluorine atom, a hydroxyl group, a methyl group, or a trifluoromethyl group. $Rf^{o11}$ and $Rf^{o12}$ are each independently preferably the hydrogen atom, the fluorine atom, the methyl group, or the trifluoromethyl group, and more preferably the hydrogen atom or the trifluoromethyl group. It is preferable that at least one of $Rf^{o11}$ and $Rf^{o12}$ be the trifluoromethyl group. It is particularly preferable that any one of $Rf^{o11}$ and $Rf^{o12}$ be the hydrogen atom and the other be the trifluoromethyl group (for example, $Rf^{o11}$ be the trifluoromethyl group; and $Rf^{o12}$ be the hydrogen atom).

The constitutional unit (f01) is preferably a constitutional unit represented by General Formula (f01-1-1).

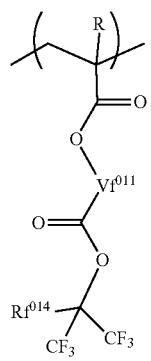

(f01-1-1)

[In the formula, R represents a hydrogen atom, an alkyl group having 1 to 5 carbon atoms, or a halogenated alkyl group having 1 to 5 carbon atoms. $Vf^{o11}$ represents an aliphatic hydrocarbon group which may have a substituent. $Rf^{o14}$ represents a hydrogen atom, a fluorine atom, a hydroxyl group, a methyl group, or a trifluoromethyl group.]

In Formula (f01-1-1), R is the same as R in Formula (f01-1).

In Formula (f0-1-1-1), $Vf^{o11}$ represents an aliphatic hydrocarbon group which may have a substituent. Examples of the aliphatic hydrocarbon group include the same as those mentioned in $Va^{o1}$ in General Formula (a0-1).

The aliphatic hydrocarbon group in $Vf^{o11}$ preferably has 1 to 10 carbon atoms, more preferably has 1 to 6 carbon atoms, and still more preferably has 1 to 3 carbon atoms. The aliphatic hydrocarbon group may be saturated or may be unsaturated, but is preferably saturated. The aliphatic hydrocarbon group is preferably linear or branched, and more preferably linear.

The aliphatic hydrocarbon group in $Vf^{o11}$ may or may not have a substituent, but it is preferable that the group not have a substituent. Examples of the substituent which may be contained in the aliphatic hydrocarbon group include a fluorine atom, a fluorinated alkyl group having 1 to 5 carbon atoms, which is substituted with a fluorine atom, and a carbonyl group.

As $Vf^{o11}$, an alkylene group having 1 to 3 carbon atoms is preferable, and a methylene group or an ethylene group is more preferable.

In Formula (f01-1-1), $Rf^{o14}$ represents a hydrogen atom, a fluorine atom, a hydroxyl group, a methyl group, or a trifluoromethyl group. $Rf^{o14}$ is preferably the hydrogen atom, the fluorine atom, the methyl group, or the trifluoromethyl group, more preferably the hydrogen atom or the trifluoromethyl group, and still more preferably the hydrogen atom.

Specific examples of the constitutional unit (f01) are shown below, but the present invention is not limited thereto.

In each of the formulae shown below, R" represents a hydrogen atom, a methyl group, or a trifluoromethyl group.

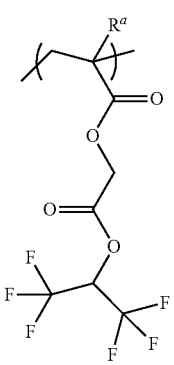

(f0-1-1-1)

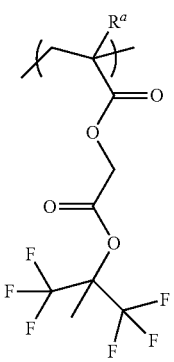

(f0-1-1-2)

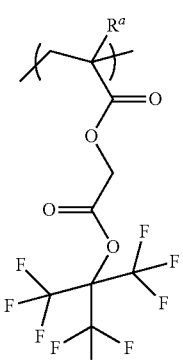

(f0-1-1-3)

(f0-1-1-4)
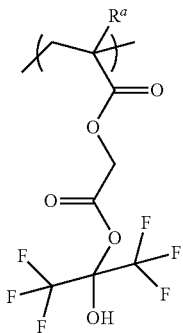

(f0-1-1-5)
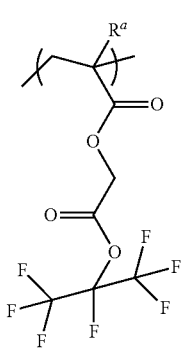

(f0-1-2-1)
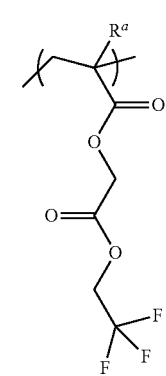

(f0-1-2-2)
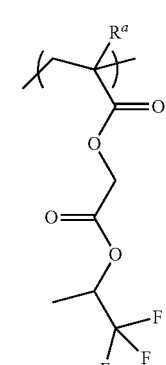

(f0-1-2-3)
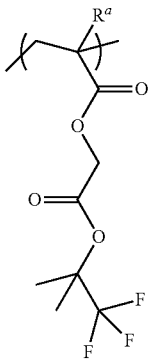

(f0-1-2-4)
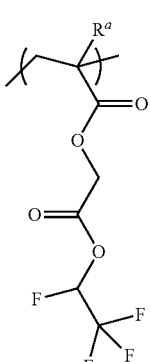

(f0-1-2-5)
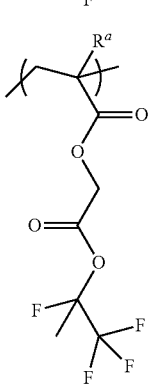

The constitutional unit (f01) contained in the component (F1) may be one kind or two or more kinds.

The proportion of the constitutional unit (f01) in the component (F1) is preferably 30% to 95% by mole, more preferably 40% to 90% by mole, still more preferably 50% to 85% by mole, and particularly preferably 60% to 80% by mole, with respect to the total amount (100% by mole) of all the constitutional units constituting the component (F1).

In a case where the proportion of the constitutional unit (f01) is set to be equal to or higher than the lower limit of the preferred range, the lithography characteristics such as a defect, pattern shape, and roughness are further improved. In a case where the proportion of the constitutional unit (f01) is equal to or less than the upper limit of the preferred range, a balance with other constitutional units can be obtained, and various lithography characteristics are improved.

<<Constitutional Unit (f02)>>

The constitutional unit (f02) is a constitutional unit including an acid-dissociable group represented by General Formula (f02-r-1).

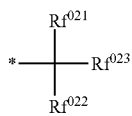
(f02-r-1)

[In the formula, $Rf^{021}$ and $Rf^{022}$ each independently represents an alkyl group having 1 to 3 carbon atoms, which may have a substituent. $Rf^{023}$ represents a polycyclic aliphatic hydrocarbon group which may have a substituent. * represents a bond.]

The Formula (f02-r-1), $Rf^{021}$ and $Rf^{022}$ each independently represents an alkyl group having 1 to 3 carbon atoms, which may have a substituent.

The alkyl group having 1 to 3 carbon atoms may or may not have a substituent, but preferably does not have a substituent. Examples of the substituent which may be contained in the alkyl group having 1 to 3 carbon atoms include a hydroxyl group, a carboxyl group, a halogen atom, an alkoxy group (a methoxy group, an ethoxy group, a propoxy group, a butoxy group, and the like), and an alkyloxycarbonyl group.

$Rf^{021}$ and $Rf^{022}$ are each independently preferably the methyl group or the ethyl group, it is preferable that at least one of either be the ethyl group, and it is more preferable that both be ethyl groups.

$Rf^{023}$ represents a polycyclic aliphatic hydrocarbon group which may have a substituent. As the polycyclic aliphatic hydrocarbon group, a group obtained by removing one hydrogen atom from a poly cycloalkane is preferable. The poly cycloalkane preferably has 7 to 12 carbon atoms, and examples thereof include adamantane, norbornane, isobornane, tricyclodecane, and tetracyclododecane. Among these, $Rf^{023}$ is preferably an adamantyl group.

Specific examples of the acid-dissociable group represented by General Formula (f02-r-1) are shown below, but the present invention is not limited thereto.

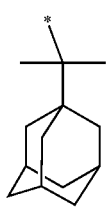
(f02-r-1)

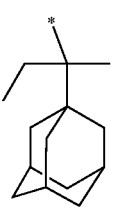
(f02-r-2)

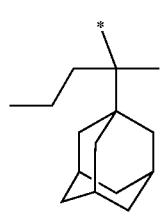
(f02-r-3)

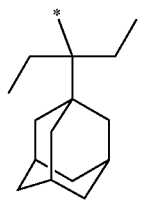
(f02-r-4)

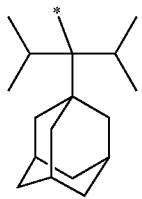
(f02-r-5)

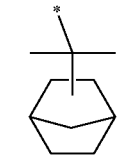
(f02-r-6)

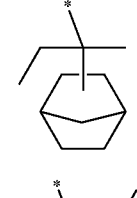
(f02-r-7)

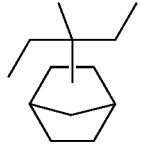
(f02-r-8)

The constitutional unit (f02) is preferably a constitutional unit represented by General Formula (f02-1).

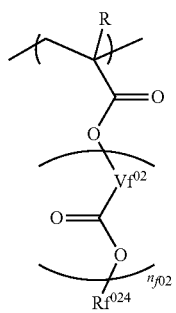
(f02-1)

[In the formula, R represents a hydrogen atom, an alkyl group having 1 to 5 carbon atoms, or a halogenated alkyl group having 1 to 5 carbon atoms. $Vf^{02}$ represents a divalent hydrocarbon group which may have an ether bond. nm represents an integer of 0 to 2. $Rf^{024}$ represents an acid-dissociable group represented by General Formula (f02-r-1).]

In Formula (f02-1), R is the same as R in Formula (f01-1).

In Formula (f02-1), $Vf^{02}$ represents a divalent hydrocarbon group which may have an ether bond. Examples of the divalent hydrocarbon group include the same as those mentioned as the divalent hydrocarbon group which may have a substituent in $Va^{o1}$ in General Formula (a0-1).

As the divalent hydrocarbon group in $Vf^{o2}$, an aliphatic hydrocarbon group which may have a substituent is preferable, and a linear or branched alkylene group having 1 to 10 carbon atoms, which may have a substituent, is more preferable. The alkylene group has more preferably 1 to 6 carbon atoms, still more preferably 1 to 4 carbon atoms, and particularly preferably 1 to 3 carbon atoms. As $Vf^{o2}$, a methylene group or an ethylene group is particularly preferable.

In Formula (f02-1), $n_{f02}$ represents an integer of 0 to 2. nm is preferably 0 or 1 and more preferably 0.

In Formula (f02-1), $Rf^{o24}$ represents an acid-dissociable group represented by General Formula (f02-r-1).

Specific examples of the constitutional unit (f02) are shown below, but the present invention is not limited thereto.

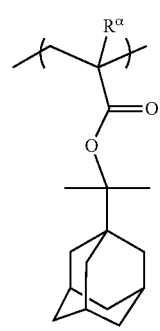

(f02-1-1)

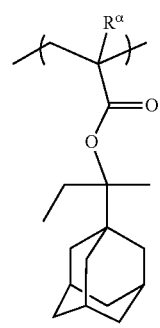

(f02-1-2)

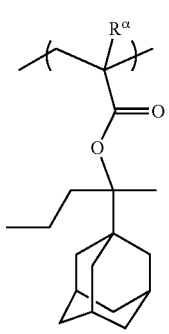

(f02-1-3)

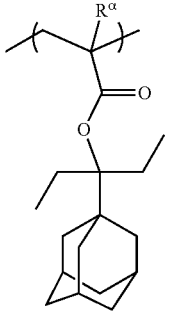

(f02-1-4)

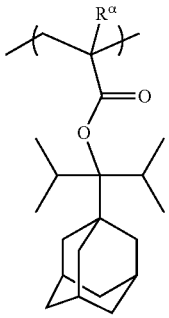

(f02-1-5)

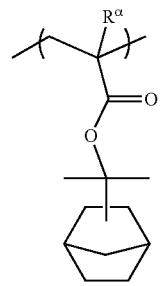

(f02-1-6)

The constitutional unit (f02) contained in the component (F1) may be one kind or two or more kinds.

The proportion of the constitutional unit (f02) in the component (F1) is preferably 5% to 70% by mole, more preferably 10% to 60% by mole, still more preferably 15% to 50% by mole, and particularly preferably 20% to 40% by mole, with respect to the total amount (100% by mole) of all the constitutional units constituting the component (F1).

In a case where the proportion of the constitutional unit (f02) is set to be equal to or higher than the lower limit of the preferred range, the lithography characteristics such as a defect, pattern shape, and roughness are further improved. In a case where the proportion of the constitutional unit (f02) is equal to or less than the upper limit of the preferred range, a balance with other constitutional units can be obtained, and various lithography characteristics are improved.

The component (F1) may be used alone or in combination of two or more kinds thereof.

Examples of the component (F1) include a high-molecular-weight compound having a repeating structure of a constitutional unit (f01) and a constitutional unit (f02). In this case, the molar proportion of the constitutional unit (f01) to the constitutional unit (f02) in the high-molecular-weight compound (the constitutional unit (f01):the constitutional unit (f02)) is preferably 90:10 to 40:60, more preferably 85:15 to 50:50, and still more preferably 80:20 to 60:40.

The component (F1) may have another constitutional unit, in addition to the constitutional unit (f01) and the constitutional unit (f02). Examples of such another constitutional unit include a constitutional unit derived from acrylic acid or methacrylic acid.

As the component (F1), a high-molecular-weight compound having a repeating structure of the constitutional unit (f01) and the constitutional unit (f02) is preferable.

The weight-average molecular weight (Mw) (based on the polystyrene-equivalent value determined by gel permeation chromatography) of the component (F1) is preferably 1,000 to 50,000, more preferably 5,000 to 40,000, and still more preferably 10,000 to 30,000. In a case where the Mw of the component (F1) is equal to or lower than the upper limit of the range, the solubility in the resist solvent is improved. In a case where the Mw of the component (F1) is equal to or more than the lower limit of the range, the water repellency of the resist film is improved.

The dispersity (Mw/Mn) of the component (F1) is preferably 1.0 to 5.0, more preferably 1.0 to 3.0, and still more preferably 1.0 to 2.5.

The content of the component (F1) in the resist composition is preferably 0.5 to parts by mass, and more preferably 1 to 5 parts by mass, with respect to 100 parts by mass of the component (A).

With Regard to Component (F2)

The component (F) may include a fluorine additive component (F2) (hereinafter a component (F2)) other than the component (F1).

As the component (F2), a fluorine-containing high-molecular-weight compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

As the component (F2), one type may be used alone, or two or more types may be used in combination.

The proportion of the component (F1) in the component (F) is preferably 25% by mass or more, more preferably 50% by mass or more, still more preferably 75% by mass or more, and may be 100% by mass with respect to the total mass of the component (F). In a case where the proportion is 25% by mass or more, a resist pattern excellent in various lithography characteristics such as a defect, pattern shape, and roughness improvement is easily formed. The proportion of (F1) in the component (F) is preferably 100% by mass.

<Optional Components>

The resist composition of the present embodiment may further contain other components (optional components) other than the component (A) and the component (F). Examples of the optional components include a component (B), a component (D), a component (E), and a component (S), each of which will be described later.

<<Acid Generator Component (B)>>

The resist composition of the present embodiment may further contain an acid generator component (B) (hereinafter referred to as a "component (B)") generating an acid by exposure, in addition to the component (A) and the component (F).

The component (B) is not particularly limited, and those which have been proposed as an acid generator for a chemically amplified resist composition in the related art can be used.

Examples of such an acid generator are numerous and include onium salt-based acid generators such as iodonium salts and sulfonium salts; oxime sulfonate-based acid generators; diazomethane-based acid generators such as bisalkyl or bisaryl sulfonyl diazomethanes and poly(bissulfonyl) diazomethanes; nitrobenzylsulfonate-based acid generators; iminosulfonate-based acid generators; and disulfone-based acid generators.

Examples of the onium salt-based acid generator include a compound represented by General Formula (b-1) (hereinafter also referred to as "component (b-1)"), a compound represented by General Formula (b-2) (hereinafter also referred to as "component (b-2)"), and a compound represented by General Formula (b-3) (hereinafter also referred to as "component (b-3)").

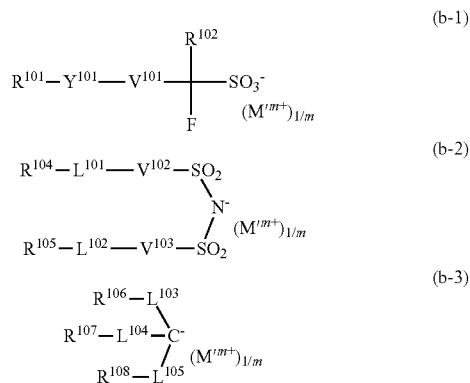

[In the formula, $R^{101}$ and $R^{104}$ to $R^{108}$ are each independently a cyclic group which may have a substituent, a chain-like alkyl group which may have a substituent, or a chain-like alkenyl group which may have a substituent. $R^{104}$ and $R^{105}$ may be bonded to each other to form a ring structure. $R^{102}$ is a fluorinated alkyl group having 1 to 5 carbon atoms or a fluorine atom. $Y^{101}$ is a divalent linking group including an oxygen atom or a single bond. $V^{101}$ to $V^{103}$ are each independently a single bond, an alkylene group, or a fluorinated alkylene group. $L^{101}$ and $L^{102}$ are each independently a single bond or an oxygen atom. $L^{103}$ to $L^{105}$ are each independently a single bond, —CO—, or —SO$_2$—. m is an integer of 1 or more, and $M'^{m+}$ is an m-valent onium cation.]

{Anion Moiety}

Anion in Component (b-1)

In Formula (b-1), $R^{101}$ is a cyclic group which may have a substituent, a chain-like alkyl group which may have a substituent, or a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group means a hydrocarbon group that has no aromaticity. Further, the aliphatic hydrocarbon group may be saturated or unsaturated, and it is usually preferable that the aliphatic hydrocarbon group be saturated.

The aromatic hydrocarbon group in $R^{101}$ is a hydrocarbon group having an aromatic ring. The aromatic hydrocarbon group preferably has 3 to 30 carbon atoms, more preferably has 5 to 30 carbon atoms, still more preferably has 5 to 20 carbon atoms, particularly preferably has 6 to 15 carbon atoms, and most preferably 6 to 10 carbon atoms. It should be noted that the number of carbon atoms in a substituent is not included in the number of carbon atoms.

Specific examples of the aromatic ring contained in the aromatic hydrocarbon group in $R^{101}$ include benzene, fluorene, naphthalene, anthracene, phenanthrene, biphenyl, or an aromatic hetero ring obtained by substituting some of the carbon atoms constituting the aromatic ring with heteroatoms. Examples of the heteroatom in the aromatic hetero ring include an oxygen atom, a sulfur atom, and a nitrogen atom.

Specific examples of the aromatic hydrocarbon group in $R^{101}$ include a group obtained by removing one hydrogen atom from the aromatic ring (an aryl group: for example, a phenyl group or a naphthyl group) and a group obtained by substituting one hydrogen atom in the aromatic ring with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) preferably has 1 to 4 carbon atoms, more preferably has 1 or 2 carbon atoms, and particularly preferably has one carbon atom.

Examples of the cyclic aliphatic hydrocarbon group in $R^{101}$ include aliphatic hydrocarbon groups including a ring in a structure thereof.

Examples of the aliphatic hydrocarbon group including a ring in a structure thereof include an alicyclic hydrocarbon group (a group obtained by removing one hydrogen atom from an aliphatic hydrocarbon ring), a group obtained by bonding the alicyclic hydrocarbon group to a terminal of a linear or branched aliphatic hydrocarbon group, and a group obtained by interposing the alicyclic hydrocarbon group in a linear or branched aliphatic hydrocarbon group.

The alicyclic hydrocarbon group preferably has 3 to 20 carbon atoms, and more preferably has 3 to 12 carbon atoms.

The alicyclic hydrocarbon group may be a polycyclic group or a monocyclic group. As the monocyclic alicyclic hydrocarbon group, a group obtained by removing one or more hydrogen atoms from a monocycloalkane is preferable. The monocycloalkane preferably has 3 to 6 carbon atoms, and specific examples thereof include cyclopentane and cyclohexane. As the polycyclic alicyclic hydrocarbon group, a group obtained by removing one or more hydrogen atoms from a polycycloalkane is preferable, and the polycycloalkane preferably has 7 to 30 carbon atoms. Among these, the poly cycloalkane is preferably a polycycloalkane having a bridged ring polycyclic skeleton, such as adamantane, norbornane, isobornane, tricyclodecane, and tetracyclododecane; or a poly cycloalkane having a fused ring polycyclic skeleton, such as a cyclic group having a steroid skeleton.

Among those, as the cyclic aliphatic hydrocarbon group in $R^{101}$, a group obtained by removing one or more hydrogen atoms from a monocycloalkane or a poly cycloalkane is preferable, a group obtained by removing one hydrogen atom from a poly cycloalkane is more preferable, an adamantyl group or a norbornyl group is particularly preferable, and an adamantyl group is the most preferable.

The linear aliphatic hydrocarbon group which may be bonded to the alicyclic hydrocarbon group preferably has 1 to 10 carbon atoms, more preferably has 1 to 6 carbon atoms, still more preferably has 1 to 4 carbon atoms, and most preferably has 1 to 3 carbon atoms. The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group which may be bonded to the alicyclic hydrocarbon group preferably has 2 to 10 carbon atoms, more preferably has 3 to 6 carbon atoms, still more preferably has 3 or 4 carbon atoms, and most preferably has 3 carbon atoms. As the branched aliphatic hydrocarbon group, a branched alkylene group is preferable, and specific examples thereof include an alkylalkylene group, for example, an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; an alkyltrimethylene group such as —$CH(CH_3)CH_2CH_2$—, and —$CH_2CH(CH_3)CH_2$—; and an alkyltetramethylene group such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Furthermore, the cyclic hydrocarbon group in $R^{101}$ may contain a heteroatom such as a hetero ring. Specific examples thereof include the lactone-containing cyclic groups each represented by General Formulae (a2-r-1) to (a2-r-7), the —$SO_2$-containing cyclic groups each represented by General Formulae (a5-r-1) to (a5-r-4), and other heterocyclic groups each represented by Chemical Formulae (r-hr-1) to (r-hr-16). * in the formula represents a bond that binds to $Y^{101}$ in Formula (b-1).

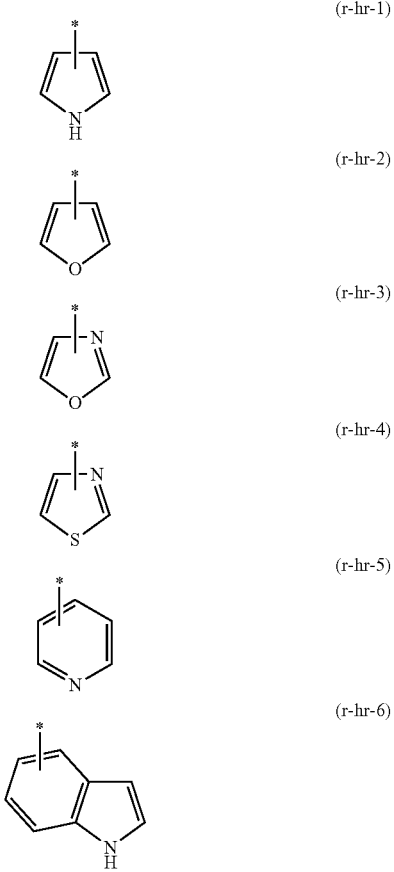

(r-hr-7) 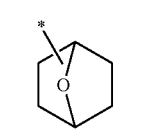

(r-hr-8) 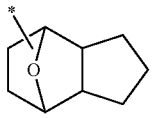

(r-hr-9) 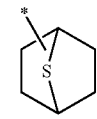

(r-hr-10) 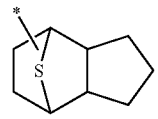

(r-hr-11) 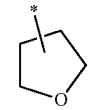

(r-hr-12) 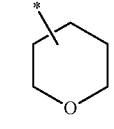

(r-hr-13) 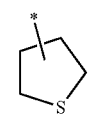

(r-hr-14) 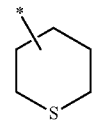

(r-hr-15) 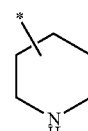

(r-hr-16) 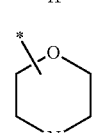

Examples of the substituent in the cyclic group of $R^{101}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is the most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

As the halogen atom as the substituent, a fluorine atom is preferable.

Example of the halogenated alkyl group as the substituent includes a group obtained by substituting some or all of the hydrogen atoms in an alkyl group having 1 to carbon atoms such as a methyl group, an ethyl group, a propyl group, an n-butyl group, and a tert-butyl group with the halogen atoms.

The carbonyl group as the substituent is a group which is substituted for a methylene group (—CH$_2$—) constituting the cyclic hydrocarbon group.

The cyclic hydrocarbon group in $R^{101}$ may be a fused cyclic group including a fused ring in which an aliphatic hydrocarbon ring and an aromatic ring are fused. Examples of the fused ring include a poly cycloalkane having a polycyclic skeleton of a crosslinked ring-based in which one or more aromatic rings are fused. Specific examples of the crosslinked ring-based poly cycloalkane include bicycloalkanes such as bicyclo [2.2.1]heptane (norbornane) and bicyclo [2.2.2]octane. As the fused cyclic group, a group including a fused ring in which two or three aromatic rings are fused with bicycloalkane is preferable, and a group including a fused ring in which two or three aromatic rings are fused with bicyclo[2.2.2]octane is more preferable. Specific examples of the fused cyclic group in $R^{101}$ include those represented by Formulae (r-br-1) to (r-br-2). * in the formula represents a bond that binds to $Y^{101}$ in Formula (b-1).

(r-br-1) 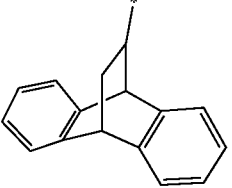

(r-br-2) 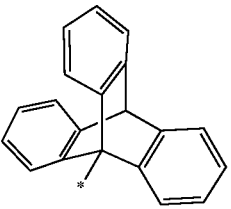

Examples of the substituent which may be contained in the fused cyclic group in $R^{101}$ include an alkyl group, an alkoxy group, a halogen atom, a halogenated alkyl group, a hydroxyl group, a carbonyl group, a nitro group, an aromatic hydrocarbon group, and an alicyclic hydrocarbon group.

Examples of the alkyl group, the alkoxy group, the halogen atom, and the halogenated alkyl group as the substituent of the fused cyclic group include the same as those mentioned as the substituent of the cyclic group in $R^{101}$.

Examples of the aromatic hydrocarbon group as the substituent of the fused cyclic group include a group obtained by removing one hydrogen atom from the aromatic ring (an aryl group such as a phenyl group or a naphthyl group), a group obtained by substituting one hydrogen atom in the aromatic ring with an alkylene group (for example, an arylalkyl group such as a benzyl group, a phenethyl group, a 1-naphthylmethyl group, a 2-naphthylmethyl group, a 1-naphthylethyl group, and a 2-naphthylethyl group), and the heterocyclic group each represented by Formulae (r-hr-1) to (r-hr-6).

Examples of the alicyclic hydrocarbon group as the substituent of the fused cyclic group include a group obtained by removing one hydrogen atom from a monocycloalkane such as cyclopentane and cyclohexane; a group obtained by removing one hydrogen atom from a polycycloalkane such as adamantane, norbornane, isobornane, tricyclodecane, tetracyclododecane; the lactone-containing cyclic groups each represented by General Formulae (a2-r-1) to (a2-r-7); the —SO$_2$-containing cyclic groups each represented by General Formulae (a5-r-1) to (a5-r-4); and the heterocyclic groups each represented by Formulae (r-hr-7) to (r-hr-16).

Chain-like alkyl group which may have substituent:
The chain-like alkyl group of $R^{101}$ may be linear or branched.

The linear alkyl group preferably has 1 to 20 carbon atoms, more preferably has 1 to 15 carbon atoms, and most preferably has 1 to 10 carbon atoms.

The branched alkyl group preferably has 3 to 20 carbon atoms, more preferably has 3 to 15 carbon atoms, and most preferably has 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-like alkenyl group which may have substituent:
A chain-like alkenyl group of $R^{101}$ may be linear or branched, and the group preferably has 2 to 10 carbon atoms, more preferably has 2 to 5 carbon atoms, still more preferably has 2 to 4 carbon atoms, and particularly preferably has 3 carbon atoms. Examples of the linear alkenyl group include a vinyl group, a 1-propenyl group, a 2-propenyl group (allyl group), and a butynyl group. Examples of the branched alkenyl group include a 1-methylvinyl group, a 1-methylpropenyl group, and a 2-methylpropenyl group.

Among these, as the chain-like alkenyl group, the linear alkenyl group is preferable, the vinyl group or the propenyl group is more preferable, and the vinyl group is particularly preferable.

Examples of the substituent for the chain-like alkyl group or alkenyl group of $R^{101}$ include an alkoxy group, a halogen atom, a halogenated alkyl group, a hydroxyl group, a carbonyl group, a nitro group, an amino group, and the cyclic groups in $R^{101}$.

Among those examples, $R^{101}$ is preferably a cyclic group which may have a substituent, and more preferably a cyclic hydrocarbon group which may have a substituent. More specifically, a group obtained by removing one or more hydrogen atoms from a phenyl group, a naphthyl group, or a poly cycloalkane; the lactone-containing cyclic groups each represented by General Formulae (a2-r-1) to (a2-r-7); the —SO$_2$-containing cyclic groups each represented by General Formulae (a5-r-1) to (a5-r-4); and the like are preferable.

In Formula (b-1), $Y^{101}$ is a single bond or a divalent linking group including an oxygen atom.

In a case where $Y^{101}$ is a divalent linking group including an oxygen atom, $Y^{101}$ may contain an atom other than an oxygen atom. Examples of the atom other than an oxygen atom include a carbon atom, a hydrogen atom, a sulfur atom, and a nitrogen atom.

Examples of the divalent linking group including an oxygen atom include non-hydrocarbon oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and a combination of the non-hydrocarbon oxygen atom-containing linking group with an alkylene group. Furthermore, a sulfonyl group (—SO$_2$—) may be linked to the combination. Examples of the divalent linking group including an oxygen atom include linking groups each represented by General Formulae (y-a1-1) to (y-a1-7).

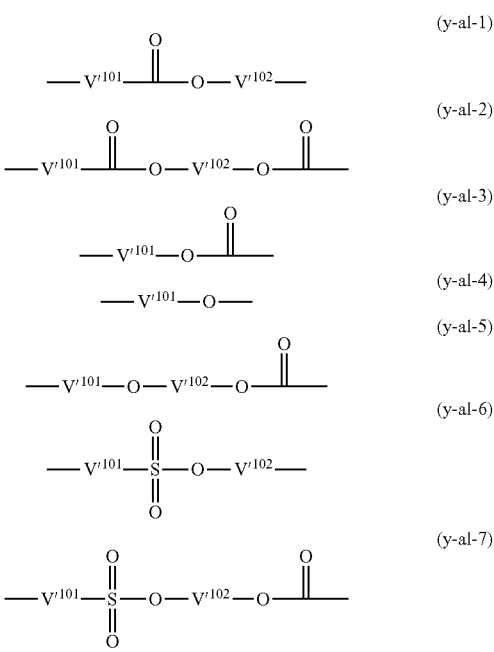

[In the formulae, $V'^{101}$ is a single bond or an alkylene group having 1 to 5 carbon atoms, and $V'^{102}$ is a divalent saturated hydrocarbon group having 1 to 30 carbon atoms.]

The divalent saturated hydrocarbon group in $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group in $V'^{101}$ and $V'^{102}$ may be a linear alkylene group or a branched alkylene group, and the linear alkylene group is preferable.

Specific examples of the alkylene group in $V'^{101}$ and $V'^{102}$ include a methylene group [—CH$_2$—]; an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, or —C(CH$_2$CH$_3$)$_2$—; an ethylene group [—CH$_2$CH$_2$—]; an alkylethylene group such as —CH(CH$_3$)CH$_2$—, —CH(CH$_3$)CH(CH$_3$)—, —C(CH$_3$)$_2$CH$_2$—, or —CH(CH$_2$CH$_3$)CH$_2$—; a trimethylene group (n-propylene group) [—CH$_2$CH$_2$CH$_2$—]; an alkyltrimethylene group such as —CH(CH$_3$)CH$_2$CH$_2$— or —CH$_2$CH(CH$_3$)CH$_2$—; a tetramethylene group [—CH$_2$CH$_2$CH$_2$CH$_2$—]; an alkyltetramethylene group such as —CH(CH$_3$)CH$_2$CH$_2$CH$_2$—, —CH$_2$CH(CH$_3$)CH$_2$CH$_2$—; and a pentamethylene group [—CH$_2$CH$_2$CH$_2$CH$_2$CH$_2$—].

Furthermore, a part of a methylene group in the alkylene group in V$'^{101}$ and V$'^{102}$ may be substituted with a divalent aliphatic cyclic group having 5 to 10 carbon atoms. The aliphatic cyclic group is preferably a divalent group obtained by removing one hydrogen atom from the cyclic aliphatic hydrocarbon group (a monocyclic aliphatic hydrocarbon group or a polycyclic aliphatic hydrocarbon group) as Ra'$^3$ in Formula (a1-r-1), and a cyclohexylene group, a 1,5-adamantylene group, or a 2,6-adamantylene group is more preferable.

As Y$^{101}$, a divalent linking group including an ester bond or a divalent linking group including an ether bond is preferable, and the linking groups each represented by Formulae (y-a1-1) to (y-a1-5) are more preferable.

In Formula (b-1), V$^{101}$ is a single bond, an alkylene group, or a fluorinated alkylene group. The alkylene group and the fluorinated alkylene group in V$^{101}$ each preferably have 1 to 4 carbon atoms. Examples of the fluorinated alkylene group in V$^{101}$ include a group obtained by substituting some or all of the hydrogen atoms in the alkylene group in V$^{101}$ with fluorine atoms. Among these, V$^{101}$ is preferably the single bond or the fluorinated alkylene group having 1 to 4 carbon atoms.

In Formula (b-1), R$^{102}$ is a fluorine atom or a fluorinated alkyl group having 1 to carbon atoms. R$^{102}$ is preferably the fluorine atom or the perfluoroalkyl group having 1 to 5 carbon atoms, and more preferably the fluorine atom.

Specific examples of the anion moiety represented by Formula (b-1) include fluorinated alkylsulfonate anions such as a trifluoromethanesulfonate anion and a perfluorobutanesulfonate anion in a case where Y$^{101}$ is a single bond; and an anion represented by any of Formulae (an-1) to (an-3) in a case where Y$^{101}$ is a divalent linking group including an oxygen atom.

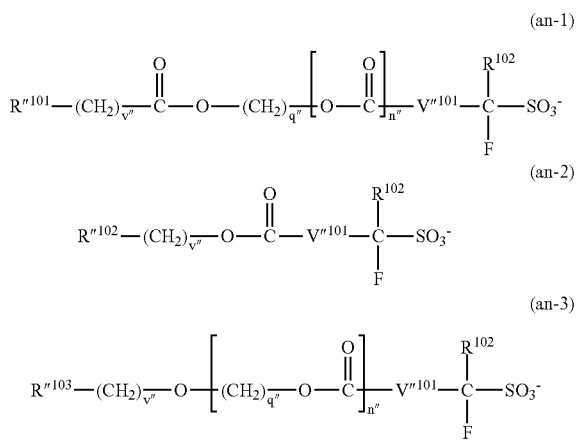

[In the formula, R$'''^{101}$ is an aliphatic cyclic group which may have a substituent, the monovalent heterocyclic group represented by each of Chemical Formulae (r-hr-1) to (r-hr-6), the fused cyclic group represented by Formula (r-br-1) or (r-br-2), or a chain-like alkyl group which may have a substituent. R$'''^{102}$ is an aliphatic cyclic group which may have a substituent, the fused cyclic group represented by Formula (r-br-1) or (r-br-2), the lactone-containing cyclic group represented by each of General Formulae (a2-r-1), and (a2-r-3) to (a2-r-7), or the —SO$_2$-containing cyclic group represented by each of General Formulae (a5-r-1) to (a5-r-4). R$'''^{103}$ is an aromatic cyclic group which may have a substituent, an aliphatic cyclic group which may have a substituent, or a chain-like alkenyl group which may have a substituent. V$'''^{101}$ is a single bond, an alkylene group having 1 to 4 carbon atoms, or a fluorinated alkylene group having 1 to 4 carbon atoms. R$^{102}$ is a fluorine atom or a fluorinated alkyl group having 1 to 5 carbon atoms, v" are each independently an integer of 0 to 3, q" are each independently an integer of 0 to 20, and n" is 0 or 1.]

The aliphatic cyclic groups of R$'''^{101}$, R$'''^{102}$, and R$'''^{103}$ which may have a substituent are preferably the groups exemplified as the cyclic aliphatic hydrocarbon group in R$^{101}$ in Formula (b-1). Examples of the substituent include the same as those of the substituent which may substitute the cyclic aliphatic hydrocarbon group in R$^{101}$ in Formula (b-1).

The aromatic cyclic group which may have a substituent in R$'''^{103}$ is preferably the group exemplified as the aromatic hydrocarbon group in the cyclic hydrocarbon group represented by R$^{101}$ in Formula (b-1). Examples of the substituent include the same as those of the substituent which may substitute the aromatic hydrocarbon group in R$^{101}$ in Formula (b-1).

The chain-like alkyl group in R$'''^{101}$ which may have a substituent is preferably the group exemplified as the chain-like alkyl group represented by R$^{101}$ in Formula (b-1). The chain-like alkenyl group which may have a substituent in R$'''^{103}$ is preferably the group exemplified as the chain-like alkenyl group represented by R$^{101}$ in Formula (b-1).

Anion in Component (b-2)

In Formula (b-2), R$^{104}$ and R$^{105}$ are each independently a cyclic group which may have a substituent, a chain-like alkyl group which may have a substituent, or a chain-like alkenyl group which may have a substituent, and each has the same definition as that of R$^{101}$ in Formula (b-1). It should be noted that R$^{104}$ and R$^{105}$ may be bonded to each other to form a ring.

R$^{104}$ and R$^{105}$ are each preferably the chain-like alkyl group which may have a substituent, and more preferably a linear or branched alkyl group or a linear or branched fluorinated alkyl group.

The chain-like alkyl group preferably has 1 to 10 carbon atoms, more preferably has 1 to 7 carbon atoms, and still more preferably 1 to 3 carbon atoms. It is preferable that the number of carbon atoms in the chain-like alkyl group as R$^{104}$ and R$^{105}$ be small in the range of the number of carbon atoms since the solubility in a solvent for a resist is also excellent. Further, in the chain-like alkyl group as R$^{104}$ and R$^{105}$, it is preferable that the number of hydrogen atoms substituted with fluorine atoms be as large as possible since the acid strength increased and the transparency to high energy radiation of 250 nm or less or electron beams is improved. The proportion of fluorine atoms in the chain-like alkyl group, that is, the fluorination ratio is preferably 70% to 100% and more preferably 90% to 100%, and it is the most preferable that the chain-like alkyl group be a perfluoroalkyl group in which all the hydrogen atoms are substituted with fluorine atoms.

In Formula (b-2), V$^{102}$ and V$^{103}$ are each independently a single bond, an alkylene group, or a fluorinated alkylene group, and each has the same definition as that of V$^{101}$ in Formula (b-1).

In Formula (b-2), L$^{101}$ and L$^{102}$ are each independently a single bond or an oxygen atom.

Anion in the Component (b-3)

In Formula (b-3), R$^{106}$ to R$^{108}$ are each independently a cyclic group which may have a substituent or a chain-like alkyl group which may have a substituent or a chain-like alkenyl group which may have a substituent, and each has the same definition as that of $R^{101}$ in Formula (b-1).

In Formula (b-3), $L^{103}$ to $L^{105}$ are each independently a single bond, —CO—, or —SO$_2$—.

Among those, the anion of the component (b-1) is preferable as the anion moiety of the component (B). Among these, the anions represented by any of General Formulae (an-1) to (an-3) are more preferable, the anion represented by any of General Formula (an-1) or (an-2) is more preferable, and the anion represented by General Formula (an-2) is particularly preferable.

{Cation Moiety}

In Formulae (b-1), (b-2), and (b-3), $M'^{m+}$ represents an m-valent onium cation. Among those, a sulfonium cation and an iodonium cation are preferable, m is an integer of 1 or more.

Preferred examples of the cation moiety ($(M'^{m+})_{1/m}$) include an organic cation represented by each of General Formulae (ca-1) to (ca-5).

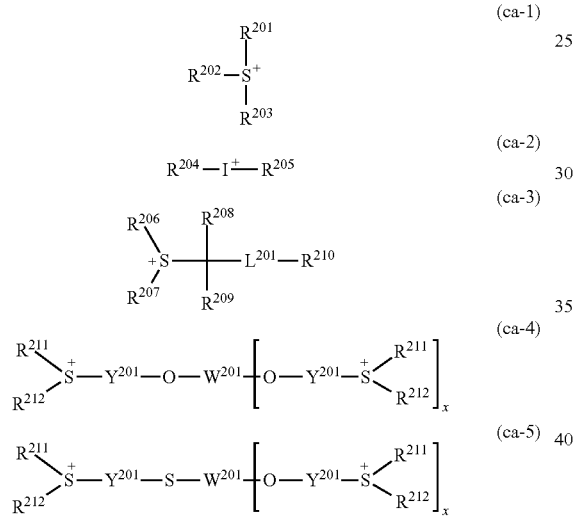

[In the formula, $R^{201}$ to $R^{207}$ and $R^{211}$ to $R^{212}$ each independently represents an aryl group, an alkyl group, or an alkenyl group, each of which may have a substituent. $R^{201}$ to $R^{203}$, $R^{206}$ to $R^{207}$, and $R^{211}$ to $R^{212}$ may be bonded to each other to form a ring together with the sulfur atoms in the formulae. $R^{208}$ and $R^{209}$ each independently represents a hydrogen atom or an alkyl group having 1 to 5 carbon atoms. $R^{210}$ represents an aryl group which may have a substituent, an alkyl group which may have a substituent, an alkenyl group which may have a substituent, or an —SO$_2$-containing cyclic group which may have a substituent. $L^{201}$ represents —C(=O)— or —C(=O)—O—. $Y^{201}$'s each independently represents an arylene group, an alkylene group, or an alkenylene group, x represents 1 or 2. $W^{201}$ represents an (x+1)-valent linking group.]

In General Formulae (ca-1) to (ca-5), examples of the aryl group in $R^{201}$ to $R^{207}$, $R^{211}$, and $R^{212}$ include an unsubstituted aryl group having 6 to 20 carbon atoms, and a phenyl group or a naphthyl group is preferable.

The alkyl group in $R^{201}$ to $R^{207}$, $R^{211}$, and $R^{212}$ is a chain-like or cyclic alkyl group, and the group preferably has 1 to 30 carbon atoms.

The alkenyl group as $R^{201}$ to $R^{207}$, $R^{211}$, and $R^{212}$ preferably has 2 to 10 carbon atoms.

Examples of the substituent which may be contained in $R^{201}$ to $R^{207}$ and $R^{210}$ to $R^{212}$ include an alkyl group, a halogen atom, a halogenated alkyl group, a carbonyl group, a cyano group, an amino group, an aryl group, and a group represented by each of General Formulae (ca-r-1) to (ca-r-7).

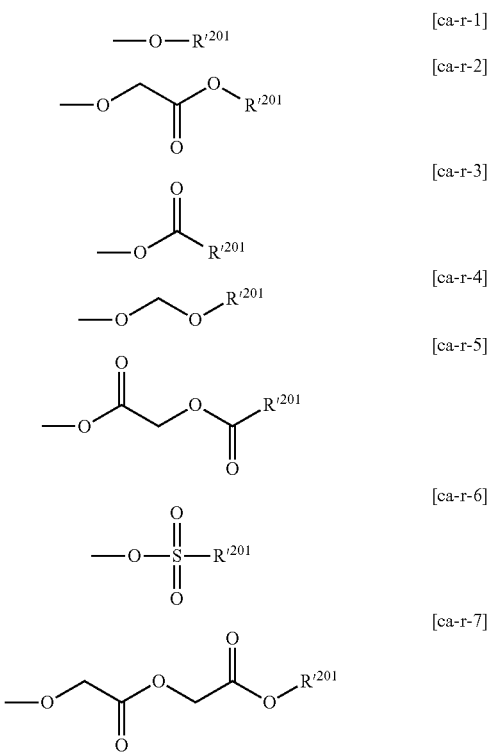

[In the formulae, $R'^{201}$ s are each independently a hydrogen atom, a cyclic group which may have a substituent, a chain-like alkyl group which may have a substituent, or a chain-like alkenyl group which may have a substituent.]

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group means a hydrocarbon group that has no aromaticity. Further, the aliphatic hydrocarbon group may be saturated or unsaturated, and it is usually preferable that the aliphatic hydrocarbon group be saturated.

The aromatic hydrocarbon group in $R'^{201}$ is a hydrocarbon group having an aromatic ring. The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. It should be noted that the number of carbon atoms in a substituent is not included in the number of carbon atoms.

Specific examples of the aromatic ring contained in the aromatic hydrocarbon group in $R'^{201}$ include benzene, fluorene, naphthalene, anthracene, phenanthrene, biphenyl, or an aromatic hetero ring obtained by substituting some of the carbon atoms constituting the aromatic ring with heteroatoms. Examples of the heteroatom in the aromatic hetero ring include an oxygen atom, a sulfur atom, and a nitrogen atom.

Specific examples of the aromatic hydrocarbon group in $R'^{201}$ include a group obtained by removing one hydrogen atom from the aromatic ring (an aryl group such as a phenyl group or a naphthyl group) and a group obtained by substituting one hydrogen atom in the aromatic ring with an alkylene group (for example, an arylalkyl group such as a benzyl group, a phenethyl group, a 1-naphthylmethyl group, a 2-naphthylmethyl group, a 1-naphthylethyl group, and a 2-naphthylethyl group). The alkylene group (an alkyl chain in the arylalkyl group) preferably has 1 to 4 carbon atoms, more preferably 1 or 2 carbon atoms, and particularly preferably one carbon atom.

Examples of the cyclic aliphatic hydrocarbon group in $R'^{201}$ include an aliphatic hydrocarbon group including a ring in a structure thereof.

Examples of the aliphatic hydrocarbon group including a ring in a structure thereof include an alicyclic hydrocarbon group (a group obtained by removing one hydrogen atom from an aliphatic hydrocarbon ring), a group obtained by bonding the alicyclic hydrocarbon group to a terminal of a linear or branched aliphatic hydrocarbon group, and a group obtained by interposing the alicyclic hydrocarbon group in a linear or branched aliphatic hydrocarbon group.

The alicyclic hydrocarbon group preferably has 3 to 20 carbon atoms, and more preferably has 3 to 12 carbon atoms.

The alicyclic hydrocarbon group may be a polycyclic group or a monocyclic group. As the monocyclic alicyclic hydrocarbon group, a group obtained by removing one or more hydrogen atoms from a monocycloalkane is preferable. The monocycloalkane preferably has 3 to 6 carbon atoms, and specific examples thereof include cyclopentane and cyclohexane. As the polycyclic alicyclic hydrocarbon group, a group obtained by removing one or more hydrogen atoms from a polycycloalkane is preferable, and the polycycloalkane preferably has 7 to 30 carbon atoms. Among these, the polycycloalkane is preferably a polycycloalkane having a bridged ring polycyclic skeleton, such as adamantane, norbornane, isobornane, tricyclodecane, and tetracyclododecane; or a polycycloalkane having a fused ring polycyclic skeleton, such as a cyclic group having a steroid skeleton.

Among those, as the cyclic aliphatic hydrocarbon group in $R'^{201}$, a group obtained by removing one or more hydrogen atoms from a monocycloalkane or a poly cycloalkane is preferable, a group obtained by removing one hydrogen atom from a poly cycloalkane is more preferable, an adamantyl group or a norbornyl group is particularly preferable, and an adamantyl group is the most preferable.

The linear or branched aliphatic hydrocarbon group which may be bonded to the alicyclic hydrocarbon group preferably has 1 to 10 carbon atoms, more preferably has 1 to 6 carbon atoms, still more preferably has 1 to 4 carbon atoms, and particularly preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

As the branched aliphatic hydrocarbon group, a branched alkylene group is preferable, and specific examples thereof include an alkylalkylene group, for example, an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; an alkyltrimethylene group such as —$CH(CH_3)CH_2CH_2$—, and —$CH_2CH(CH_3)CH_2$—; and an alkyltetramethylene group such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Furthermore, the cyclic hydrocarbon group in $R'^{201}$ may include a heteroatom, as in a hetero ring. Specific examples thereof include the lactone-containing cyclic group represented by each of General Formulae (a2-r-1) to (a2-r-7), the —$SO_2$-containing cyclic group represented by each of General Formulae (a5-r-1) to (a5-r-4), and other heterocyclic groups represented by each of Chemical Formulae (r-hr-1) to (r-hr-16).

Examples of the substituent for the cyclic group of $R'^{201}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is the most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

As the halogen atom as the substituent, a fluorine atom is preferable.

Example of the halogenated alkyl group as the substituent includes a group obtained by substituting some or all of the hydrogen atoms in an alkyl group having 1 to carbon atoms such as a methyl group, an ethyl group, a propyl group, an n-butyl group, and a tert-butyl group with the halogen atoms.

The carbonyl group as the substituent is a group which is substituted for a methylene group (—$CH_2$—) constituting the cyclic hydrocarbon group.

Chain-Like Alkyl Group which May have Substituent:

The chain-like alkyl group of $R'^{201}$ may be linear or branched.

The linear alkyl group preferably has 1 to 20 carbon atoms, more preferably has 1 to 15 carbon atoms, and most preferably has 1 to 10 carbon atoms.

The branched alkyl group preferably has 3 to 20 carbon atoms, more preferably has 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

The chain-like alkenyl group of $R'^{201}$ may be linear or branched, and preferably has 2 to 10 carbon atoms, more preferably 2 to 5 carbon atoms, still more preferably 2 to 4 carbon atoms, and particularly preferably 3 carbon atoms. Examples of the linear alkenyl group include a vinyl group, a 1-propenyl group, a 2-propenyl group (allyl group), and a butynyl group. Examples of the branched alkenyl group include a 1-methylvinyl group, a 1-methylpropenyl group, and a 2-methylpropenyl group.

Among these, as the chain-like alkenyl group, the linear alkenyl group is preferable, the vinyl group or the propenyl group is more preferable, and the vinyl group is particularly preferable.

Examples of the substituent for the chain-like alkyl group or alkenyl group of $R'^{201}$ include an alkoxy group, a halogen atom, a halogenated alkyl group, a hydroxyl group, a carbonyl group, a nitro group, an amino group, and the cyclic group in $R'^{201}$.

Examples of the cyclic group which may have a substituent, the chain-like alkyl group which may have a substituent, or the chain-like alkenyl group which may have a substituent of $R'^{201}$ include the same as those of the acid-dissociable group represented by Formula (a1-r-2) mentioned above as the cyclic group which may have a substituent or the chain-like alkyl group which may have a substituent, in addition to the above-mentioned groups.

Among those, $R'^{201}$ is preferably a cyclic group which may have a substituent, and more preferably a cyclic hydrocarbon group which may have a substituent. More specifically, a phenyl group, a naphthyl group, a group obtained by removing one or more hydrogen atoms from a poly cycloalkane; the lactone-containing cyclic group represented by each of General Formulae (a2-r-1) to (a2-r-7); the $—SO_2—$ containing cyclic group represented by each of General Formulae (a5-r-1) to (a5-r-4); or the like is preferable.

In General Formulae (ca-1) to (ca-5), $R^{201}$ to $R^{203}$, $R^{206}$ and $R^{207}$, and $R^{211}$ and $R^{212}$ are bonded to each other to form a ring with a sulfur atom in the formula, these groups may be bonded to one another via a heteroatom such as a sulfur atom, an oxygen atom, or a nitrogen atom, or a functional group such as a carbonyl group, $—SO—$, $—SO_2—$, $—SO_3—$, $—COO—$, $—CONH—$, or $—N(R_N)—$ (in which $R_N$ represents an alkyl group having 1 to 5 carbon atoms). As the ring to be formed, one ring including a sulfur atom in the formula in the ring skeleton thereof is preferably a 3- to 10-membered ring, and particularly preferably a 5- to 7-membered ring, including a sulfur atom. Specific examples of the ring to be formed include a thiophene ring, a thiazole ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

$R^{208}$ and $R^{209}$ each independently represents a hydrogen atom or an alkyl group having 1 to 5 carbon atoms, and are each preferably the hydrogen atom or an alkyl group having 1 to 3 carbon atoms, and in a case where $R^{208}$ and $R^{209}$ are each an alkyl group, the both may be bonded to each other to form a ring.

$R^{210}$ represents an aryl group which may have a substituent, an alkyl group which may have a substituent, an alkenyl group which may have a substituent, or an $—SO_2—$ containing cyclic group which may have a substituent.

Examples of the aryl group in $R^{210}$ include an unsubstituted aryl group having 6 to 20 carbon atoms, and a phenyl group or a naphthyl group is preferable.

As the alkyl group in $R^{210}$, a chain-like or cyclic alkyl group having 1 to 30 carbon atoms is preferable.

The alkenyl group as $R^{210}$ preferably has 2 to 10 carbon atoms.

As the $—SO_2—$ containing cyclic group which may have a substituent in $R^{210}$, a "$—SO_2—$ containing polycyclic group" is preferable, and the group represented by General Formula (a5-r-1) is more preferable.

$Y^{201}$'S each independently represents an arylene group, an alkylene group, or an alkenylene group.

Examples of the arylene group in $Y^{201}$ include a group obtained by removing one hydrogen atom from an aryl group exemplified as the aromatic hydrocarbon group represented by $R^{101}$ in Formula (b-1).

Examples of the alkylene group and alkenylene group in $Y^{201}$ include a group obtained by removing one hydrogen atom from the chain-like alkyl group or the chain-like alkenyl group in $R^{101}$ in Formula (b-1).

In Formula (ca-4), x represents 1 or 2.

$W^{201}$ represents an (x+1)-valent linking group, that is, a divalent or trivalent linking group.

As the divalent linking group represented by $W^{201}$, a divalent hydrocarbon group which may have a substituent is preferable, and examples thereof include a divalent hydrocarbon groups which may have a substituent, which is the same as that described above as $Ya^{21}$ in General Formula (a2-1). The divalent linking group in $W^{201}$ may be linear, branched, or cyclic, and is preferably cyclic. Among these, an arylene group having two carbonyl group combined with both the terminals is preferable. Examples of the arylene group include a phenylene group and a naphthylene group, and the phenylene group is particularly preferable.

Examples of the trivalent linking group in $W^{201}$ include a group obtained by removing one hydrogen atom from the divalent linking group in $W^{201}$ and a group obtained by bonding the divalent linking group to the divalent linking group. The trivalent linking group in $W^{201}$ is preferably a group obtained by bonding two carbonyl groups to an arylene group.

Suitable examples of the cations represented by Formula (ca-1) are shown below.

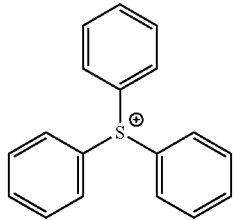

(ca-1-1)

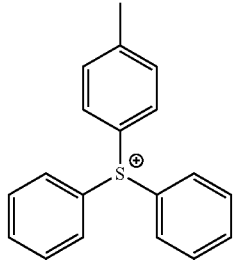

(ca-1-2)

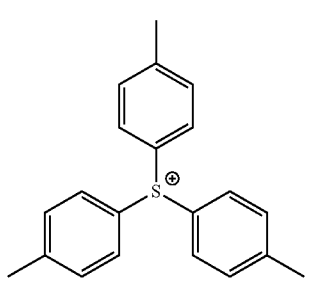

(ca-1-3)

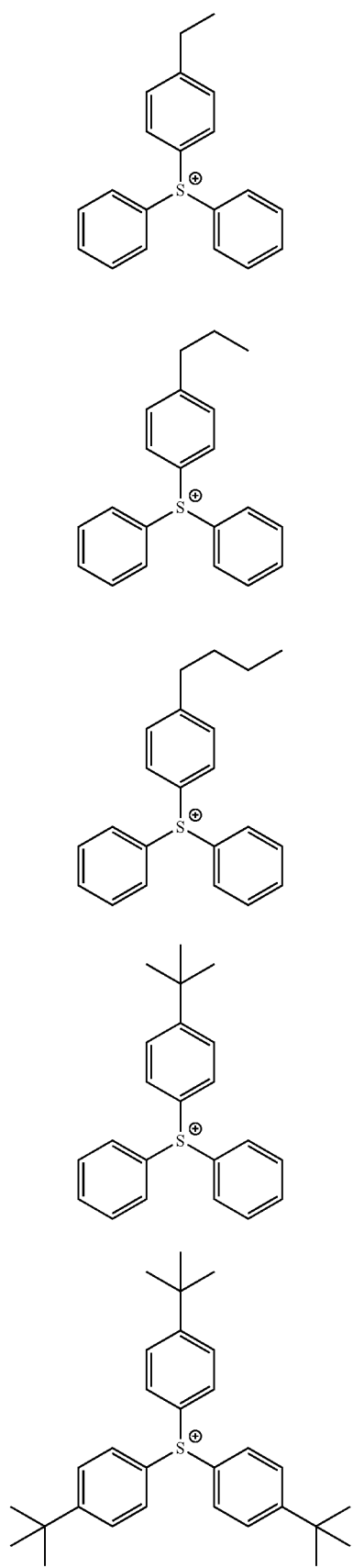
(ca-1-4)
(ca-1-5)
(ca-1-6)
(ca-1-7)
(ca-1-8)
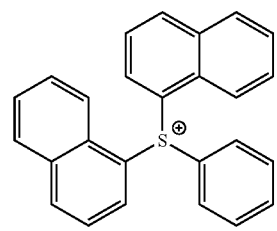
(ca-1-9)
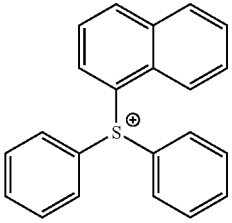
(ca-1-10)
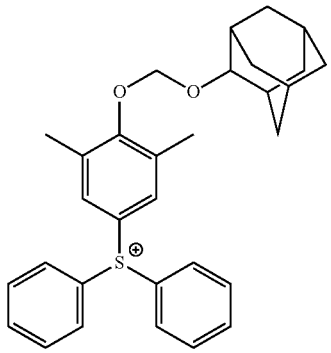
(ca-1-11)
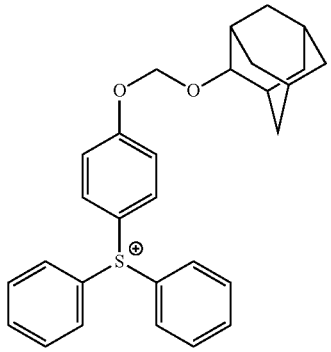
(ca-1-12)
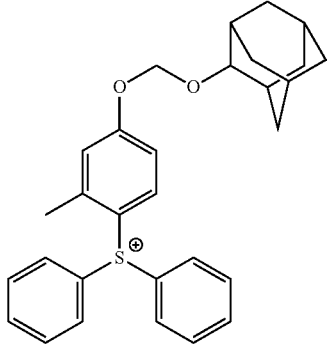
(ca-1-13)

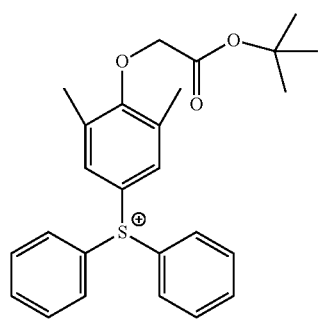 (ca-1-14)
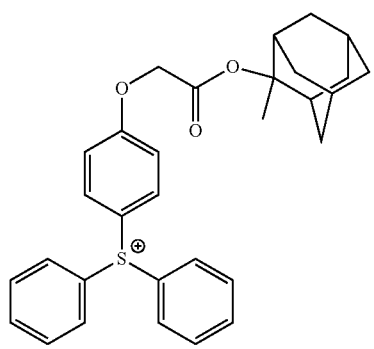 (ca-1-15)
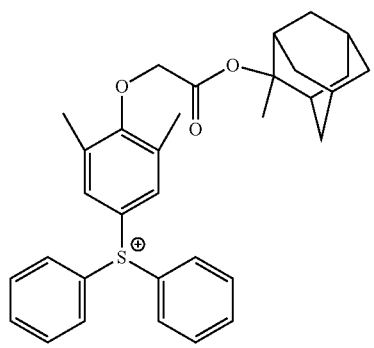 (ca-1-16)
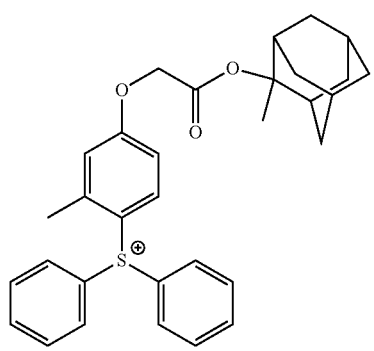 (ca-1-17)
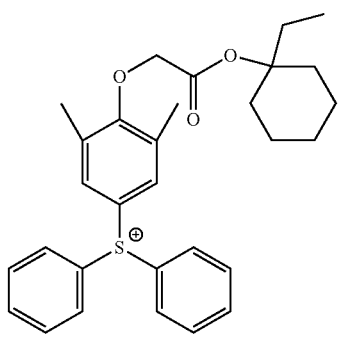 (ca-1-18)
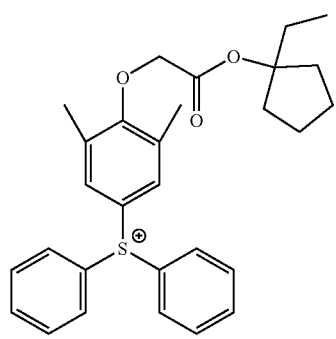 (ca-1-19)
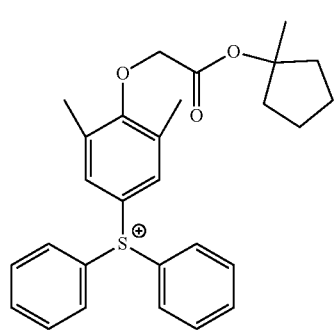 (ca-1-20)
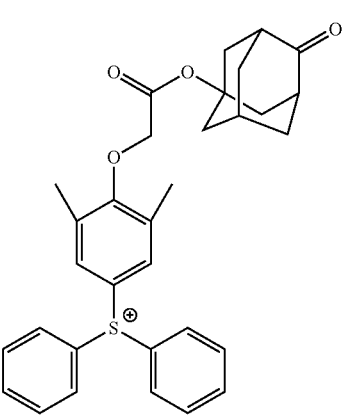 (ca-1-21)

(ca-1-22)
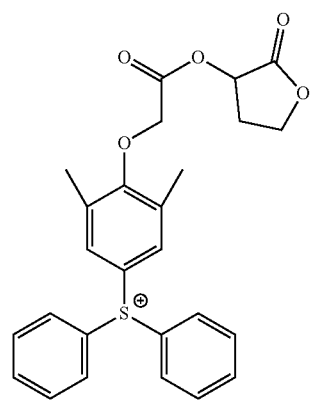
(ca-1-23)
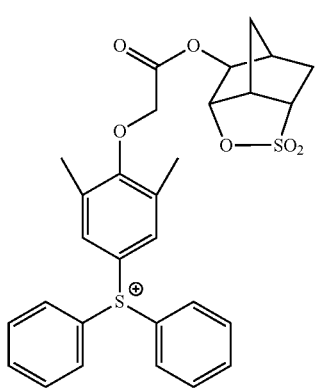
(ca-1-24)
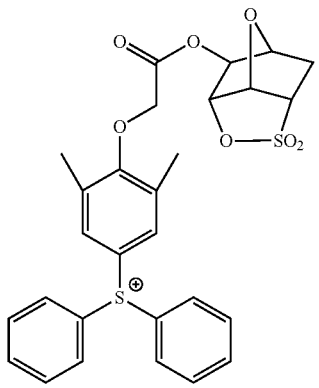
(ca-1-25)
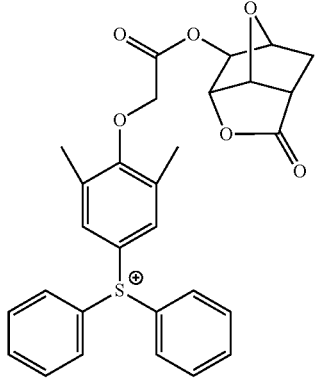
(ca-1-26)
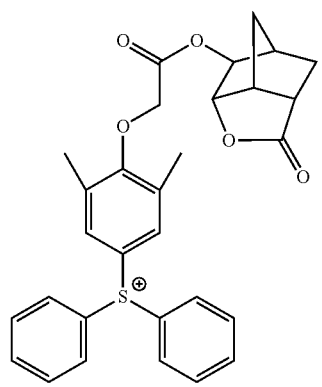
(ca-1-27)
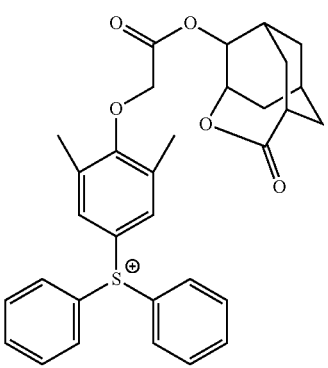
(ca-1-28)
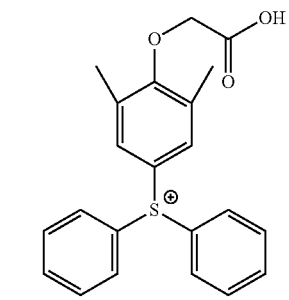
(ca-1-29)
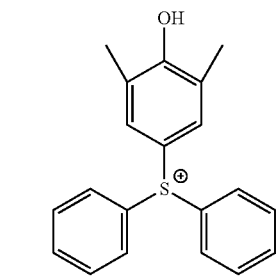
(ca-1-30)
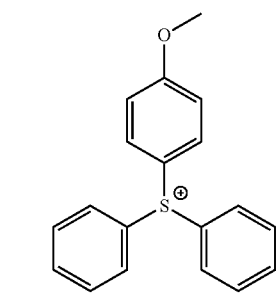

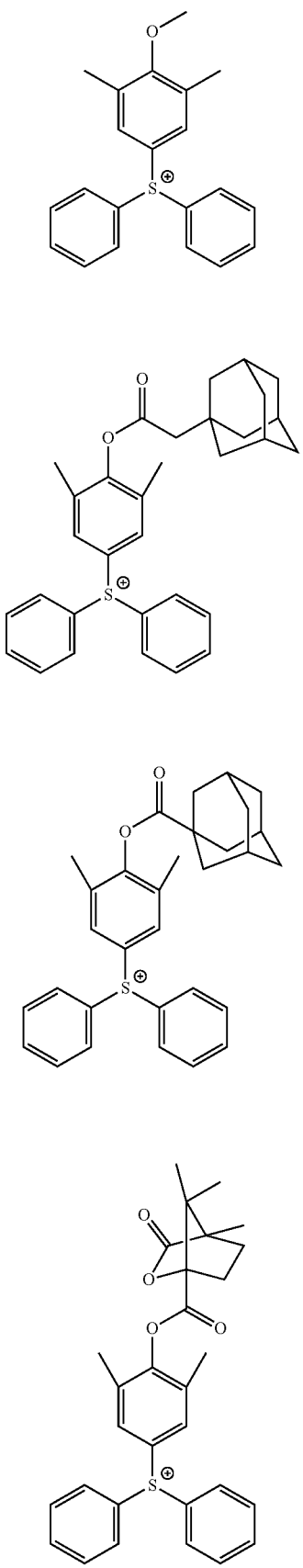
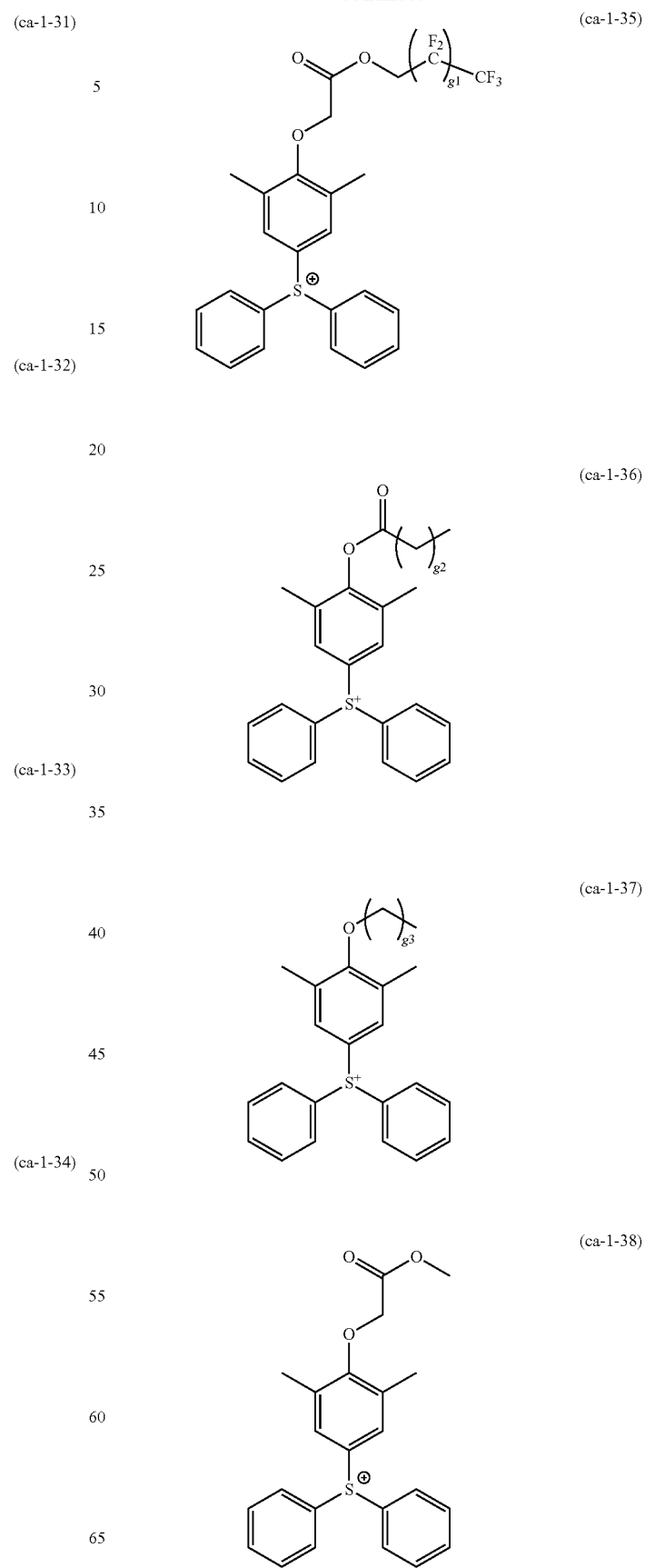

(ca-1-39) 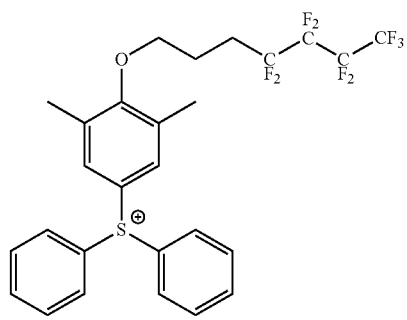
(ca-1-40) 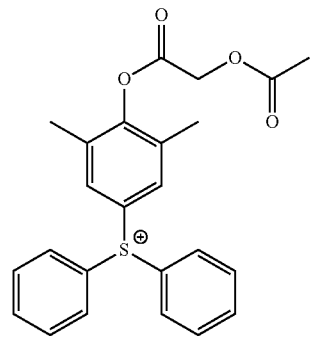
(ca-1-41) 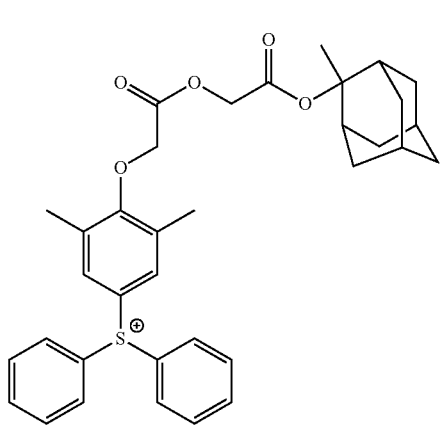
(ca-1-42) 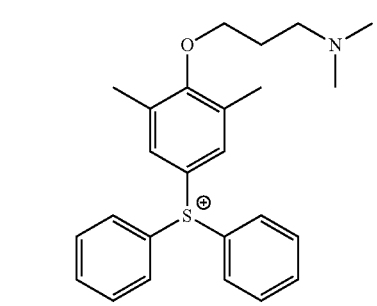
(ca-1-43) 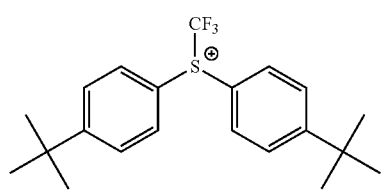
(ca-1-44) 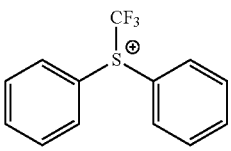
(ca-1-45) 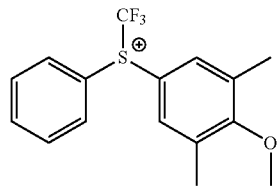
(ca-1-46) 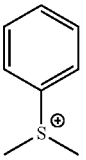
(ca-1-47) 
(ca-1-48) 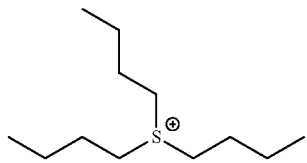
(ca-1-49) 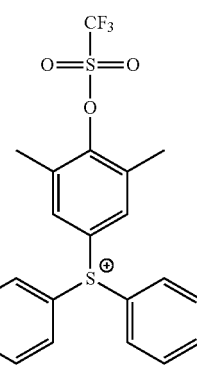
(ca-1-50) 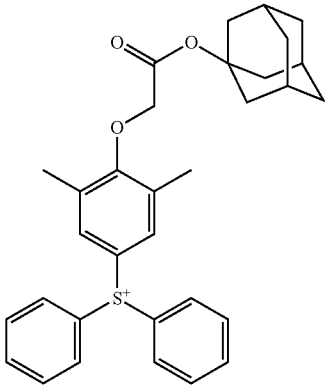

(ca-1-51)
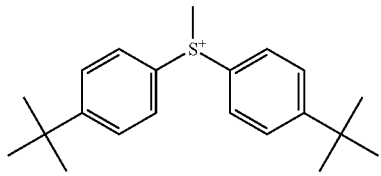
[In the formula, g1, g2, and g3 represent the numbers of repetitions, g1 is an integer of 1 to 5, g2 is an integer of 0 to 20, and g3 is an integer of 0 to 20.]
(ca-1-52)
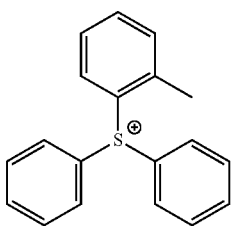
(ca-1-53)
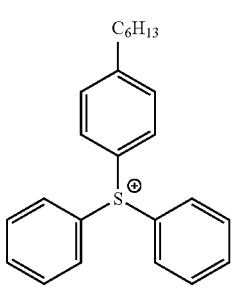
(ca-1-54)
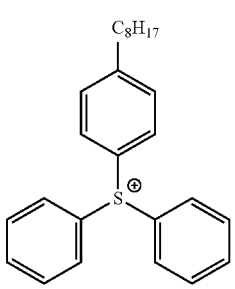
(ca-1-55)
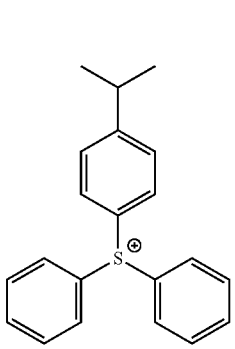
(ca-1-56)
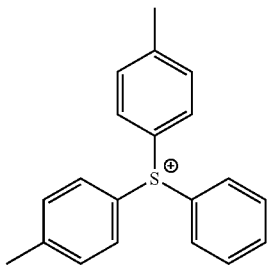
(ca-1-57)
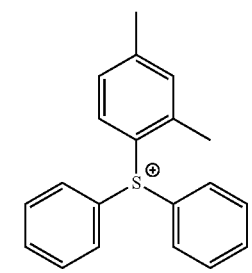
(ca-1-58)
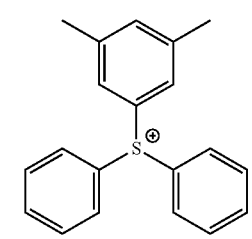
(ca-1-59)
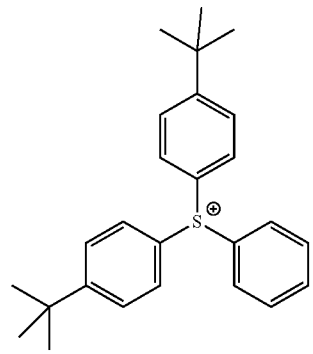
(ca-1-60)
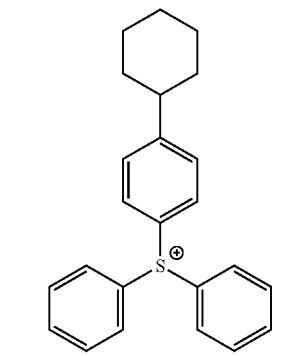

-continued
(ca-1-61)
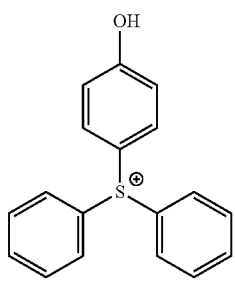
(ca-1-62)
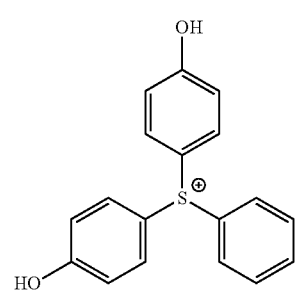
(ca-1-63)
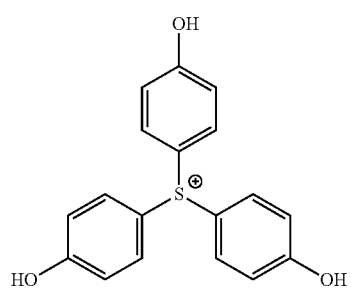
(ca-1-64)
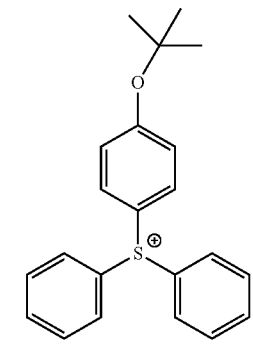
(ca-1-65)
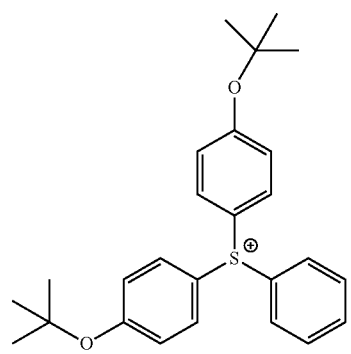
-continued
(ca-1-66)
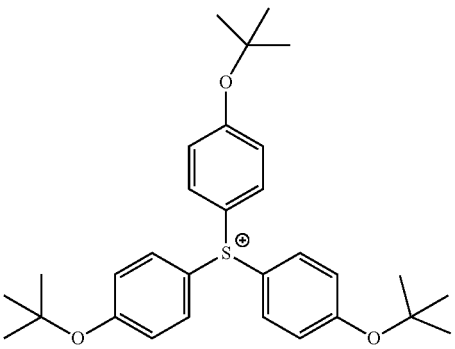
(ca-1-67)
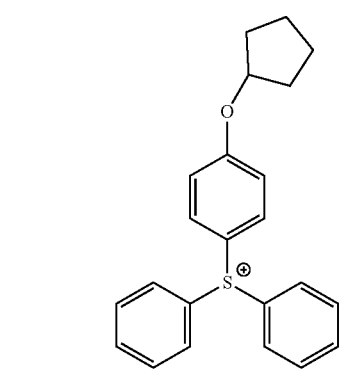
(ca-1-68)
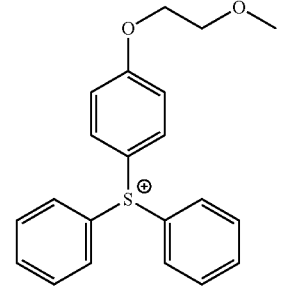
(ca-1-69)
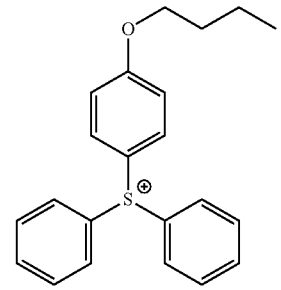
(ca-1-70)
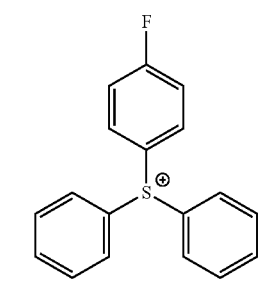

-continued
(ca-1-71)
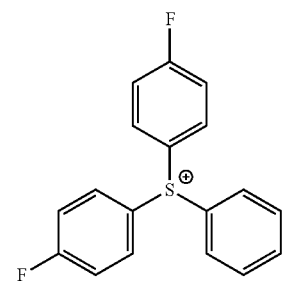
(ca-1-72)
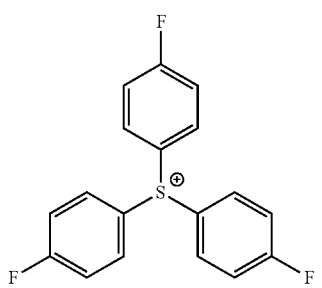
(ca-1-73)
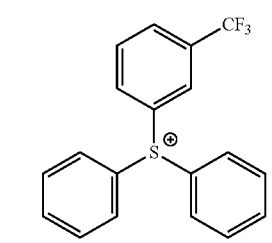
(ca-1-74)
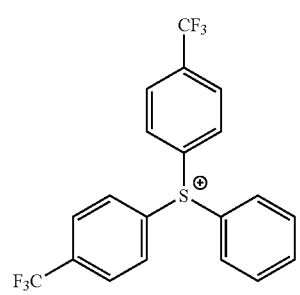
(ca-1-75)
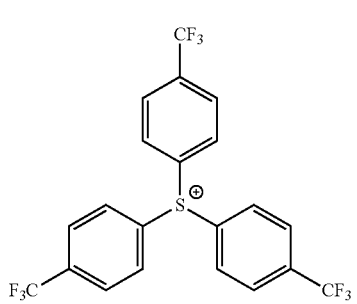
(ca-1-76)
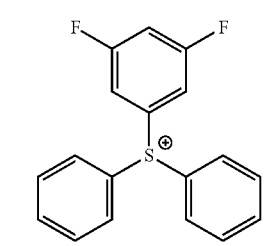
-continued
(ca-1-77)
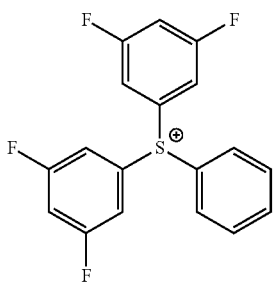
(ca-1-78)
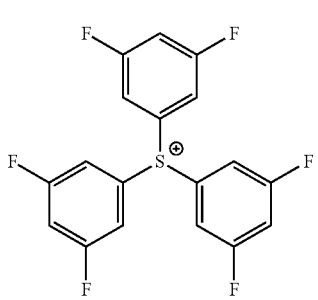
(ca-1-79)
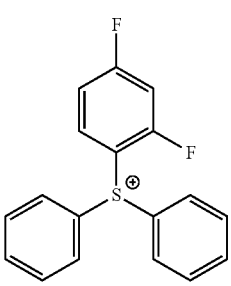
(ca-1-80)
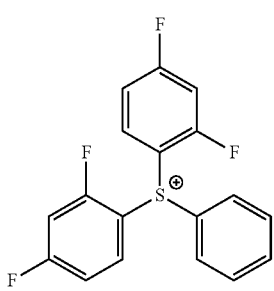
(ca-1-81)
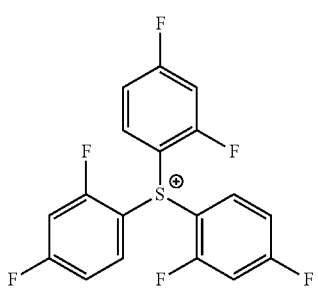

(ca-1-82)
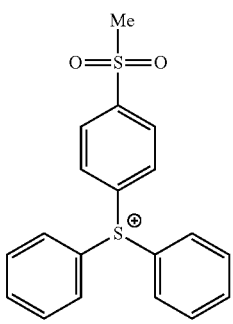
(ca-1-83)
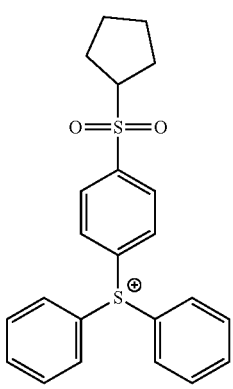
(ca-1-84)
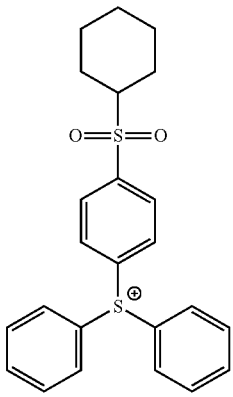
(ca-1-85)
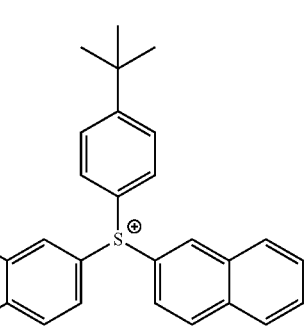
(ca-1-86)
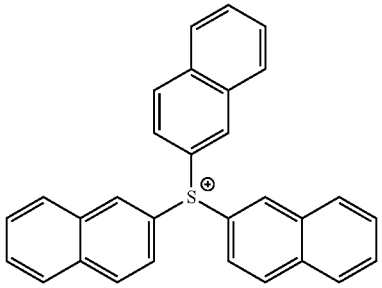
(ca-1-87)
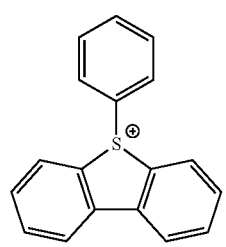
(ca-1-88)
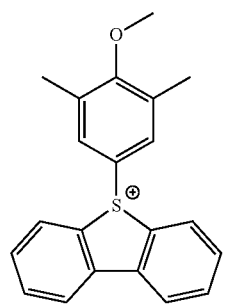
(ca-1-89)
(ca-1-90)
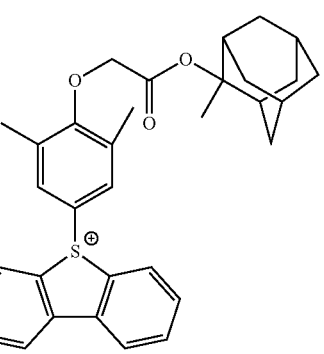

-continued
(ca-1-91)
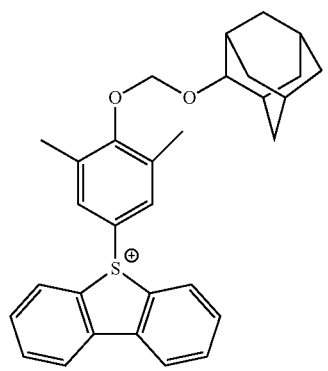
(ca-1-92)
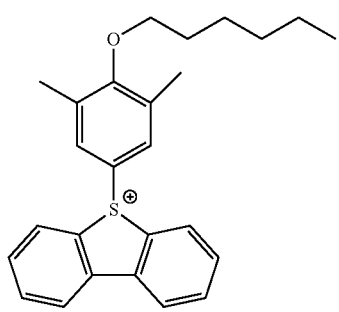
(ca-1-93)
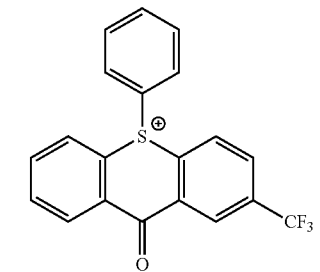
(ca-1-94)
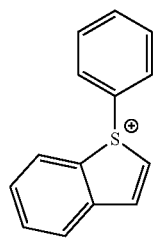
(ca-1-95)
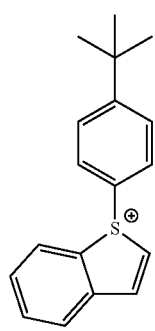
-continued
(ca-1-96)
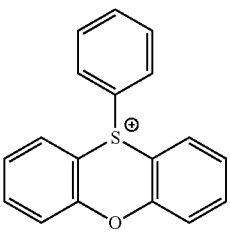
(ca-1-103)
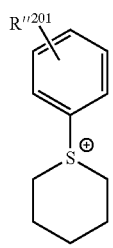
(ca-1-104)
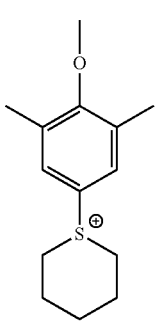
(ca-1-105)
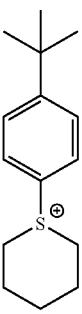
(ca-1-106)
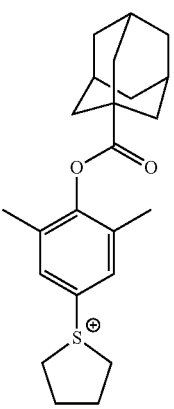

(ca-1-107)
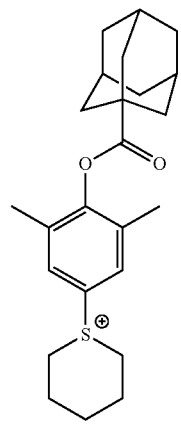
(ca-1-108)
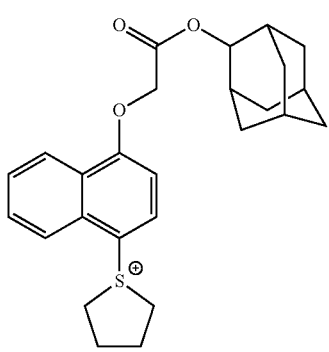
(ca-1-109)
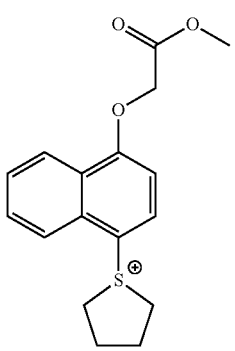
[In the formula, R″²⁰¹ represents a hydrogen atom or a substituent, and the substituent is the same as the substituent which may be contained in $R^{201}$ to $R^{207}$ and $R^{210}$ to $R^{212}$.]
(ca-1-110)
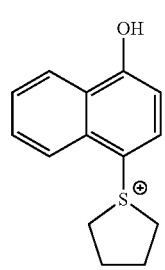
(ca-1-111)
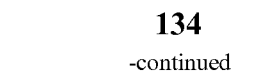
(ca-1-112)
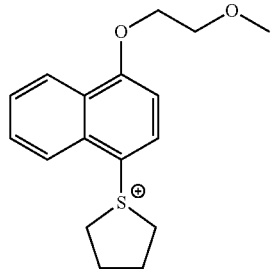
(ca-1-113)
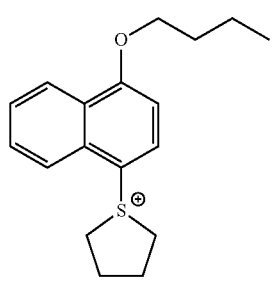
(ca-1-114)
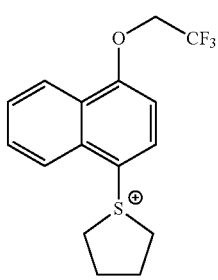
(ca-1-115)
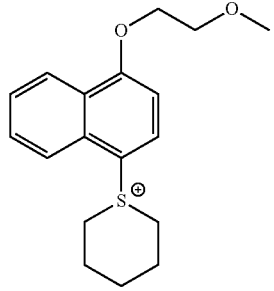

(ca-1-116)

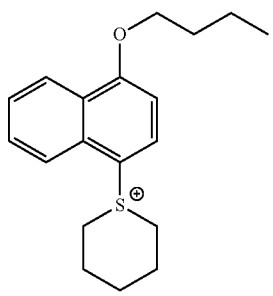

(ca-1-117)

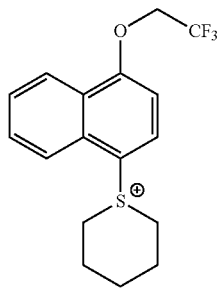

(ca-3-4)

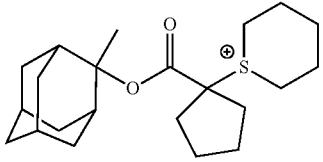

(ca-3-5)

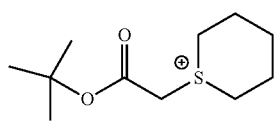

(ca-3-6)

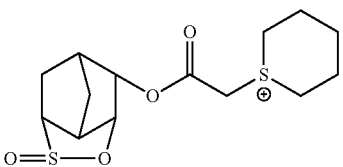

Specific examples of the suitable cation represented by Formula (ca-2) include a diphenyliodonium cation and a bis(4-tert-butylphenyl)iodonium cation.

Specific examples of the suitable cation represented by Formula (ca-3) include a cation represented by each of Formulae (ca-3-1) to (ca-3-6).

Specific examples of the suitable cation represented by Formula (ca-4) include a cation represented by each of Formulae (ca-4-1) and (ca-4-2).

(ca-3-1)

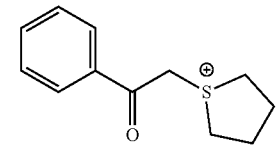

(ca-4-1)

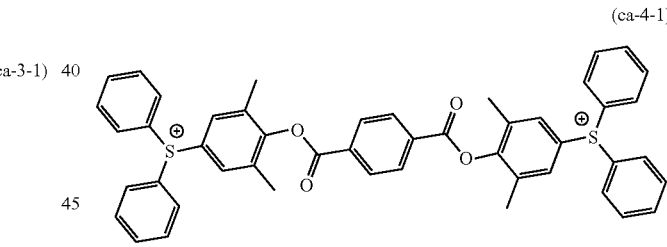

(ca-3-2)

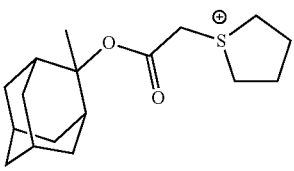

(ca-4-2)

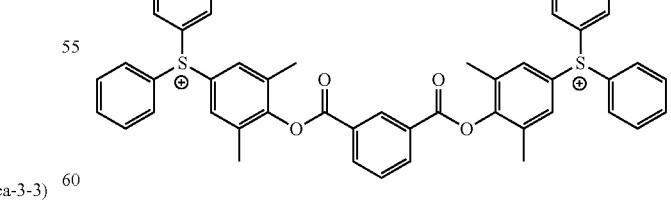

(ca-3-3)

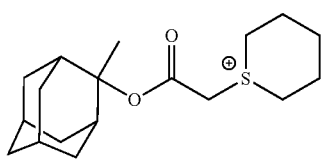

Specific examples of the suitable cation represented by Formula (ca-5) include a cation represented by each of General Formulae (ca-5-1) to (ca5-3).

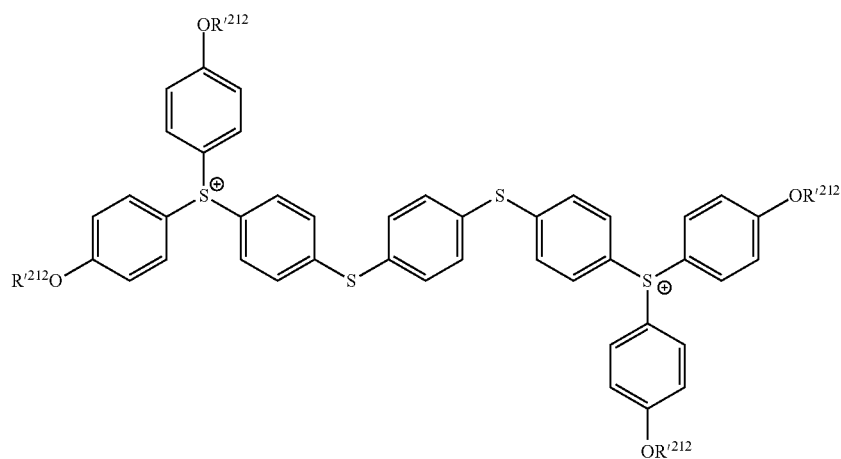

(ca-5-1)

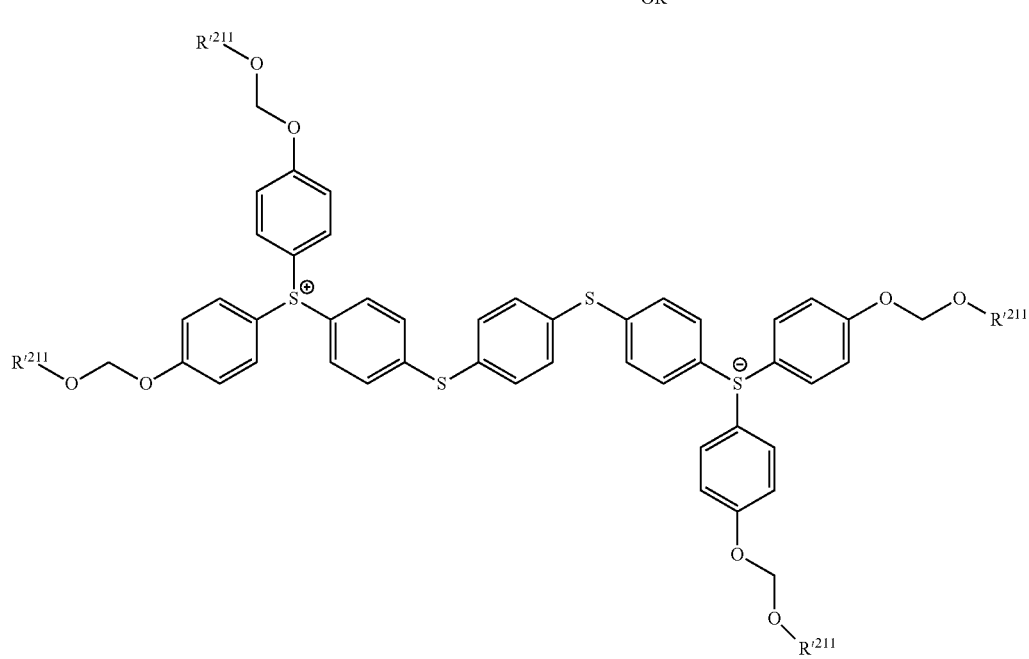

(ca-5-2)

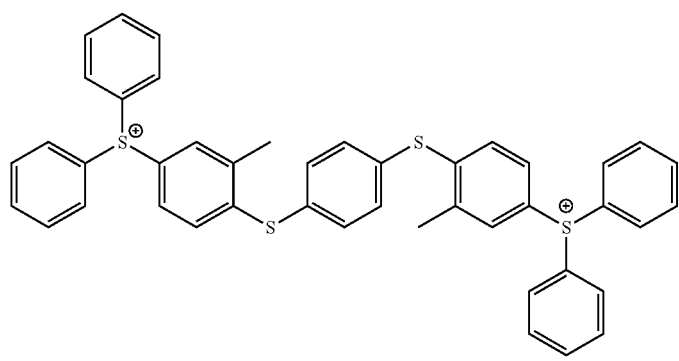

(ca-5-3)

In the resist composition of the present embodiment, the cation moiety of the component (B) is preferably an organic cation having an electron-withdrawing group in any of the organic cations represented by each of General Formulae (ca-1) to (ca-5).

In a case where the electron-withdrawing group is a fluorine atom or a fluorinated alkyl group, the number of fluorine atoms in the cation moiety of the component (B) is preferably 1 to 9, more preferably 2 to 6, and still more preferably 3 or 4.

The more fluorine atoms there are, the better the sensitivity, but in a case where it is equal to or lower than the upper limit of the preferred range, the solubility in a developing solution is maintained and the deterioration of roughness is easily suppressed.

In the resist composition of the present embodiment, the cation moiety of the component (B) is preferably a cation represented by General Formula (ca-1) among those as mentioned above. That is, the cations represented by any of Chemical Formulae (ca-1-1) to (ca-1-117) are preferable, and the cations represented by any of Chemical Formulae (ca-1-12) to (ca-1-96) are more preferable.

In the resist composition of the present embodiment, the component (B) is preferably the compound represented by General Formula (b-1-1) among those as mentioned above.

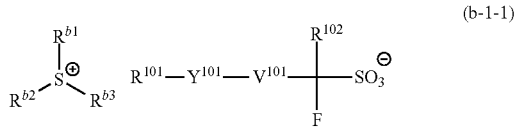

(b-1-1)

[In the formula, $R^{b1}$ to $R^{b3}$ each independently represents an aryl group which may have a substituent. Any two of $R^{b1}$ to $R^{b3}$ may be bonded to each other to form a ring together with a sulfur atom in the formula. $R^{101}$ is a cyclic group which may have a substituent, a chain-like alkyl group which may have a substituent, or a chain-like alkenyl group which may have a substituent. $R^{102}$ is a fluorinated alkyl group having 1 to 5 carbon atoms or a fluorine atom. $Y^{101}$ is a divalent linking group including an oxygen atom or a single bond. $V^{101}$ is a single bond or an oxygen atom.]

In Formula (b-1-1), $R^{101}$, $Y^{101}$, $V^{101}$, and $R^{102}$ are the same as $R^{101}$, $Y^{101}$, $V^{101}$, and $R^{102}$ in Formula (b-1), respectively.

$R^{b1}$ to $R^{b3}$ are each independently an aryl group which may have a substituent. Any two of $R^{b1}$ to $R^{b3}$ may be bonded to each other to form a ring together with a sulfur atom in the formula. The aryl group in $R^{b1}$ to $R^{b3}$ is the same as the aryl group in $R^{201}$ to $R^{203}$ of Formula (ca-1). The substituents which may be contained in the aryl group are the same as the substituent which may be contained in the aryl group in $R^{201}$ to $R^{203}$ of Formula (ca-1).

Examples of the ring formed by the mutual bonding of any two of $R^{b1}$ to $R^{b3}$ together with a sulfur atom in the formula include the ring formed by the mutual bonding of $R^{201}$ and $R^{203}$ of Formula (ca-1) together with a sulfur atom in the formula.

In the resist composition of the present embodiment, the component (B) may be used alone or in combination of two or more kinds thereof.

The content of the component (B) in the resist composition of the present embodiment is preferably less than 50 parts by mass, more preferably 1 to 40 parts by mass, and still more preferably 5 to 25 parts by mass, with respect to 100 parts by mass of the component (A).

In a case where the content of the component (B) is set to be in the preferred range described above, pattern formation can be satisfactorily performed. Further, in a case where each component of the resist composition is dissolved in an organic solvent, the above range is preferable since a uniform solution is easily obtained and the storage stability of the resist composition is improved.

<<Acid Diffusion-Controlling Agent Component (D)>>

The resist composition of the present embodiment may further contain, in addition to the components (A) and (F), an acid diffusion-controlling agent component (component (D)) that traps (that is, controls the diffusion of an acid) an acid generated by exposure. The component (D) acts as a quencher (acid diffusion controlling agent) which traps an acid generated in the resist composition by exposure. By incorporation of the component (D) into the resist composition, a contrast between the light-exposed portion and the unexposed area of a resist film can be further improved at the time of formation of a resist pattern.

Examples of the component (D) include a photodegradable base (D1) having an acid diffusion control activity (hereinafter referred to as the "component (D1)") which is lost through decomposition by exposure and a nitrogen-containing organic compound (D2) (hereinafter referred to as a "component (D2)") which does not correspond to the component (D1). Among these, the photodegradable base (component (D1)) is preferable since it is easy to enhance any of the characteristics of higher sensitivity, reduction in roughness, and suppression of coating defect generation.

With Regard to Component (D1)

By incorporation of the component (D1) into the resist composition, a contrast between the light-exposed portion and the unexposed area of a resist film can be further improved at the time of formation of a resist pattern.

The component (D1) is not particularly limited as long as it decomposes by exposure and loses the acid diffusion controllability, and one or more compounds selected from the group consisting of a compound represented by General Formula (d1-1) (hereinafter referred to as a "component (d1-1)"), a compound represented by General Formula (d1-2) (hereinafter referred to as a "component (d1-2)"), and a compound represented by General Formula (d1-3) (hereinafter referred to as a "component (d1-3)") are preferable.

In the light-exposed portion of the resist film, the components (d1-1) to (d1-3) decompose and then lose the acid diffusion controllability (basicity), and thus the components (d1-1) to (d1-3) cannot act as a quencher, whereas the components (d1-1) to (d1-3) act as a quencher in the unexposed area of the resist film.

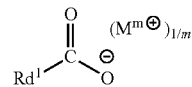

(d1-1)

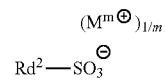

(d1-2)

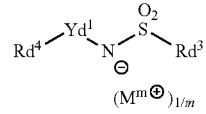

(d1-3)

[In the formulae, $Rd^1$ to $Rd^4$ each represents a cyclic group which may have a substituent, a chain-like alkyl group which may have a substituent, or a chain-like alkenyl group which may have a substituent. It should be noted that the carbon atom adjacent to the S atom in $Rd^2$ in Formula (d1-2) has no fluorine atom bonded thereto. $Yd^1$ represents a single bond or a divalent linking group, m is an integer of 1 or more, and $M^{m+}$'s are each independently an m-valent organic cation.]

{Component (d1-1)}

Anion Moiety

In Formula (d1-1), $Rd^1$ is a cyclic group which may have a substituent, a chain-like alkyl group which may have a substituent, or a chain-like alkenyl group which may have a substituent, and examples of each of the groups include the same as those of $R'^{201}$.

Among those, as Rd[1], an aromatic hydrocarbon group which may have a substituent, an aliphatic cyclic group which may have a substituent, or the chain-like alkyl group which may have a substituent is preferable. Examples of the substituent which may be contained in these groups include a hydroxyl group, an oxo group, an alkyl group, an aryl group, a fluorine atom, a fluorinated alkyl group, the lactone-containing cyclic groups each represented by General Formulae (a2-r-1) to (a2-r-7), an ether bond, an ester bond, or a combination thereof. In a case where the ether bond or the ester bond is included as the substituent, the substituent may be bonded via an alkylene group, and the linking groups each represented by each of Formulae (y-a1-1) to (y-a1-5) are preferable as the substituent.

Suitable examples of the aromatic hydrocarbon group include a phenyl group, a naphthyl group, and a polycyclic structure including a bicyclooctane skeleton (a polycyclic structure formed of a bicyclooctane skeleton and a ring structure other than the bicyclooctane skeleton).

As the aliphatic cyclic group, a group obtained by removing one or more hydrogen atoms from a polycycloalkane such as adamantane, norbornane, isobornane, tricyclodecane and tetracyclododecane is more preferable.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, and a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

In a case where the chain-like alkyl group is a fluorinated alkyl group having a fluorine atom or a fluorinated alkyl group as a substituent, the fluorinated alkyl group preferably has 1 to 11 carbon atoms, more preferably has 1 to 8 carbon atoms, and still more preferably 1 to 4 carbon atoms. The fluorinated alkyl group may contain an atom other than a fluorine atom. Examples of the atom other than a fluorine atom include an oxygen atom, a sulfur atom, and a nitrogen atom.

As Rd[1], a fluorinated alkyl group obtained by substituting some or all of the hydrogen atoms constituting a linear alkyl group with fluorine atoms is preferable, and a fluorinated alkyl group obtained by substituting all of the hydrogen atoms constituting a linear alkyl group with fluorine atoms (a linear perfluoroalkyl group) is particularly preferable.

Specific preferred examples of the anion moiety of the component (d 1-1) are shown below.

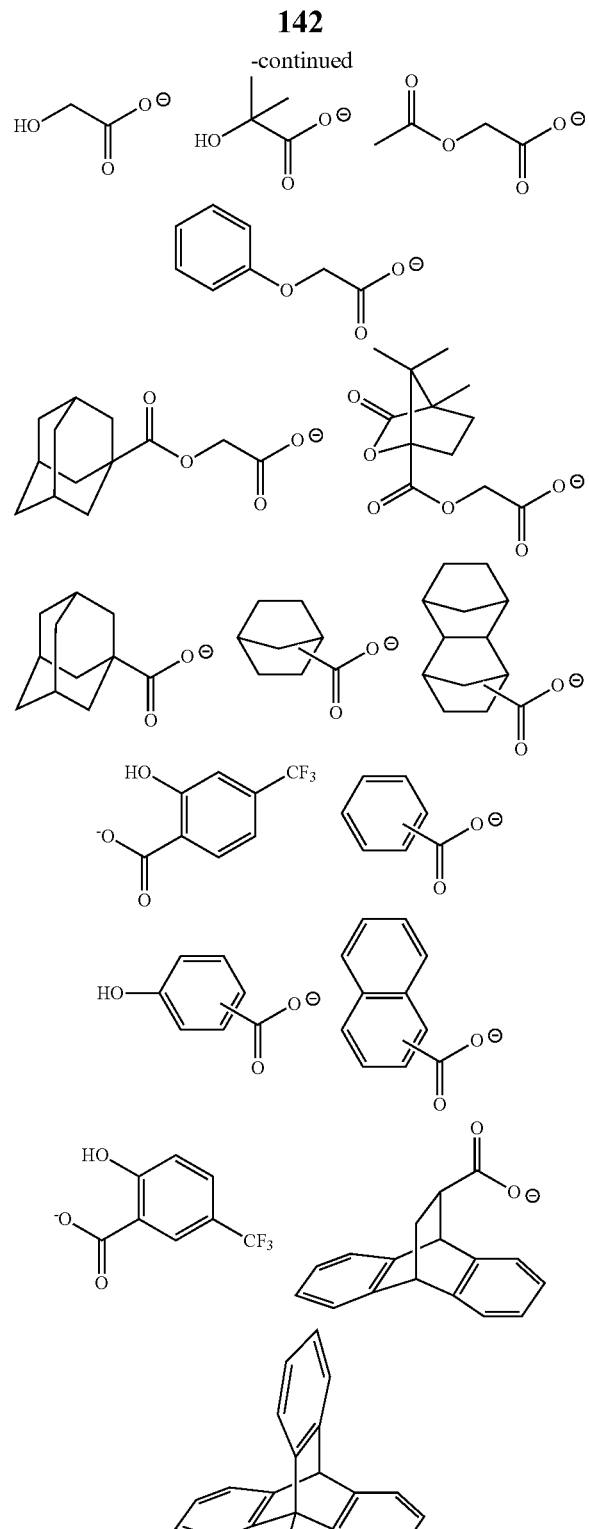

Cation Moiety

In Formula (d1-1), $M^{m+}$ represents an m-valent organic cation.

Suitable examples of the organic cation of $M^{m+}$ include the same as those of the cations represented by each of General Formulae (ca-1) to (ca-4), the cation represented by General Formula (ca-1) is preferable, and the cations represented by each of Formulae (ca-1-1) to (ca-1-84) are more preferable.

The component (d1-1) may be used alone or in combination of two or more kinds thereof.

{Component (d1-2)}

Anion Moiety

In Formula (d1-2), $Rd^2$ is a cyclic group which may have a substituent, a chain-like alkyl group which may have a substituent, or a chain-like alkenyl group which may have a substituent, and examples thereof include the same as those described above as $R'^{201}$.

It should be noted that the carbon atom adjacent to the S atom in $Rd^2$ has no fluorine atom bonded thereto (the carbon atom adjacent to the sulfur atom in $Rd^2$ is not substituted with a fluorine atom). As a result, the anion of the component (d1-2) serves as an appropriate weak acid anion, thereby improving the quenching ability of the component (D).

As $Rd^2$, a chain-like alkyl group which may have a substituent or an aliphatic cyclic group which may have a substituent is preferable. The chain-like alkyl group preferably has 1 to 10 carbon atoms, and more preferably has 3 to 10 carbon atoms. As the aliphatic cyclic group, a group obtained by removing one or more hydrogen atoms from adamantane, norbornane, isobornane, tricyclodecane, or tetracyclododecane (which may have a substituent) and a group obtained by removing one or more hydrogen atoms from camphor are more preferable.

The hydrocarbon group of $Rd^2$ may have a substituent, and examples of the substituent include the same as those of the substituent which may be contained in the hydrocarbon group (an aromatic hydrocarbon group, an aliphatic cyclic group, or a chain-like alkyl group) in $Rd^1$ of Formula (d1-1).

Specific preferred examples of the anion moiety of the component (d1-2) are shown below.

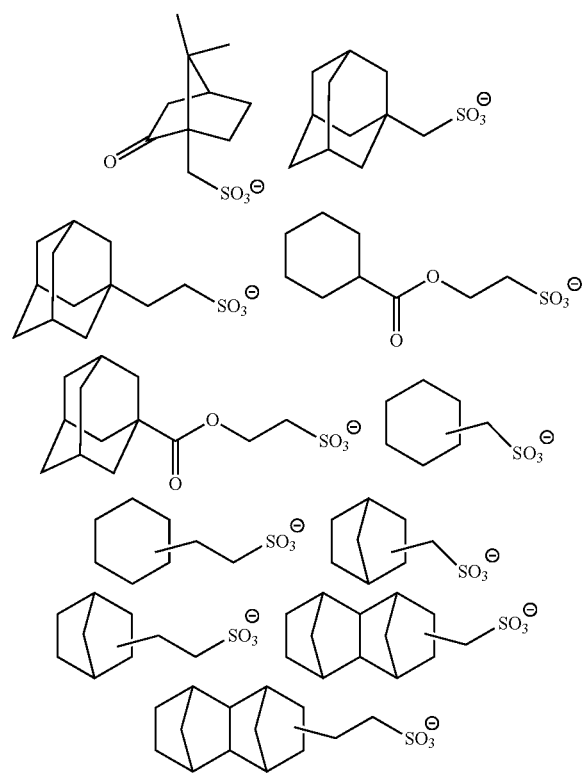

-continued

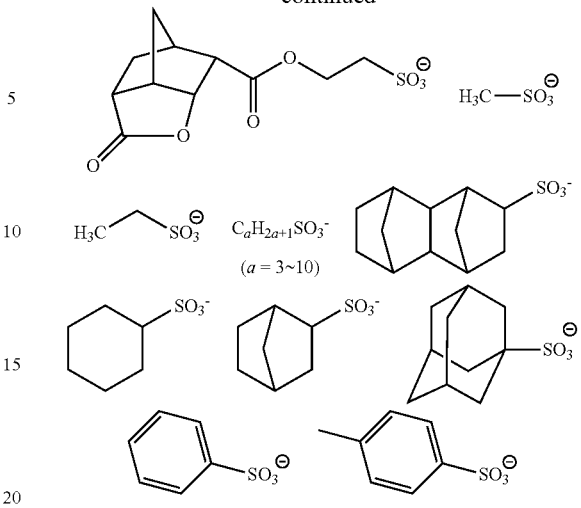

Cation Moiety

In Formula (d1-2), $M^{m+}$ represents an m-valent organic cation and has the same definition as $M^{m+}$ in Formula (d1-1).

The component (d1-2) may be used alone or in combination of two or more kinds thereof.

{Component (d1-3)}

Anion Moiety

In Formula (d1-3), $Rd^3$ is a cyclic group which may have a substituent, a chain-like alkyl group which may have a substituent, or a chain-like alkenyl group which may have a substituent, examples thereof include the same as those described above as $R'^{201}$, and a cyclic group containing a fluorine atom, the chain-like alkyl group, or the chain-like alkenyl group is preferable. Among these, a fluorinated alkyl group is preferable, and the same fluorinated alkyl groups as those described above as $Rd^1$ are more preferable.

In Formula (d1-3), $Rd^4$ is a cyclic group which may have a substituent, a chain-like alkyl group which may have a substituent, or a chain-like alkenyl group which may have a substituent, and examples thereof include the same as those described above as $R'^{201}$.

Among these, an alkyl group which may have a substituent, an alkoxy group which may have a substituent, an alkenyl group which may have a substituent, or a cyclic group which may have a substituent is preferable.

The alkyl group in $Rd^4$ is preferably a linear or branched alkyl group having 1 to carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. Some hydrogen atoms in the alkyl group of $Rd^4$ may be substituted with a hydroxyl group, a cyano group, or the like.

The alkoxy group in $Rd^4$ is preferably an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, the methoxy group or the ethoxy group is preferable.

Examples of the alkenyl group in $Rd^4$ include the same as those of the alkenyl group in $R'^{201}$, and a vinyl group, a propenyl group (an allyl group), a 1-methylpropenyl group, and a 2-methylpropenyl group are preferable. These groups may have an alkyl group having 1 to 5 carbon atoms or a halogenated alkyl group having 1 to 5 carbon atoms as a substituent.

Examples of the cyclic group as $Rd^4$ include the same groups as those of the cyclic group in $R'^{201}$, and among these, as the cyclic group, an alicyclic group obtained by removing one or more hydrogen atoms from a cycloalkane such as cyclopentane, cyclohexane, adamantane, norbornane, isobornane, tricyclodecane, or tetracyclododecane or an aromatic group such as a phenyl group or a naphthyl group is preferable. In a case where $Rd^4$ represents an alicyclic group, the resist composition can be satisfactorily dissolved in an organic solvent, thereby improving lithography characteristics. Further, in a case where $Rd^4$ is an aromatic group, the resist composition is excellent in light absorption efficiency, and thus has good sensitivity and lithography characteristics in lithography using EUV or the like as a light source for exposure.

In Formula (d1-3), $Yd^1$ represents a single bond or a divalent linking group.

The divalent linking group in $Yd^1$ is not particularly limited, and examples thereof include a divalent hydrocarbon group (an aliphatic hydrocarbon group or an aromatic hydrocarbon group) which may have a substituent and a divalent linking group including a heteroatom. Examples of the divalent linking groups each include the same as those of the divalent hydrocarbon group which may have a substituent and the divalent linking group including a heteroatom, each mentioned as the divalent linking group in $Ya^{21}$ in Formula (a2-1).

As $Yd^1$, a carbonyl group, an ester bond, an amide bond, an alkylene group, or a combination thereof is preferable. As the alkylene group, a linear or branched alkylene group is more preferable, and a methylene group or an ethylene group is still more preferable.

Specific preferred examples of the anion moiety of the component (d1-3) are shown below.

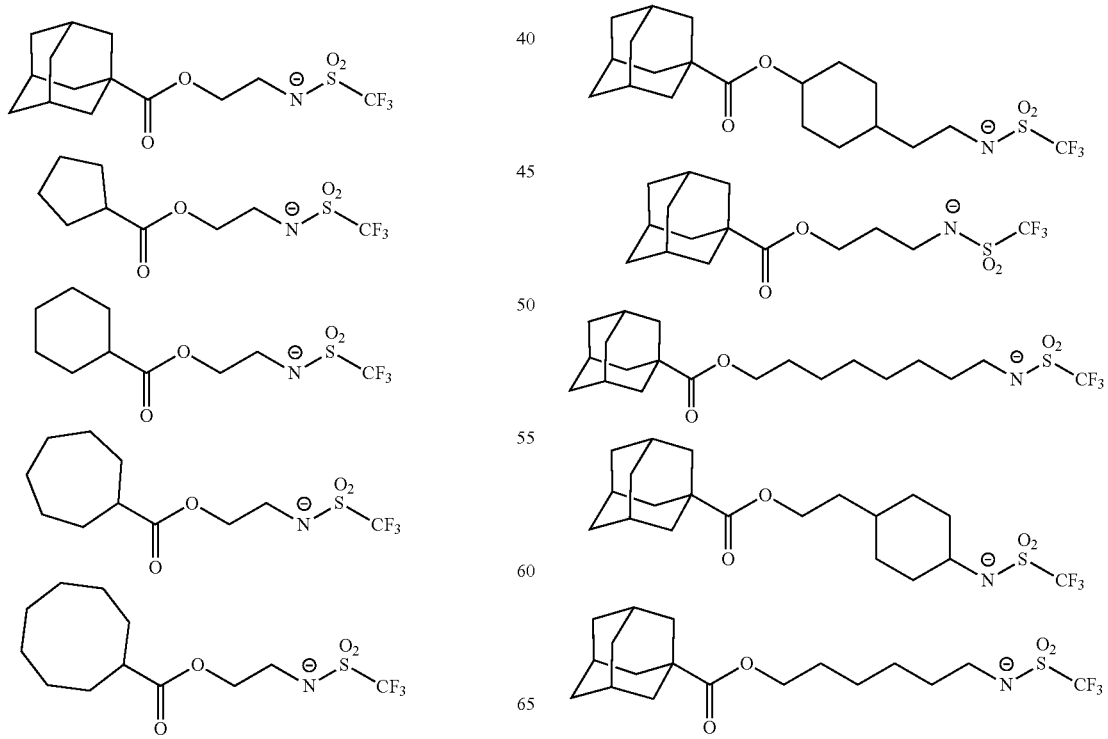

-continued

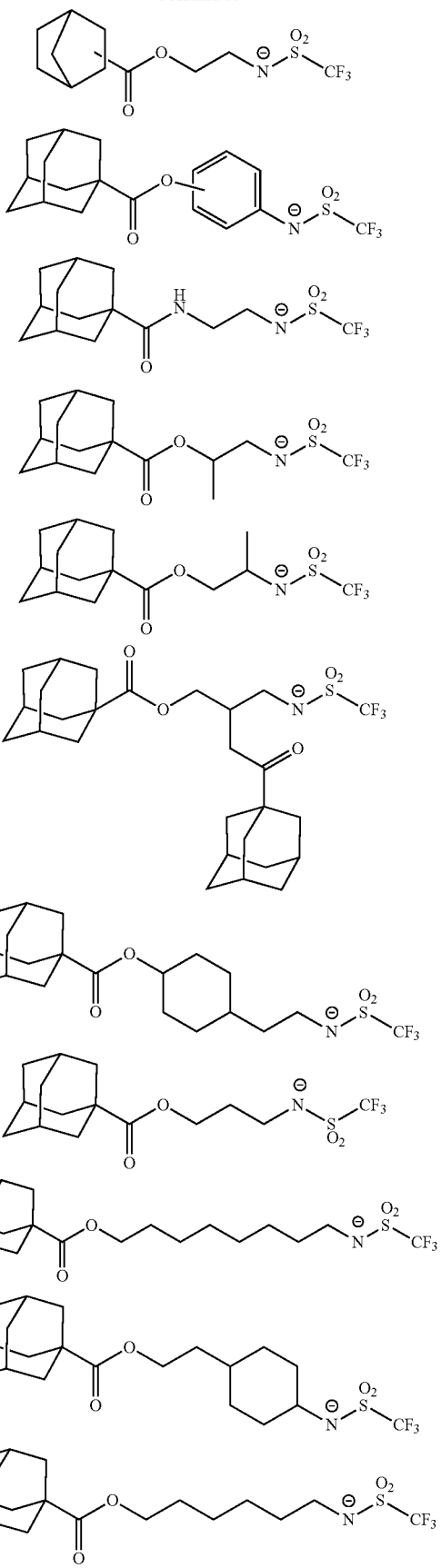

Cation Moiety

In Formula (d1-3), $M^{m+}$ represents an m-valent organic cation and has the same definition as $M^{m+}$ in Formula (d1-1).

The component (d1-3) may be used alone or in combination of two or more kinds thereof.

For the component (D1), the components (d1-1) to (d1-3) may be used alone or in combination of two or more kinds thereof.

In a case where the resist composition contains the component (D1), the content of the component (D1) in the resist composition is preferably 0.5 to 20 parts by mass, more preferably 1 to 15 parts by mass, and still more preferably 5 to 10 parts by mass, with respect to 100 parts by mass of the component (A).

In a case where the content of the component (D1) is equal to or higher than the preferred lower limit, excellent lithography characteristics and an excellent resist pattern shape are easily obtained. On the other hand, in a case where the content of the component (D1) is equal to or lower than the upper limit, good sensitivity can be maintained and the throughput is also excellent.

Method of Producing Component (D1):

The method of producing the components (d1-1) and (d1-2) is not particularly limited, and the components (d1-1) and (d1-2) can be produced by known methods.

Furthermore, the method of producing the component (d1-3) is not particularly limited, and the component (d1-3) can be produced in the same manner as disclosed in United States Patent Application, Publication No. 2012-0149916.

With Regard to Component (D2)

The component (D) may contain a nitrogen-containing organic compound component (hereinafter referred to as a "component (D2)") which does not correspond to the component (D1).

The component (D2) is not particularly limited as long as it acts as an acid diffusion controlling agent and does not correspond to the component (D1), and any known compound may be used. Among these, aliphatic amines are preferable, and among the aliphatic amines, a secondary aliphatic amine or a tertiary aliphatic amine is more preferable.

The aliphatic amine is an amine having one or more aliphatic groups, and the aliphatic groups preferably have 1 to 12 carbon atoms.

Examples of the aliphatic amines include amines in which at least one hydrogen atom of ammonia ($NH_3$) is substituted with an alkyl group or hydroxyalkyl group having 12 or less carbon atoms (alkylamines or alkylalcoholamines) and cyclic amines.

Specific examples of the alkylamines and the alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkylalcoholamines such as diethanolamine, triethanolamine, diisopropanolamine, triisopropanolamine, di-n-octanolamine, and tri-n-octanolamine. Among these, trialkylamines having 5 to 10 carbon atoms are preferable, and tri-n-pentylamine or tri-n-octylamine is particularly preferable.

Examples of the cyclic amine include a heterocyclic compound containing a nitrogen atom as a heteroatom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1, 5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris [2-{2-(2-hydroxyethoxy)ethoxy}ethyl]amine, and triethanolamine triacetate, and triethanolamine triacetate is preferable.

In addition, as the component (D2), an aromatic amine may be used.

Examples of the aromatic amine include 4-dimethylaminopyridine, pyrrole, indole, pyrazole, imidazole, and a derivative thereof, tribenzylamine, 2,6-diisopropylaniline, and N-tert-butoxycarbonylpyrrolidine.

The component (D2) may be used alone or in combination of two or more kinds thereof.

In a case where the resist composition contains the component (D2), the content of the component (D2) in the resist composition is usually in the range of 0.01 to 5 parts by mass with respect to 100 parts by mass of the component (A). By setting the content to be in the range, the resist pattern shape, the post-exposure temporal stability, and the like are improved.

<<At Least One Compound (E) Selected from Group Consisting of Organic Carboxylic Acid, Oxo Acid of Phosphorus, and Derivative Thereof>>

For the purpose of preventing any deterioration in sensitivity, and improving the resist pattern shape and the post-exposure temporal stability, the resist composition of the present embodiment may contain at least one compound (E) (hereinafter referred to as the component (E)) selected from the group consisting of an organic carboxylic acid, and an oxo acid of phosphorus, and a derivative thereof as an optional component.

Suitable examples of the organic carboxylic acid include acetic acid, malonic acid, citric acid, malic acid, succinic acid, benzoic acid, and salicylic acid.

Examples of the oxo acid of phosphorus include phosphoric acid, phosphonic acid, and phosphinic acid, and among these, the phosphonic acid is particularly preferable.

Examples of the oxo acid of phosphorus derivatives include esters in which a hydrogen atom in the oxo acids is substituted with a hydrocarbon group, and examples of the hydrocarbon group include an alkyl group having 1 to 5 carbon atoms and an aryl group having 6 to 15 carbon atoms.

Examples of the derivative of the phosphoric acid include phosphoric acid esters such as a di-n-butyl phosphate ester and a diphenyl phosphate ester.

Examples of the derivative of the phosphonic acid include phosphonic acid esters such as a dimethyl phosphonate, a di-n-butyl phosphonate ester, a phenylphosphonic acid ester, a diphenyl phosphonate ester, and a dibenzyl phosphonate ester.

Examples of the derivative of the phosphinic acid include a phosphinic acid ester and phenylphosphinic acid.

In the resist composition of the present embodiment, the component (E) may be used alone or in combination of two or more kinds thereof.

In a case where the resist composition contains the component (E), the content of the component (E) to be used is usually in the range of 0.01 to 5 parts by mass with respect to 100 parts by mass of the component (A).

<<Organic Solvent Component (S)>>

The resist composition of the present embodiment may be produced by dissolving a resist material in an organic solvent component (hereinafter referred to as a "component (S)").

The component (S) may be any organic solvent which can dissolve the respective components to be used to obtain a uniform solution, and any organic solvent can be appropriately selected from those which are known as a solvent for a chemically amplified resist composition in the related art, and then used.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol, and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkyl ether such as monomethyl ether, monoethyl ether, monopropyl ether, monobutyl ether, and monophenyl ether of any of these polyhydric alcohols or compounds having an ester bond [among these, propylene glycol monomethyl ether acetate (PGMEA) and propylene glycol monomethyl ether (PGME) are preferable]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzyl ether, cresylmethyl ether, diphenyl ether, dibenzyl ether, phenetole, butylphenyl ether, ethylbenzene, diethylbenzene, pentylbenzene, isopropylbenzene, toluene, xylene, cymene, and mesitylene; and dimethylsulfoxide (DMSO).

In the resist composition of the present embodiment, the component (S) may be used alone or as a mixed solvent of two or more kinds thereof. Among these, PGMEA, PGME, γ-butyrolactone, EL, or cyclohexanone is preferable.

Furthermore, a mixed solvent obtained by mixing PGMEA with a polar solvent is also preferable as the component (S). The blending ratio (mass ratio) of the mixed solvent can be appropriately determined, taking into consideration the compatibility of the PGMEA with the polar solvent, but is preferably 1:9, to 9:1 and more preferably 2:8 to 8:2.

More specifically, in a case where EL or cyclohexanone is blended as the polar solvent, the mass ratio of PGMEA:EL or cyclohexanone is preferably 1:9 to 9:1, and more preferably 2:8 to 8:2. Further, in a case where PGME is blended as the polar solvent, the mass ratio of PGMEA:PGME is preferably 1:9 to 9:1, more preferably 2:8 to 8:2, and still more preferably 3:7 to 7:3. In addition, a mixed solvent of PGMEA, PGME, and cyclohexanone is also preferable.

Moreover, as the component (S), a mixed solvent of at least one selected from PGMEA and EL and γ-butyrolactone is also preferable. In this case, the mass ratio of the former to the latter is preferably 70:30 to 95:5 in terms of a mixing proportion.

The amount of the component (S) used is not particularly limited, and is a concentration which can be applied to a substrate or the like, and is appropriately set according to the coating film thickness. In general, the component (S) is used so that the concentration of solid contents of the resist composition is 0.1% to 20% by mass, and preferably 0.2% to 15% by mass.

A miscible additive such as an additive resin for improving the performance of the resist film, a dissolution inhibitor, a plasticizer, a stabilizer, a colorant, a halation prevention agent, and a dye can further be appropriately added and contained in the resist composition of the present embodiment, as desired.

After dissolving the resist material in the component (S), the resist composition of the present embodiment may be subjected to removal of impurities and the like, using a porous polyimide film, a porous polyamideimide film, or the like. For example, the resist composition may be filtered using a filter made of a porous polyimide film, a filter made of a porous polyamideimide film, or a filter made of a porous polyimide film and a porous polyamideimide film. Examples of the porous polyimide film and the porous polyamideimide film include those described in Japanese Unexamined Patent Application, First Publication No. 2016-155121.

The resist composition of the present embodiment as described above contains a component (A1) having a constitutional unit (a0) represented by General Formula (a0-1) and a component (F1) having a constitutional unit (f01) represented by General Formula (f01-1) and a constitutional unit (f02) including an acid-dissociable group represented by General Formula (f02-1) in combination.

With a resist composition in the related art, in a trade-off relationship among a defect, pattern shape, and roughness, it has been difficult to obtain a resist composition in which all of these are improved.

In contrast, by incorporating a combination of the component (A1) and the component (F1) into the resist composition of the present embodiment, the defects can be reduced, the pattern shape can be improved, and the roughness can be improved. A reason thereof is not clear, but is presumed as follows.

By incorporating the constitutional unit (a0) into the component (A1), the solubility in a developing solution (particularly an alkali developing solution) can increase. On the other hand, by incorporating the constitutional unit (f01) into the component (F1), the water repellency of the resist film is improved; and by incorporating the constitutional unit (f02) into the component (F1), the reactivity with an acid in the exposed portion is improved. In addition, by incorporation of the constitutional unit (f01), the affinity for a developing solution increases. As a result, by incorporating a combination of the component (A1) and the component (F1) into the resist composition, the water repellency of the resist film before development increases and the affinity for a developing solution to be used for post-exposure development increases, which contribute to an improvement of the defect, the pattern shape, and the roughness.

(Method of Forming Resist Pattern)

The method of forming a resist pattern of the present embodiment is a method having a step of forming a resist film on a support, using the above-mentioned resist composition according to the embodiment, a step of exposing the resist film, and a step of developing the exposed resist film to form a resist pattern.

Examples of an embodiment of such a method of forming a resist pattern include a method of forming a resist pattern to be performed as described below.

First, the resist composition of the above-mentioned embodiment is applied onto a support with a spinner or the like, and a baking (post-application baking (PAB)) treatment is performed, for example, at a temperature condition of 80° C. to 150° C. for 40 to 120 seconds, and preferably for 60 to 90 seconds to form a resist film.

Next, the resist film is subjected to an exposure through a mask having a predetermined pattern formed thereon (mask pattern) or a selective exposure by lithography or the like through direct irradiation with electron beams without a mask pattern, for example, using an exposure apparatus such as an electron beam lithography apparatus and an EUV exposure apparatus, and then a baking (post-exposure baking (PEB)) treatment is carried out under a temperature condition of 80° C. to 150° C. for 40 to 120 seconds, and preferably 60 to 90 seconds.

Next, the resist film is subjected to a developing treatment. The developing treatment is performed using an alkali developing solution in a case of an alkali developing process, and a developing solution containing an organic solvent (organic developing solution) in a case of a solvent developing process.

After the developing treatment, it is preferable to perform a rinsing treatment. As the rinsing treatment, water rinsing using pure water is preferable in a case of the alkali developing process, and rinsing using a rinsing liquid containing an organic solvent is preferable in a case of the solvent developing process.

In a case of the solvent developing process, a treatment for removing the developing solution or the rinsing liquid remaining on the pattern with a supercritical fluid may be performed after the developing treatment or the rinsing treatment.

After the developing treatment or the rinsing treatment, drying is performed. In addition, a baking treatment (post-baking) may be performed in some cases after the developing treatment.

In this manner, a resist pattern can be formed.

The support is not particularly limited, and a support known in the related art can be used, and examples thereof include, a substrate for an electronic component, the substrate having a wiring pattern formed thereon, or the like. More specific examples of the substrate include a substrate made of a metal such as silicon wafer, copper, chromium, iron and aluminum, and a substrate made of glass. As a material of the wiring pattern, copper, aluminum, nickel, gold, or the like can be used.

Furthermore, a support having an inorganic and/or organic film is provided on the substrate as described above may be used as the support. Examples of the inorganic film include an inorganic antireflection film (inorganic BARC). Examples of the organic film include an organic antireflection film (organic BARC) and an organic film such as a lower-layer organic film used in a multilayer resist method.

Here, the multilayer resist method is a method in which at least one layer of an organic film (lower-layer organic film) and at least one layer of a resist film (upper-layer resist film) are provided on a substrate, and a resist pattern formed on the upper-layer resist film is used as a mask to perform patterning of the lower-layer organic film, and this method is considered as being capable of forming a pattern with a high aspect ratio. That is, since the multilayer resist method can ensure a desired thickness through the lower-layer organic film, the thickness of the resist film can be reduced and an extremely fine pattern with a high aspect ratio can be formed.

The multilayer resist method is classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be performed using radiation such as an ArF excimer laser, a KrF excimer laser, an $F_2$ excimer laser, extreme ultraviolet (EUV) rays, vacuum ultraviolet (VUV) rays, electron beams (EB), X-rays, and soft X-rays. The resist composition is highly useful for a KrF excimer laser, an ArF excimer laser, EB, or EUV, more useful for the ArF excimer laser or the ArF excimer laser, and particularly useful for the ArF excimer laser. That is, the method of forming a resist pattern of the present embodiment is a particularly useful method in a case where the step of exposing the resist film includes an operation of exposing the resist film with an ArF excimer laser.

The exposure of the resist film may be a general exposure (dry exposure) performed in air or an inert gas such as nitrogen, or liquid immersion exposure (liquid immersion lithography).

The liquid immersion exposure is an exposing method in which a space between the resist film and a lens at the lowermost point of an immersion exposure apparatus is filled with a solvent (liquid immersion medium) having a larger refractive index than the refractive index of air, and exposure (immersion exposure) is performed in this state.

As the liquid immersion medium, a solvent which exhibits a refractive index that is larger than the refractive index of air but is smaller than the refractive index of the resist film to be exposed is preferable. The refractive index of such a solvent is not particularly limited as long as it is in the range.

Examples of the solvent which exhibits a refractive index that is larger than the refractive index of air but is smaller than the refractive index of the resist film include water, a fluorine-based inert liquid, a silicon-based solvent, and a hydrocarbon-based solvent.

Specific examples of the fluorine-based inert liquid include liquids containing a fluorine-based compound such as $C_3HCl_2F_5$, $C_4F_9OCH_3$, $C_4F_9OC_2H_5$ or $C_5H_3F_7$ as a main component, and the boiling point is preferably 70° C. to 180° C., and more preferably 80° C. to 160° C. If the fluorine-based inert liquid has a boiling point in the range, it is advantageous in that the removal of an immersion medium after exposure can be performed by a simple method.

As the fluorine-based inert liquid, a perfluoroalkyl compound obtained by substituting all of the hydrogen atoms of an alkyl group with fluorine atoms is preferable. Examples of the perfluoroalkyl compound include a perfluoroalkyl ether compound and a perfluoroalkylamine compound.

Furthermore, specific examples of the perfluoroalkyl ether compound include perfluoro(2-butyl-tetrahydrofuran) (boiling point of 102° C.), and examples of the perfluoroalkylamine compound include perfluorotributylamine (boiling point of 174° C.).

As the immersion medium, water is preferable in terms of cost, safety, environment, and versatility.

As an example of the alkali developing solution used for a developing treatment in an alkali developing process, a 0.1 to 10% by mass aqueous solution of tetramethylammonium hydroxide (TMAH) can be mentioned.

As the organic solvent contained in the organic developing solution used for a developing treatment in a solvent developing process, any of the conventional organic solvents can be used which are capable of dissolving the component (A) (prior to exposure). Specific examples of the organic solvent include polar solvents such as a ketone-based solvent, an ester-based solvent, an alcohol-based solvent, a nitrile-based solvent, an amide-based solvent, and an ether-based solvent, and a hydrocarbon-based solvent.

The ketone-based solvent is an organic solvent including C—C(=O)—C in a structure thereof. The ester-based solvent is an organic solvent including C—C(=O)—O—C in a structure thereof. The alcohol-based solvent is an organic solvent including an alcoholic hydroxyl group in a structure thereof. The "alcoholic hydroxyl group" means a hydroxyl group which is bonded to a carbon atom of an aliphatic hydrocarbon group. The nitrile-based solvent is an organic solvent including a nitrile group in a structure thereof. The amide-based solvent is an organic solvent including an amide group in a structure thereof. The ether-based solvent is an organic solvent including C—O—C in a structure thereof.

Among the organic solvents, organic solvents including a plurality of functional groups which characterize the respective solvents in a structure thereof are present, but in this case, they correspond to any of solvents having the functional groups contained in the organic solvents. For example, diethylene glycol monomethyl ether corresponds to any of the alcohol-based solvent or the ether-based solvent.

The hydrocarbon-based solvent is a hydrocarbon-based solvent which consists of a hydrocarbon which may be halogenated and does not have a substituent other than a halogen atom. Examples of the halogen atom include a fluorine atom, a chlorine atom, a bromine atom, and an iodine atom, and the fluorine atom is preferable.

As the organic solvent contained in the organic developing solution, among those, the polar solvent is preferable, and the ketone-based solvent, the ester-based solvent, and the nitrile-based solvent are preferable.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone). Among these, methyl amyl ketone (2-heptanone) is preferable as the ketone-based solvent.

Examples of the ester-based solvent include methyl acetate, butyl acetate, ethyl acetate, isopropyl acetate, amyl acetate, isoamyl acetate, ethyl methoxyacetate, ethyl ethoxyacetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, butyl acetate is preferable as the ester-based solvent.

Examples of the nitrile-based solvent include acetonitrile, propionitrile, valeronitrile, and butyronitrile.

A known additive can be blended with the organic developing solution, as necessary. Examples of the additive include surfactants. The surfactant is not particularly limited, and for example, an ionic or non-ionic fluorine- and/or silicon-based surfactant can be used. As the surfactant, the non-ionic surfactant is preferable, and the non-ionic fluorine-based surfactant or the non-ionic silicon-based surfactant is more preferable.

In a case where a surfactant is blended, the amount of the surfactant to be blended is usually 0.001% to 5% by mass, preferably 0.005% to 2% by mass, and more preferably 0.01% to 0.5% by mass, with respect to the total amount of the organic developing solution.

The method of forming a resist pattern of the present embodiment is a method which is particularly useful in a case where the development is performed using an alkali developing solution.

The developing treatment can be performed by a developing method in the related art, and examples thereof include a method in which a support is immersed in a developing solution for a predetermined period (a dip method), a method in which a developing solution is cast upon the surface of a support by surface tension and maintained for a predetermined period (a puddle method), a method in which a developing solution is sprayed onto the surface of a support (spray method), and a method in which a developing solution is continuously ejected on a support rotating at a constant rate while scanning a developing solution-ejecting nozzle at a constant rate (dynamic dispense method).

As the organic solvent contained in the rinsing liquid used in the rinsing treatment after the developing treatment in a solvent developing process, for example, an organic solvent that hardly dissolves a resist pattern can be suitably selected and used, among the organic solvents mentioned as the organic solvent used for the organic developing solution. Usually, at least one solvent selected from the group consisting of a hydrocarbon-based solvent, a ketone-based solvent, an ester-based solvent, an alcohol-based solvent, an amide-based solvent, and an ether-based solvent is used. Among these, at least one solvent selected from the group consisting of the hydrocarbon-based solvent, the ketone-based solvent, the ester-based solvent, the alcohol-based solvent, and the amide-based solvent is preferable, at least one solvent selected from the group consisting of the alcohol-based solvent and the ester-based solvent is more preferable, and the alcohol-based solvent-based is particularly preferable.

The alcohol-based solvent used for the rinsing liquid is preferably a monohydric alcohol of 6 to 8 carbon atoms, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, or 2-hexanol is preferable, and 1-hexanol or 2-hexanol are more preferable.

The organic solvent may be used alone or in combination of two or more kinds thereof. Further, an organic solvent other than the above-described solvents or water may be mixed together and used. It should be noted that in consideration of the development characteristics, the amount of water to be blended in the rinsing liquid is preferably 30% by mass or less, more preferably 10% by mass or less, still more preferably 5% by mass or less, and particularly preferably 3% by mass or less, with respect to the total amount of the rinsing liquid.

An known additive may be blended with the rinsing liquid, as necessary. Examples of the additive include surfactants. Examples of the surfactant include the same as those described above, a non-ionic surfactant is preferable, and a non-ionic fluorine-based surfactant or a non-ionic silicon-based surfactant is more preferable.

In a case where a surfactant is blended, the amount of the surfactant to be blended is usually 0.001% to 5% by mass, preferably 0.005% to 2% by mass, and more preferably 0.01% to 0.5% by mass, with respect to the total amount of the rinsing liquid.

The rinsing treatment using a rinsing liquid (washing treatment) can be performed by a known rinsing method. Examples of the rinsing treatment method include a method in which a rinsing liquid is continuously applied to a support while rotating it at a constant rate (rotational coating method), a method in which a support is immersed in a rinsing liquid for a predetermined period (dip method), and a method in which a rinsing liquid is sprayed onto the surface of a support (spray method).

According to the method of forming a resist pattern of the present embodiment as described above, since the above-mentioned resist composition of the first embodiment is used, a resist pattern having excellent lithography characteristics can be formed with a high sensitivity.

EXAMPLES

Hereinafter, the present invention will be described in more detail based on Examples, but the present invention is not limited to these Examples.

Preparation of Resist Composition

Examples 1 to 8 and Comparative Examples 1 to 5

Each of the components shown in Tables 1 and 2 was mixed and dissolved to prepare a resist composition of each Example.

TABLE 1

|  | Component (A) | Component (F) | Component (B) | Component (D) | Component (S) |
|---|---|---|---|---|---|
| Example 1 | (A1)-1 [100] | (F1)-1 [3.0] | (B)-1 [10] | (D)-1 [10] | (S)-1 [2,900] |
| Example 2 | (A1)-2 [100] | (F1)-1 [3.0] | (B)-1 [10] | (D)-1 [10] | (S)-1 [2,900] |
| Example 3 | (A1)-3 [100] | (F1)-1 [3.0] | (B)-1 [10] | (D)-1 [10] | (S)-1 [2,900] |
| Example 4 | (A1)-4 [100] | (F1)-1 [3.0] | (B)-1 [10] | (D)-1 [10] | (S)-1 [2,900] |
| Example 5 | (A1)-5 [100] | (F1)-1 [3.0] | (B)-1 [10] | (D)-1 [10] | (S)-1 [2,900] |
| Example 6 | (A1)-3 [100] | (F1)-2 [3.0] | (B)-1 [10] | (D)-1 [10] | (S)-1 [2,900] |
| Example 7 | (A1)-6 [100] | (F1)-1 [3.0] | (B)-1 [10] | (D)-1 [10] | (S)-1 [2,900] |
| Example 8 | (A1)-1 [100] | (F1)-3 [3.0] | (B)-1 [10] | (D)-1 [10] | (S)-1 [2,900] |

TABLE 2

| | Component (A) | Component (F) | Component (B) | Component (D) | Component (S) |
|---|---|---|---|---|---|
| Comparative Example 1 | (A2)-1 [100] | (F1)-1 [3.0] | (B)-1 [10] | (D)-1 [10] | (S)-1 [2,900] |
| Comparative Example 2 | (A1)-2 [100] | (F2)-1 [3.0] | (B)-1 [10] | (D)-1 [10] | (S)-1 [2,900] |
| Comparative Example 3 | (A1)-1 [100] | (F2)-2 [3.0] | (B)-1 [10] | (D)-1 [10] | (S)-1 [2,900] |
| Comparative Example 4 | (A1)-1 [100] | (F2)-3 [3.0] | (B)-1 [10] | (D)-1 [10] | (S)-1 [2,900] |
| Comparative Example 5 | (A1)-1 [100] | (F2)-4 [3.0] | (B)-1 [10] | (D)-1 [10] | (S)-1 [2,900] |

In Tables 1 and 2, each abbreviation has the following meaning. The numerical values in the brackets are blending amounts (parts by mass).

(A1)-1: High-molecular-weight compound represented by Chemical Formula (A1-1). The standard polystyrene-equivalent weight-average molecular weight (Mw) and the molecular weight dispersity (Mw/Mn), as determined by GPC measurement, are 7,200 and 1.44, respectively. The copolymerization compositional ratio (the ratio (molar ratio) among constitutional units in the structural formula) as determined by $^{13}$C-NMR is l/m=50/50.

(A1)-2: High-molecular-weight compound represented by Chemical Formula (A1-2). The standard polystyrene-equivalent weight-average molecular weight (Mw) and the molecular weight dispersity (Mw/Mn), as determined by GPC measurement, are 6,900 and 1.43, respectively. The copolymerization compositional ratio (the ratio (molar ratio) among constitutional units in the structural formula) as determined by $^{13}$C-NMR is l/m=50/50.

(A1)-3: High-molecular-weight compound represented by Chemical Formula (A1-3). The standard polystyrene-equivalent weight-average molecular weight (Mw) and the molecular weight dispersity (Mw/Mn), as determined by GPC measurement, are 7,000 and 1.43, respectively. The copolymerization compositional ratio (the ratio (molar ratio) among constitutional units in the structural formula) as determined by $^{13}$C-NMR is l/m=50/50.

(A1)-4: High-molecular-weight compound represented by Chemical Formula (A1-4). The standard polystyrene-equivalent weight-average molecular weight (Mw) and the molecular weight dispersity (Mw/Mn), as determined by GPC measurement, are 7,500 and 1.48, respectively. The copolymerization compositional ratio (the ratio (molar ratio) among constitutional units in the structural formula) as determined by $^{13}$C-NMR is l/m=50/50.

(A1)-5: High-molecular-weight compound represented by Chemical Formula (A1-5). The standard polystyrene-equivalent weight-average molecular weight (Mw) and the molecular weight dispersity (Mw/Mn), as determined by GPC measurement, are 7,200 and 1.44, respectively. The copolymerization compositional ratio (the ratio (molar ratio) among constitutional units in the structural formula) as determined by $^{13}$C-NMR is l/m=50/50.

(A1)-6: High-molecular-weight compound represented by Chemical Formula (A1-6). The standard polystyrene-equivalent weight-average molecular weight (Mw) and the molecular weight dispersity (Mw/Mn), as determined by GPC measurement, are 6,700 and 1.41, respectively. The copolymerization compositional ratio (the ratio (molar ratio) among constitutional units in the structural formula) as determined by $^{13}$C-NMR is l/m=50/50.

(A2)-1: High-molecular-weight compound represented by Chemical Formula (A2-1). The standard polystyrene-equivalent weight-average molecular weight (Mw) and the molecular weight dispersity (Mw/Mn), as determined by GPC measurement, are 6,500 and 1.40, respectively. The copolymerization compositional ratio (the ratio (molar ratio) among constitutional units in the structural formula) as determined by $^{13}$C-NMR is l/m=50/50.

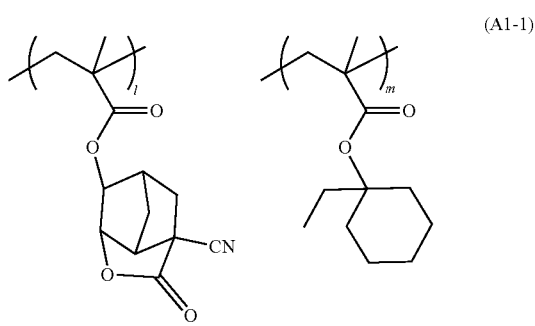

(A1-1)

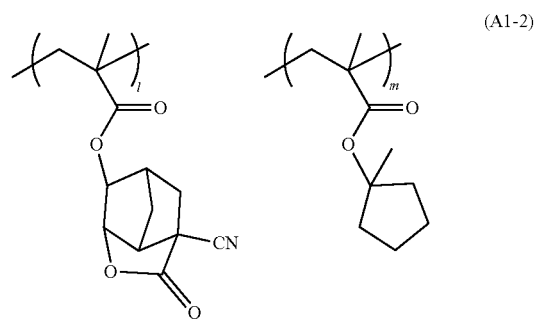

(A1-2)

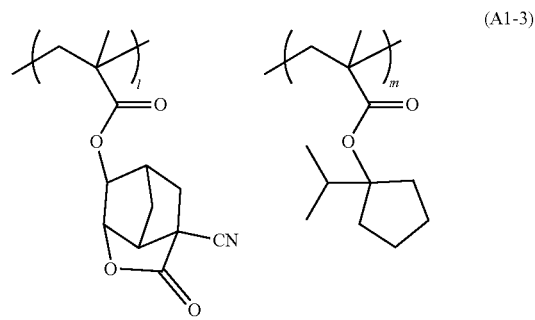

(A1-3)

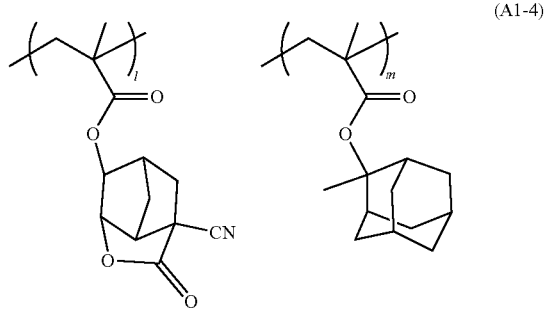

(A1-4)

-continued

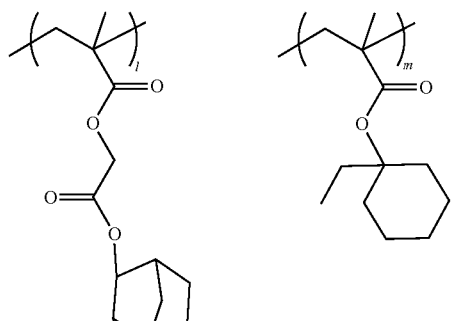

(A1-5)

(A1-6)

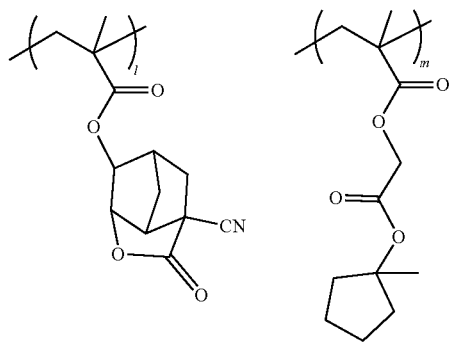

(A2-1)

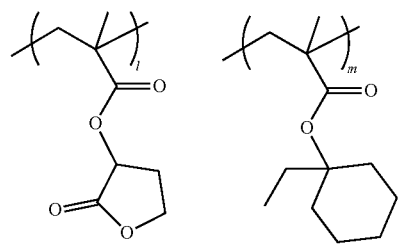

(F1)-1: High-molecular-weight compound represented by Chemical Formula (F1-1). The standard polystyrene-equivalent weight-average molecular weight (Mw) and the molecular weight dispersity (Mw/Mn), as determined by GPC measurement, are 24.100 and 1.54, respectively. The copolymerization compositional ratio (the ratio (molar ratio) among constitutional units in the structural formula) as determined by $^{13}$C-NMR is l/m=75/25.

(F1)-2: High-molecular-weight compound represented by Chemical Formula (F1-2). The standard polystyrene-equivalent weight-average molecular weight (Mw) and the molecular weight dispersity (Mw/Mn), as determined by GPC measurement, are 21.100 and 1.53, respectively. The copolymerization compositional ratio (the ratio (molar ratio) among constitutional units in the structural formula) as determined by $^{13}$C-NMR is l/m=75/25.

(F1)-3: High-molecular-weight compound represented by Chemical Formula (F1-3). The standard polystyrene-equivalent weight-average molecular weight (Mw) and the molecular weight dispersity (Mw/Mn), as determined by GPC measurement, are 197,000 and 1.56, respectively. The copolymerization compositional ratio (the ratio (molar ratio) among constitutional units in the structural formula) as determined by $^{13}$C-NMR is l/m=75/25.

(F2)-1: High-molecular-weight compound represented by Chemical Formula (F2-1). The standard polystyrene-equivalent weight-average molecular weight (Mw) and the molecular weight dispersity (Mw/Mn), as determined by GPC measurement, are 22.900 and 1.49, respectively. The copolymerization compositional ratio (the ratio (molar ratio) among constitutional units in the structural formula) as determined by $^{13}$C-NMR is l/m=75/25.

(F2)-2: High-molecular-weight compound represented by Chemical Formula (F2-2). The standard polystyrene-equivalent weight-average molecular weight (Mw) and the molecular weight dispersity (Mw/Mn), as determined by GPC measurement, are 21.900 and 1.58, respectively. The copolymerization compositional ratio (the ratio (molar ratio) among constitutional units in the structural formula) as determined by $^{13}$C-NMR is l/m=75/25.

(F2)-3: High-molecular-weight compound represented by Chemical Formula (F2-3). The standard polystyrene-equivalent weight-average molecular weight (Mw) and the molecular weight dispersity (Mw/Mn), as determined by GPC measurement, are 24,000 and 1.55, respectively. The copolymerization compositional ratio (the ratio (molar ratio) among constitutional units in the structural formula) as determined by $^{13}$C-NMR is l/m=75/25.

(F2)-4: High-molecular-weight compound represented by Chemical Formula (F2-4). The standard polystyrene-equivalent weight-average molecular weight (Mw) and the molecular weight dispersity (Mw/Mn), as determined by GPC measurement, are 22,800 and 1.50, respectively. The copolymerization compositional ratio (the ratio (molar ratio) among constitutional units in the structural formula) as determined by $^{13}$C-NMR is l/m=75/25.

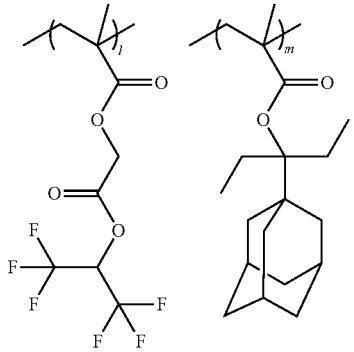

(F1-1)

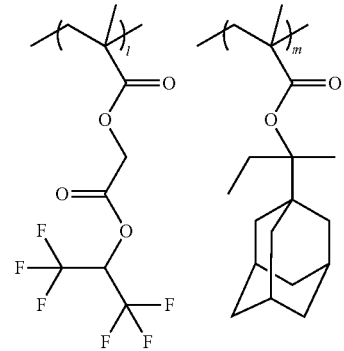

(F1-2)

-continued (F1-3)
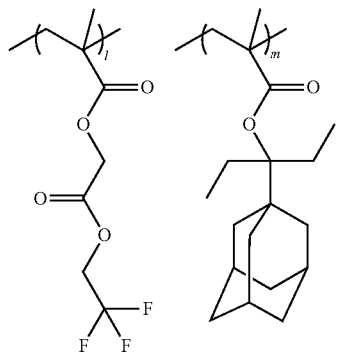

(F2-1)
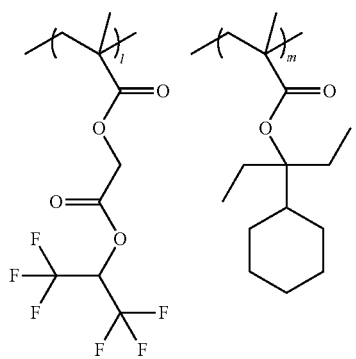

(F2-2)
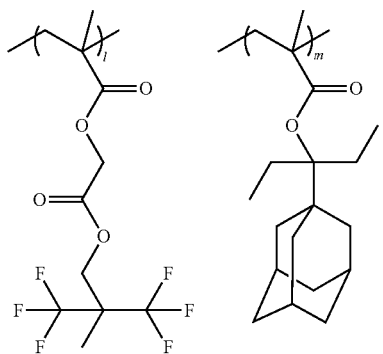

(F2-3)
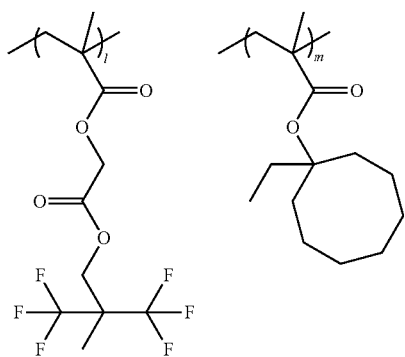

-continued (F2-4)
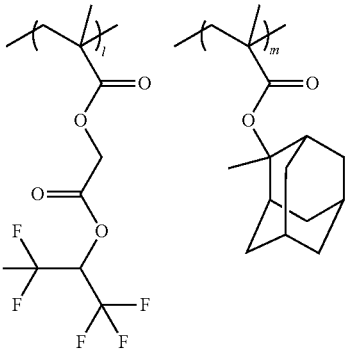

(B)-1: Acid generator composed of a compound represented by Compound (B-1).

(D)-1: Acid diffusion-controlling agent consisting of Compound (D-1).

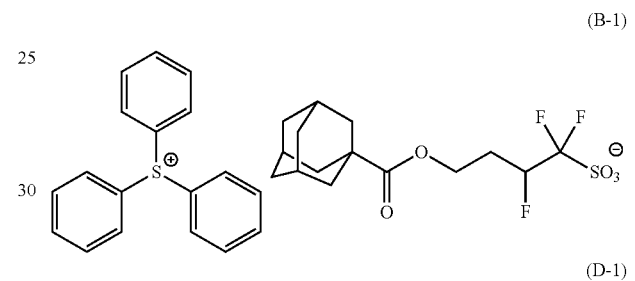

(S)-1: Mixed solvent of propylene glycol monomethyl ether acetate/propylene glycol monomethyl ether/cyclohexanone=1,300/900/700 (mass ratio). 10 [0389]

<Resist Pattern Formation 1>

An organic antireflection film composition "ARC29A" (manufactured by Brewer Science, Inc.) was applied onto a 12-inch silicon wafer using a spinner, and dried by performing calcination on a hot plate at 205° C. for 60 seconds to form an organic antireflection film having a film thickness of 98 nm.

The resist composition of each of Examples was applied onto the organic antireflection film using a spinner, subjected to a prebaking (PAB) treatment at 120° C. for 60 seconds on a hot plate, and dried to form a resist film having a film thickness of 100 nm.

Next, an ArF excimer laser (193 nm) was selectively irradiated via a halftone) photomask (6%) with an ArF exposure apparatus for a liquid immersion, XT1900Gi [manufactured by ASML; numerical aperture) (NA=1.35, Annual, Sigma 0.90/0.44, liquid immersion medium: ultra-pure water]. Thereafter, a PEB treatment was performed at 80° C. for 60 seconds. Next, an alkali development was performed for 15 seconds with a 2.38%-by-mass aqueous TMAH solution (trade name: NMD-3, manufactured by Tokyo Ohka Kogyo Co., Ltd.) at 23° C., then water rinsing was performed for 15 seconds using pure water, and shake-off and drying were performed. As a result, a line-and-space pattern (hereinafter referred to as an "LS pattern") having a line width of 90 nm and a pitch of 160 nm (mask size of 80 nm) was formed in all of Examples.

[Evaluation of Line Width Roughness (LWR)]

For the LS pattern formed in <Resist Pattern Formation 1> above, 3σ, which is a scale indicating LWR, was determined. This is shown as "LWR (nm)" in Tables 3 and 4.

"3σ" is a triple value (3σ) (unit: nm) of a standard deviation (σ) determined from measurement results obtained after measuring 400 line positions in the longitudinal direction of the line with a scanning electron microscope (acceleration voltage 800 V, trade name: S-9380, manufactured by Hitachi High-Technologies Corporation). The smaller the value of 3σ, the smaller the roughness of the side wall of the line, which means that an LS pattern having a more uniform width was obtained.

[Evaluation of LS Pattern Shape]

The shape of the LS pattern formed in <Resist Pattern Formation 1> above was observed by a critical scanning electron microscope (SEM), accelerating voltage 800 V, trade name: SU-8000, manufactured by Hitachi High-Technology Co., Ltd.), and evaluated on the basis of the following evaluation criteria. The results are shown as "Pattern shape" in Tables 3 and 4.

Evaluation Criteria

A: It is rectangular and has high verticality.

B: It is rectangular, but its verticality is slightly lower than that in A.

C: It is a T-shape or top-rounding shape (the top of the pattern is round)

<Resist Pattern Formation 2>

An organic antireflection film composition "ARC29A" (manufactured by Brewer Science, Inc.) was applied onto a 12-inch silicon wafer using a spinner, and dried by performing calcination on a hot plate at 205° C. for 60 seconds to form an organic antireflection film having a film thickness of 98 nm.

The resist composition of each of Examples was applied onto the organic antireflection film using a spinner, subjected to a prebaking (PAB) treatment at 120° C. for 60 seconds on a hot plate, and dried to form a resist film having a film thickness of 100 nm.

Next, an ArF excimer laser (193 nm) was selectively irradiated via a halftone) photomask (6%) with an ArF exposure apparatus for a liquid immersion, XT1900Gi [manufactured by ASML; numerical aperture) (NA=1.35, Annual, Sigma 0.90/0.44, TE deflection, liquid immersion medium: ultrapure water]. Thereafter, a PEB treatment was performed at 80° C. for 60 seconds. Next, an alkali development was performed for seconds with a 2.38%-by-mass aqueous TMAH solution (trade name: NMD-3, manufactured by Tokyo Ohka Kogyo Co., Ltd.) at 23° C., and then water rinsing was performed for 15 seconds using pure water, and shake-off and drying were performed. As a result, an LS patterns having a line width of 70 nm and a pitch of 130 nm (mask size of 65 nm) was formed in all of Examples.

[Evaluation of Defects (Number of Defects)]

For the LS pattern formed by <Resist Pattern Formation 2> above, the total number of defects (the number of all the defects) in a wafer was measured using a surface defect observation device (product name: KLA2905, manufactured by KLA-Tencor Corporation). The number of defects was evaluated in accordance with the following evaluation criteria, and the evaluation results are shown as "Number of defects" in Tables 3 and 4.

Evaluation Criteria

A: The number of defects is less than 50.

B: The number of defects is 50 or more and less than 100.

C: The number of defects is 100 or more and less than 200.

D: The number of defects is 200 or more.

TABLE 3

|  | PAB (° C.) | PEB (° C.) | LWR (nm) | Pattern shape | Number of defects |
|---|---|---|---|---|---|
| Example 1 | 120 | 80 | 2.5 | A | A |
| Example 2 | 120 | 80 | 2.4 | A | A |
| Example 3 | 120 | 80 | 2.5 | A | A |
| Example 4 | 120 | 80 | 2.7 | A | A |
| Example 5 | 120 | 80 | 2.5 | A | A |
| Example 6 | 120 | 80 | 2.5 | A | B |
| Example 7 | 120 | 80 | 2.5 | A | A |
| Example 8 | 120 | 80 | 2.7 | B | B |

TABLE 4

|  | PAB (° C.) | PEB (° C.) | LWR (nm) | Pattern shape | Number of defects |
|---|---|---|---|---|---|
| Comparative Example 1 | 120 | 80 | 2.9 | B | B |
| Comparative Example 2 | 120 | 80 | 2.9 | D | C |
| Comparative Example 3 | 120 | 80 | 3.0 | B | C |
| Comparative Example 4 | 120 | 80 | 2.8 | D | D |
| Comparative Example 5 | 120 | 80 | 3.1 | B | C |

From the results shown in Tables 3 and 4, it can be confirmed that with the resist compositions of Examples, it is possible to form resist patterns having improved LWRs and pattern shapes and a smaller number of defects, as compared with the resist compositions of Comparative Examples.

While preferred embodiments of the invention have been described and illustrated above, it should be understood that these are slope of the invention and are not to be considered as limiting. Additions, omissions, substitutions, and other modifications can be made without departing from the spirit or scope of the present invention. Accordingly, the invention is not to be considered as being limited by the therefore description, and is only limited by the scope of the appended claims.

What is claimed is:

1. A resist composition which generates an acid by exposure and whose solubility in a developing solution changes by an action of an acid, the resist composition comprising:

a base material component (A) whose solubility in a developing solution changes by an action of an acid; and a fluorine-additive component (F), wherein the base material component (A) includes a high-molecular-weight compound (A1) having a constitutional unit (a0) represented by General Formula (a0-1), and the fluorine additive component (F) includes a high-molecular-weight compound (F1) having a constitutional unit (f01) represented by General Formula (f01-1) and a constitutional unit (f02) including an acid-dissociable group represented by General Formula (f02-r-1),

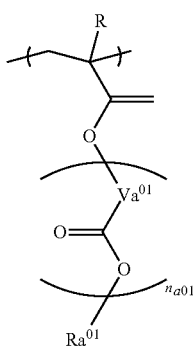

(a0-1)

wherein R represents a hydrogen atom, an alkyl group having 1 to 5 carbon atoms, or a halogenated alkyl group having 1 to 5 carbon atoms; $Va^{o1}$ represents a divalent linking group; $n_{a01}$ is an integer of 0 to 2; and $Ra^{o1}$ represents a lactone-containing cyclic group having at least one substituent selected from the group consisting of a halogen atom, a carboxyl group, an acyl group, a nitro group, and a cyano group,

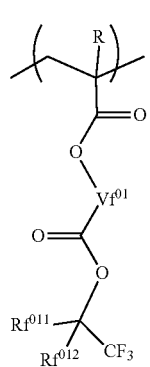

(f01-1)

wherein R represents a hydrogen atom, an alkyl group having 1 to 5 carbon atoms, or a halogenated alkyl group having 1 to 5 carbon atoms; $Vf^{o1}$ represents a divalent linking group; and $Rf^{o11}$ and $Rf^{o12}$ each independently represents a hydrogen atom, a fluorine atom, a hydroxyl group, a methyl group, or a trifluoromethyl group, and

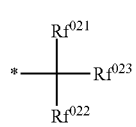

(f02-r-1)

wherein $Rf^{o21}$ and $Rf^{o22}$ each independently represents an alkyl group having 1 to 3 carbon atoms, which may have a substituent; $Rf^{o23}$ represents a polycyclic aliphatic hydrocarbon group which may have a substituent; and * represents a bond.

2. The resist composition according to claim 1, wherein $Ra^{o1}$ in General Formula (a0-1) is a lactone-containing cyclic group represented by General Formula (Ra0-1),

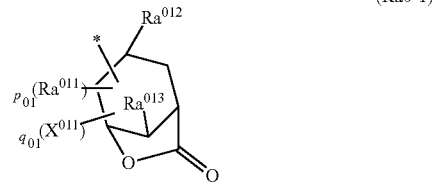

(Ra0-1)

Wherein $Ra^{o12}$ and $Ra^{o13}$ each independently represents a hydrogen atom, an alkyl group having 1 to 5 carbon atoms, an alkoxy group having 1 to 5 carbon atoms, or an alkylthio group having 1 to 5 carbon atoms, or $Ra^{o12}$ and $Ra^{o13}$ are linked to each other to represent an alkylene group having 1 to 6 carbon atoms, which may include an oxygen atom or a sulfur atom, an ether bond (—O—), or a thioether bond (—S—); $X^{o11}$ represents a halogen atom, a carboxyl group, an acyl group, a nitro group, or a cyano group; $Ra^{o11}$ represents an alkyl group having 1 to 6 carbon atoms, a hydroxyalkyl group having 1 to 6 carbon atoms, in which the hydroxyl group moiety may be protected with a protective group, a carboxyl group that forms a salt, or a substituted oxycarbonyl group; $p_{o1}$ represents an integer of 0 to 8, and $q_{o1}$ represents an integer of 1 to 9, provided that $p_{o1}+q_{o1}=9$; in a case where two or more $X^{o11}$'s are present, the plurality of $X^{o11}$'s may be the same as or different from each other; in a case where two or more $Ra^{o11}$'s are present, the plurality of $Ra^{o11}$'s may be the same as or different from each other; in a case where $Ra^{o12}$ and $Ra^{o13}$ are linked to each other to form an alkylene group having 1 to 6 carbon atoms, which may include an oxygen atom or a sulfur atom, $X^{o11}$ and $Ra^{o11}$ may be each independently present as a substituent which is substituted for a hydrogen atom of the alkylene group having 1 to 6 carbon atoms; and * represents a bond that is bonded to an oxygen atom in Formula (a0-1).

3. The resist composition according to claim 1, wherein the constitutional unit (f02) is a constitutional unit represented by General Formula (f02-1),

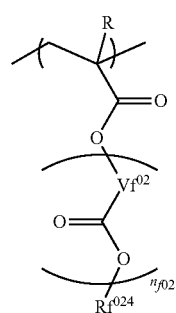

(f02-1)

wherein R represents a hydrogen atom, an alkyl group having 1 to 5 carbon atoms, or a halogenated alkyl group having 1 to 5 carbon atoms; $Vf^{o2}$ represents a divalent hydrocarbon group which may have an ether bond; $n_{f02}$ represents an integer of 0 to 2; and $Rf^{o24}$ represents an acid-dissociable group represented by General Formula (f02-r-1).

4. A method of forming a resist pattern, comprising:
forming a resist film on a support using the resist composition according to claim 1;
exposing the resist film; and
developing the exposed resist film to form a resist pattern.

5. The method of forming a resist pattern according to claim 4, wherein the exposure is liquid immersion exposure.

6. The resist composition according to claim 1, further comprising an acid diffusion-controlling agent component (D) that traps an acid generated by exposure,
wherein the acid diffusion-controlling agent component (D) includes a compound (D1) represented by any of General Formulae (d1-1) to (d1-3),

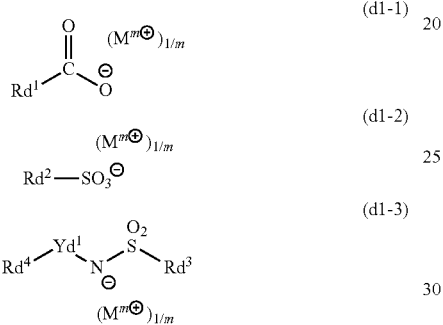

wherein $Rd^1$ represents a cyclic group which may have a substituent selected from the group consisting of a hydroxyl group, an oxo group, an alkyl group, an aryl group, a fluorinated alkyl group, the lactone-containing cyclic groups each represented by any of General Formulae (a2-r-1) to (a2-r-7), an ether bond, an ester bond, or a combination thereof, a chain-like alkyl group which may have a substituent, or a chain-like alkenyl group which may have a substituent; $Rd^2$ to $Rd^4$ each represents a cyclic group which may have a substituent, a chain-like alkyl group which may have a substituent, or a chain-like alkenyl group which may have a substituent, provided that the carbon atom adjacent to the S atom in $Rd^2$ in Formula (d1-2) has no fluorine atom bonded thereto; $Yd^1$ represents a single bond or a divalent linking group; m is an integer of 1 or more, and $M^{m+}$'s are each independently an m-valent organic cation,

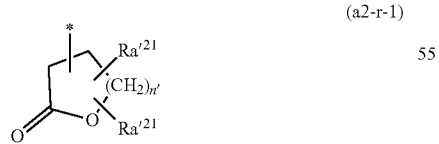

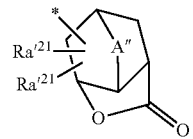

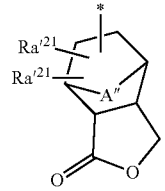

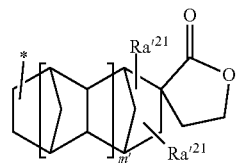

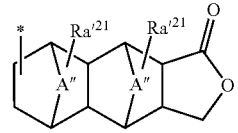

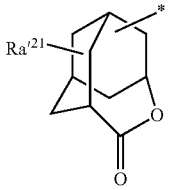

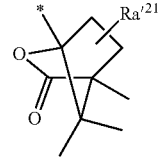

wherein Ra'²¹'s are each independently a hydrogen atom, an alkyl group, an alkoxy group, a halogen atom, a halogenated alkyl group, a hydroxyl group, —COOR", —OC(=O)R", a hydroxyalkyl group, or a cyano group; R" is a hydrogen atom, an alkyl group, a lactone-containing cyclic group, a carbonate-containing cyclic group, or an —SO₂—-containing cyclic group; A" is an oxygen atom, a sulfur atom, or an alkylene group having 1 to 5 carbon atoms, which may contain an oxygen atom (—O—) or a sulfur atom (—S—); and n' is an integer of 0 to 2, and m' is 0 or 1.

7. The resist composition according to claim 1, wherein the acid diffusion-controlling agent component (D) consists of at least one compound (D1).

* * * * *